(12) United States Patent
Isobe et al.

(10) Patent No.: US 10,663,708 B2
(45) Date of Patent: May 26, 2020

(54) CORRELATION MICROSCOPE

(71) Applicants: NAKAMURA SANGYO GAKUEN, Fukuoka (JP); INTERNATIONAL SCIENCE TECHNOLOGY CO., LTD., Fukuoka (JP); TCK INC., Fukuoka (JP)

(72) Inventors: Shinichiro Isobe, Fukuoka (JP); Takaaki Kanemaru, Fukuoka (JP); Shin-ichi Takasu, Tokyo (JP); Koji Kosaka, Fukuoka (JP); Takashi Oe, Fukuoka (JP)

(73) Assignees: NAKAMURA SANGYO GAKUEN, Fukuoka (JP); INTERNATIONAL SCIENCE TECHNOLOGY CO., LTD., Fukuoka (JP); TCK INC., Fukuoka (JP)

( * ) Notice: Subject to any disclaimer, the term of this patent is extended or adjusted under 35 U.S.C. 154(b) by 52 days.

(21) Appl. No.: 15/765,145

(22) PCT Filed: Sep. 30, 2016

(86) PCT No.: PCT/JP2016/079121
§ 371 (c)(1),
(2) Date: Mar. 30, 2018

(87) PCT Pub. No.: WO2017/057729
PCT Pub. Date: Apr. 6, 2017

(65) Prior Publication Data
US 2018/0356624 A1    Dec. 13, 2018

(30) Foreign Application Priority Data

Oct. 1, 2015    (JP) ................................. 2015-196159
Nov. 25, 2015   (JP) ................................. 2015-229858

(51) Int. Cl.
$H01J\ 37/20$ (2006.01)
$G01N\ 23/00$ (2006.01)
(Continued)

(52) U.S. Cl.
CPC ........... $G02B\ 21/26$ (2013.01); $G01N\ 23/225$ (2013.01); $G01N\ 23/2206$ (2013.01);
(Continued)

(58) Field of Classification Search
CPC ..... H01J 37/18; H01L 23/544; G03F 7/70725
(Continued)

(56) References Cited

U.S. PATENT DOCUMENTS

2011/0315877 A1    12/2011 Isozaki et al.
2013/0183623 A1*   7/2013 Shibazaki ........... G03F 7/70725
                                                          430/296
(Continued)

FOREIGN PATENT DOCUMENTS

EP    2 722 867    4/2014
JP    55-90046     7/1980
(Continued)

OTHER PUBLICATIONS

International Search Report dated Dec. 27, 2016 in International (PCT) Application No. PCT/JP2016/079121.
(Continued)

*Primary Examiner* — Albert Kir
(74) *Attorney, Agent, or Firm* — Wenderoth, Lind & Ponack, L.L.P.

(57) ABSTRACT

Coordinates of a first region extraction window, a first sample stage coordinate, a second sample stage coordinate, and a second region extraction window, including images of one sample stage and an observation target tissues of a sample when the one sample stage is respectively positioned on two microscopes are respectively obtained. Based on
(Continued)

difference between the first sample stage coordinate and the second sample stage coordinate, the second sample stage coordinate is corrected. Based on the obtained corrected second sample stage coordinate, the second positioning unit is moved from the second non-observation position to the second observation position where the second region extraction window is located at a position corresponding to the coordinate position of the first region extraction window.

10 Claims, 30 Drawing Sheets

(51) Int. Cl.
  G02B 21/26 (2006.01)
  G01N 23/225 (2018.01)
  H01J 37/16 (2006.01)
  H01J 37/22 (2006.01)
  G02B 21/36 (2006.01)
  G06K 9/62 (2006.01)
  G06T 7/33 (2017.01)
  G06T 7/73 (2017.01)
  H01J 37/18 (2006.01)
  G02B 21/18 (2006.01)
  G01N 23/2206 (2018.01)
  G06T 1/00 (2006.01)
  G06K 9/20 (2006.01)

(52) U.S. Cl.
  CPC ........... *G02B 21/18* (2013.01); *G02B 21/365* (2013.01); *G06K 9/6202* (2013.01); *G06T 7/33* (2017.01); *G06T 7/73* (2017.01); *H01J 37/16* (2013.01); *H01J 37/185* (2013.01); *H01J 37/20* (2013.01); *H01J 37/22* (2013.01); *H01J 37/226* (2013.01); *G06K 9/209* (2013.01); *G06T 2207/10056* (2013.01); *G06T 2207/10064* (2013.01); *G06T 2207/20221* (2013.01); *G06T 2207/30024* (2013.01); *H01J 2237/204* (2013.01); *H01J 2237/2007* (2013.01)

(58) Field of Classification Search
  USPC ...................................................... 348/80, 79
  See application file for complete search history.

(56) References Cited

U.S. PATENT DOCUMENTS

| | | | |
|---|---|---|---|
| 2014/0110597 A1 | 4/2014 | Tuma et al. | |
| 2014/0375793 A1* | 12/2014 | Harada | H01L 23/544 348/80 |
| 2017/0316913 A1* | 11/2017 | Stamsnijder | H01J 37/18 |

FOREIGN PATENT DOCUMENTS

| | | | |
|---|---|---|---|
| JP | 4-27908 | | 1/1992 |
| JP | 5-41194 | | 2/1993 |
| JP | 05041194 A | * | 2/1993 |
| JP | 5-113418 | | 5/1993 |
| JP | 06160054 A | * | 6/1994 |
| JP | 8-273572 | | 10/1996 |
| JP | 11-260303 | | 9/1999 |
| JP | 2003-140053 | | 5/2003 |
| JP | 2012-9247 | | 1/2012 |
| JP | 2014-86419 | | 5/2014 |

OTHER PUBLICATIONS

International Preliminary Report on Patentability dated Apr. 3, 2018 in International (PCT) Application No. PCT/JP2016/079121, with English Translation.

* cited by examiner

CORRELATION MICROSCOPE

TECHNICAL FIELD

The present invention relates to a correlation microscope capable of observing a sample that is conveyed by a conveying apparatus to an electron microscope and a laser microscope, respectively, which are arranged non-coaxially.

BACKGROUND ART

In medical and biotechnology fields such as development of a disease diagnosis method, biological tissues are immunostained with a fluorescent dye and then observed using a fluorescence microscope. However, with this method, the resolution is limited to about 1000 times. In contrast, as a method of observing an analysis point of a sample composed of biological tissue labeled with a fluorescent dye at high magnifications, a method has been proposed in which fluorescence is generated by irradiating the sample (cathodoluminescence) with an electron beam of a scanning electron microscope (hereinafter referred to as SEM) and the fluorescence is observed (for example, PTL 1).

Further, although relating to analysis of a semiconductor wafer or the like, a surface analyzing apparatus has been proposed in which X-ray spectroscopic spectrum and fluorescence spectrum of an analysis point of a sample are measured by combining a SEM and an optical microscope so as to perform in a single apparatus sample excitation by charged particles and sample excitation by light (for example, PTL 2).

As described above, by combining a SEM with an optical microscope and observing immediately with SEM the analysis point of the sample composed of biological tissue labeled with a fluorescent dye, it can be expected that an object can identified from morphological characteristics of the analysis point of the living tissue sample in a short time.

However, in this case, even if the same sample is conveyed to the SEM and the optical microscope, respectively, to observe the same portion, positioning accuracy by conveyance is poor, and the same portion cannot be observed with high accuracy.

Thus, although relating to a semiconductor device, as a conveying apparatus for conveying a sample to a scanning electron microscope, configurations as disclosed in PTL 3 and PTL 4 are known.

CITATIONS LIST

Patent Literature

PTL 1 Japanese Unexamined Patent Publication No. H11-260303
PTL 2 Japanese Unexamined Patent Publication No. H5-113418
PTL 3 Japanese Unexamined Patent Publication No. 2014-86419
PTL 4 Japanese Unexamined Patent Publication No. H8-273572

SUMMARY OF INVENTION

Technical Problems

However, in the above-described conventional publications, since positioning is performed with reference to an orientation flat, such a positioning method using the orientation flat cannot be applied to a biological sample, and there has been desired development of a correlation microscope allowing observation at the same position with high accuracy.

Accordingly, an object of the present invention is to solve the above problems and to provide a correlation microscope allowing observation at the same position with high accuracy.

Solutions to Problems

In order to achieve the above object, the present invention is configured as follows.

According to a first aspect of the present invention, there is provided a correlation microscope comprising:

a first microscope;

a second microscope having an optical axis non coaxial with the first microscope;

a conveying apparatus that conveys a sample stage holding a sample from the first microscope to the second microscope in a state where the sample stage is positioned and held by a sample stage positioning and holding unit;

a first positioning apparatus that is disposed in the first microscope, that has a first positioning unit movable between at least a first observation position and a first non-observation position and positioning and holding the sample stage, and that delivers the sample stage between the first positioning unit and the sample stage positioning and holding unit of the conveying apparatus when the first positioning unit is located at the first non-observation position;

a first image acquisition unit that obtains an image of the sample stage positioned by the first positioning unit when the first positioning unit is located at each of the first observation position and the first non-observation position and that obtains an image of a first region extraction window including an observation target tissue of the sample on the sample stage;

a first coordinate acquisition unit that obtains a coordinate position of a first sample stage coordinate of the sample stage positioned by the first positioning unit based on the image obtained by the first image acquisition unit when the first positioning unit is located at the first non-observation position;

a first extraction window coordinate acquisition unit that obtains a coordinate position of the first region extraction window in the first sample stage coordinate based on the image of the first region extraction window obtained by the first image acquisition unit when the first positioning unit is located at the first non-observation position and the coordinate position of the first sample stage coordinate of the sample stage obtained by the first coordinate acquisition unit;

a second positioning apparatus that is disposed in the second microscope, that has a second positioning unit movable between at least a second observation position and a second non-observation position and positioning and holding the sample stage, and that delivers the sample stage between the second positioning unit and the sample stage positioning and holding unit of the conveying apparatus when the second positioning unit is located at the second non-observation position;

a second image acquisition unit that obtains an image of the sample stage positioned by the second positioning unit when the second positioning unit is located at each of the second observation position and the second non-observation position and that obtains an image of a second region extraction window corresponding to the first region extraction window of the sample stage;

a second coordinate acquisition unit that obtains a coordinate position of a second sample stage coordinate of the sample stage positioned by the second positioning unit based on the image obtained by the second image acquisition unit when the second positioning unit is located at the second non-observation position; and a second extraction window coordinate acquisition unit that obtains a coordinate position of the second region extraction window in the second sample stage coordinate based on the image of the second region extraction window obtained by the second image acquisition unit and the coordinate position of the second sample stage coordinate of the sample stage obtained by the second coordinate acquisition unit when the second positioning unit is located at the second non-observation position, that obtains a difference between the coordinate position of the first sample stage coordinate obtained by the first coordinate acquisition unit and the coordinate position of the second sample stage coordinate obtained by the second coordinate acquisition unit, that corrects the coordinate position of the second sample stage coordinate based on the difference obtained, and that obtains a corrected coordinate position of the second region extraction window corresponding to the first region extraction window, wherein the second positioning apparatus moves the second positioning unit from the second non-observation position to the second observation position where the second region extraction window is located at a position corresponding to the coordinate position of the first region extraction window based on the corrected coordinate position of the second region extraction window obtained by the second extraction window coordinate acquisition unit, and one of the first microscope and the second microscope is an optical microscope, and another microscope is an electron microscope.

According to a second aspect of the present invention, there is provided, in the first aspect, the correlation microscope further comprising:

an image processing unit that performs pattern matching between the image of the first region extraction window obtained by the first image acquisition unit when the first positioning unit is located at the first observation position and the image of the second region extraction window obtained by the second image acquisition unit when the second positioning unit is located at the second observation position, based on a plurality of feature portions of the observation target tissue extracted from the image of the first region extraction window obtained by the first image acquisition unit when the first positioning unit is located at the first observation position; and an image synthesis unit that superimposes the image of the first region extraction window and the image of the second region extraction window on each other, based on a result of the pattern matching in the image processing unit, the coordinate position of the first sample stage coordinate obtained by the first coordinate acquisition unit, and the corrected coordinate position of the second region extraction window obtained by the second extraction window coordinate acquisition unit.

Advantageous Effects of Invention

According to the first aspect of the present invention, the first region extraction window, the first sample stage coordinate, the second sample stage coordinate, and the coordinate of the second region extraction window, including the same sample stage image and the observation target tissue of the sample at the time when the sample stage is positioned by the two microscopes are obtained, respectively, the second sample stage coordinate is corrected based on the difference between the first sample stage coordinate and the second sample stage coordinate, and the corrected coordinate of the second region extraction window is obtained. The second positioning apparatus moves the second positioning unit from the second non-observation position to the second observation position where the second region extraction window is located at the position corresponding to the coordinate position of the first region extraction window, based on the corrected coordinate position. As a result, observation at the same position can be performed with high accuracy.

According to the second aspect of the present invention, pattern matching is performed with respect to the second region extraction window image corresponding to the first region extraction window image, and it is possible to form a synthesis image in which the first region extraction window image and the second region extraction window image are superimposed on each other. As a result, a synthesis image at the same position can be obtained and observed with high accuracy.

BRIEF DESCRIPTION OF DRAWINGS

These and other aspects and features of the present invention will become clear from the following description in conjunction with the preferred embodiments thereof with reference to the accompanying drawings, in which.

DESCRIPTION OF EMBODIMENTS

Hereinafter, a first embodiment of the present invention will be described in detail with reference to the drawings.

Figure 1:
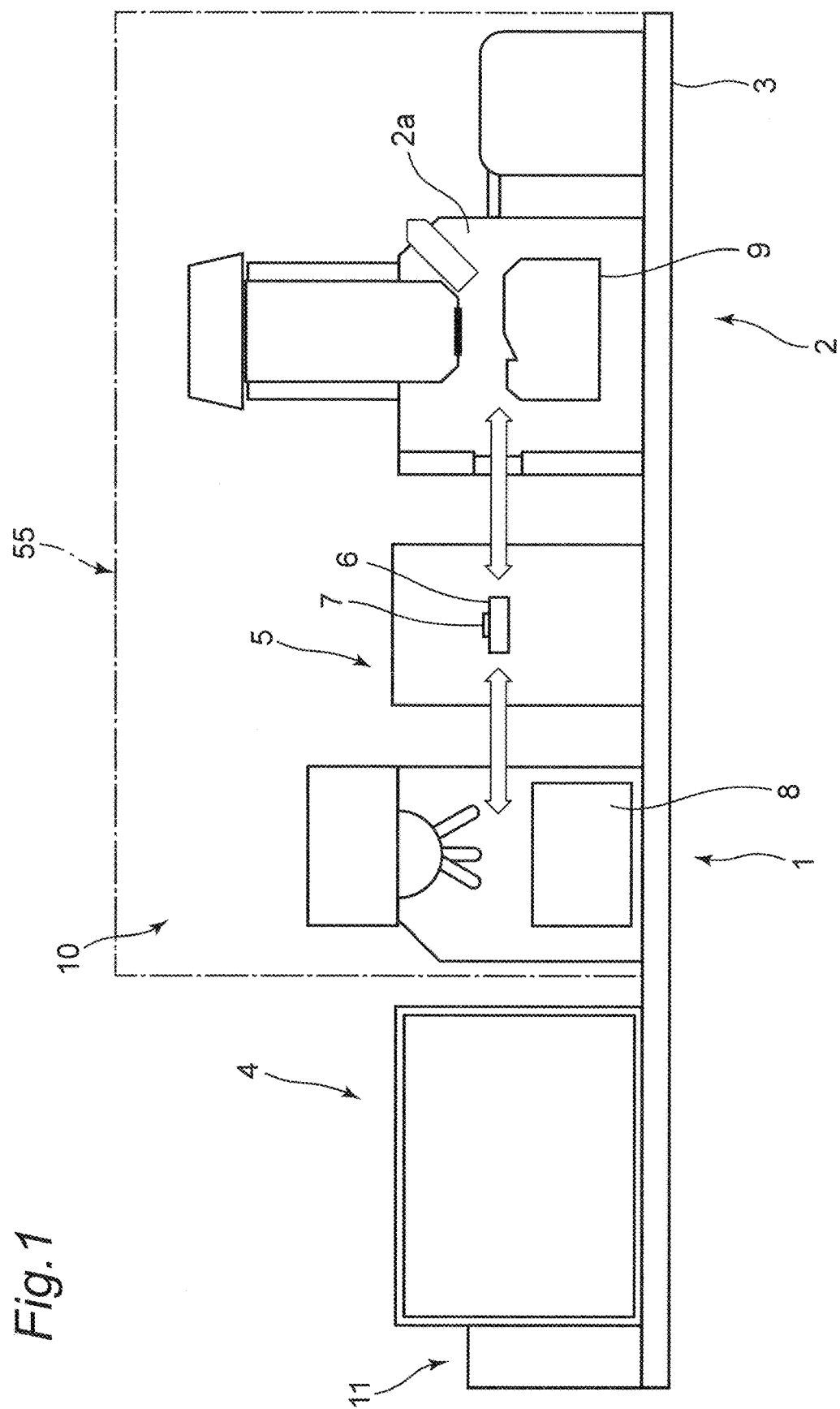
FIG. 1 is a schematic front view of a correlation microscope according to one embodiment of the present invention.
Figure 2:
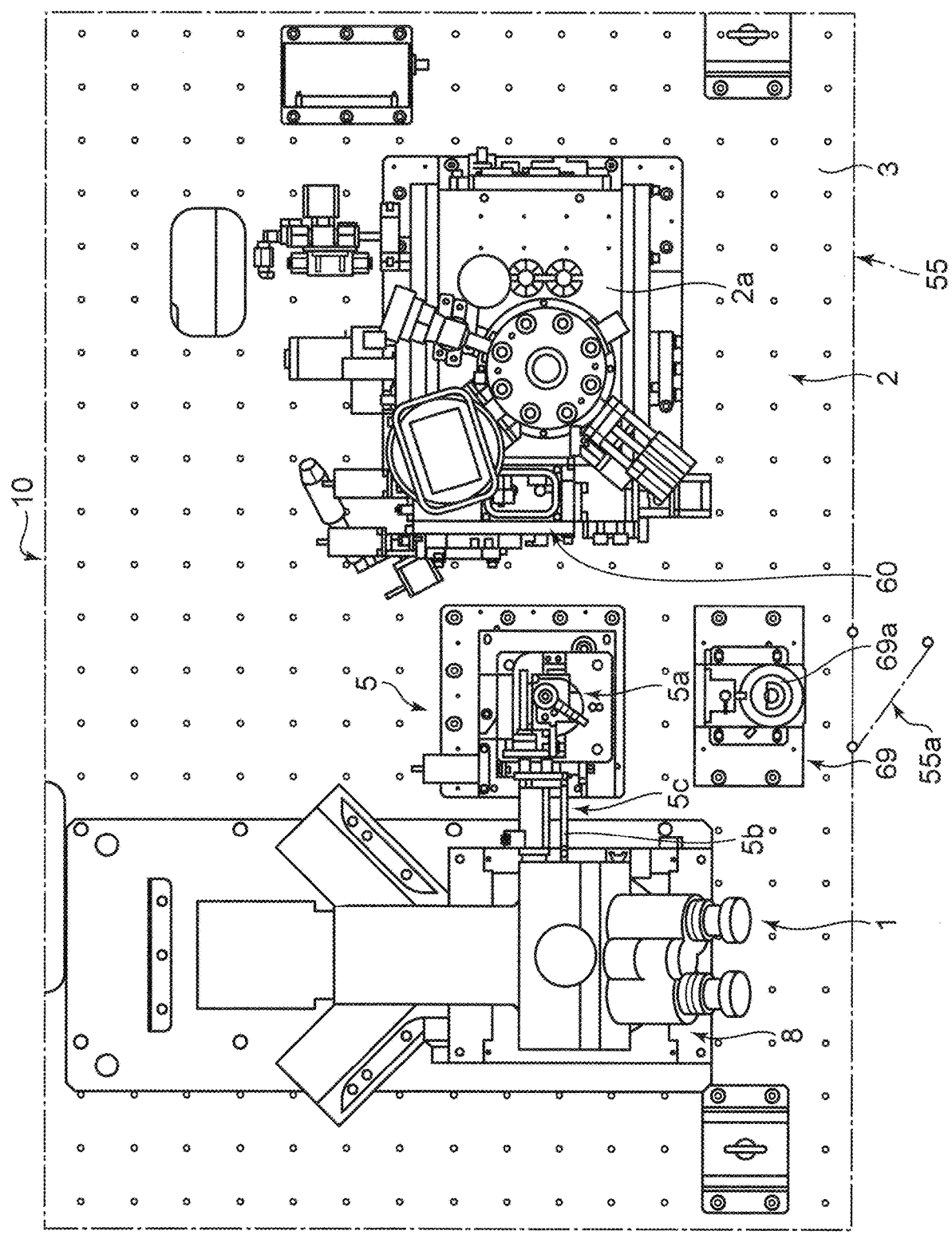
FIG. 2 is a plan view of the correlation microscope according to the embodiment.
Figure 3:
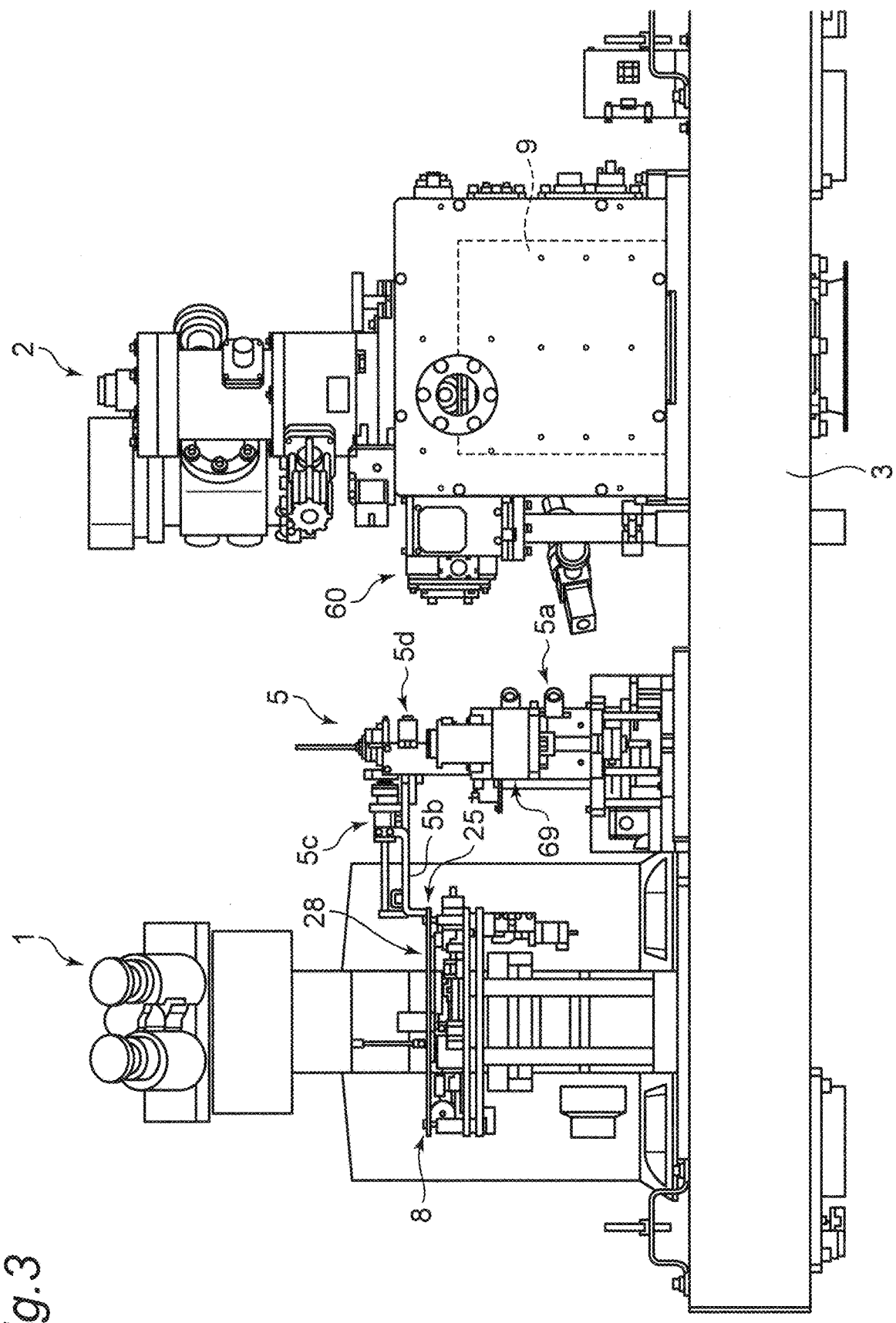
FIG. 3 is a front view of the correlation microscope.

FIG. 1 is a schematic configuration view of a correlation microscope 10 according to the first embodiment of the present invention. FIGS. 2 and 3 are respectively a plan view and a front view showing arrangement of the correlation microscope 10 as an example.

As shown in FIGS. 1 to 3, the correlation microscope 10 according to the first embodiment of the present invention includes at least a first microscope 1, a second microscope 2, a conveying apparatus 5, a first positioning apparatus 8, a second positioning apparatus 9, and a control unit 11. If necessary, the correlation microscope 10 also includes a monitor 4, a storage unit 50, a sample stage introduction apparatus 69, an anti-vibration base 3, and so on. The monitor 4 is a display for displaying an observation result. The storage unit 50 stores information obtained by each unit of the control unit 11, various detection units, a linear scale, or the like. The sample stage introduction apparatus 69 is an apparatus for preparing a sample stage 6 for introduction. The anti-vibration base 3 is an apparatus for placing various apparatuses and the like and preventing vibrations transmitted from outside of the correlation microscope 10 to the correlation microscope 10.

One of the first microscope 1 and the second microscope 2 is an optical microscope, and the other microscope is an electron microscope. As an example, in the first embodiment, the first microscope 1 is a confocal microscope that is an example of the optical microscope. On the other hand, the second microscope 2 is a scanning electron microscope that is an example of the electron microscope, and the optical axis thereof is non coaxial with that of the confocal microscope 1. In the following description, the sample stage 6 is first conveyed to the confocal microscope that is an example of the first microscope 1, and then the sample stage 6 is conveyed to the scanning electron microscope that is an example of the second microscope 2; however, the conveyance is not limited to this order, and the sample stage 6 may be conveyed in the reverse order.

Figure 4:
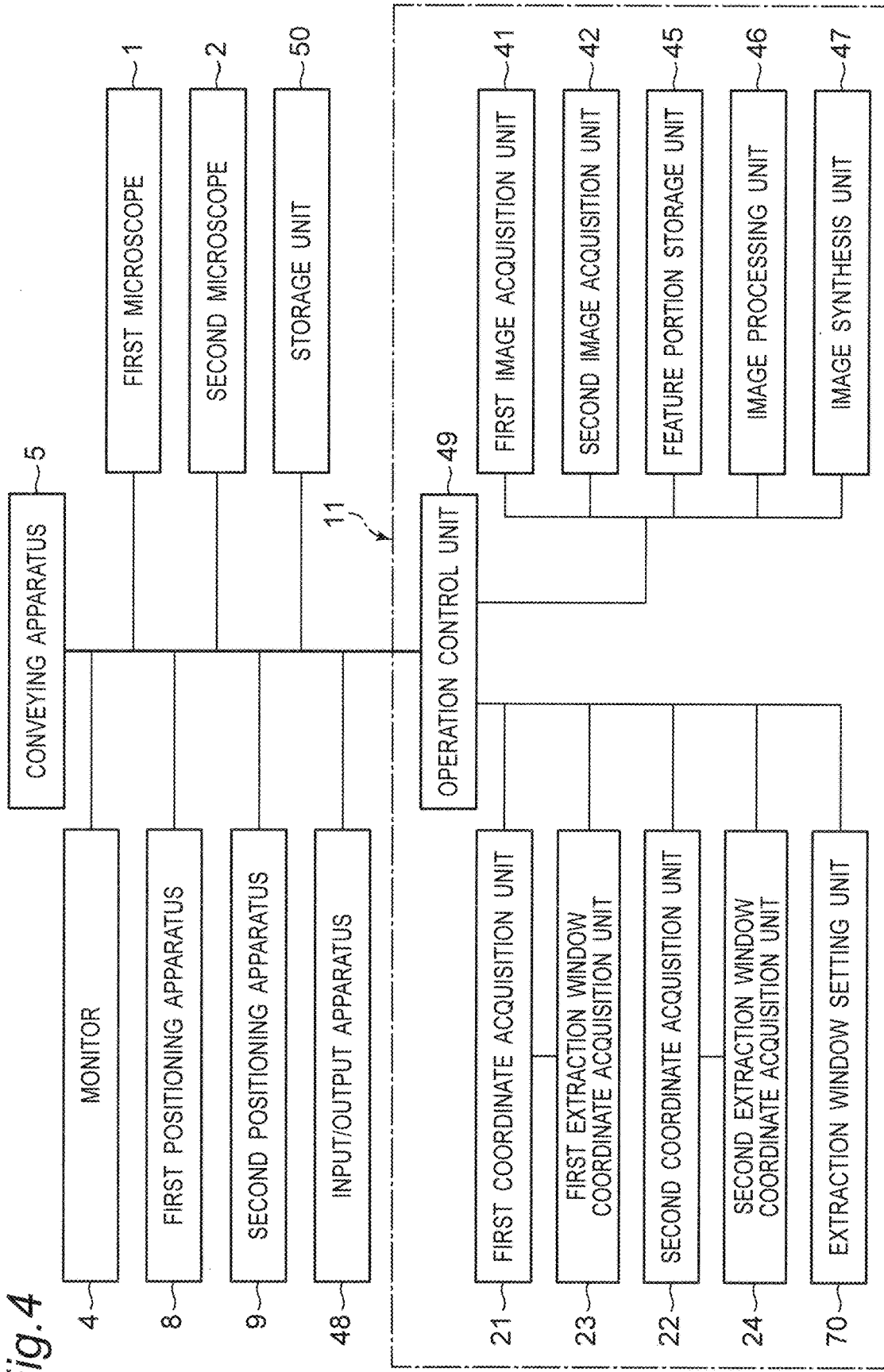
FIG. 4 is a block diagram of the correlation microscope.

Although described in detail later, as shown in FIG. 4, the control unit 11 includes at least a first coordinate acquisition unit 21, a second coordinate acquisition unit 22, a first extraction window coordinate acquisition unit 23, a second extraction window coordinate acquisition unit 24, a first image acquisition unit 41, a second image acquisition unit 42, an image processing unit 46, and an image synthesis unit 47. An operation control unit 49 of the control unit 11 controls each operation of various driving apparatuses, such as the first microscope 1, the second microscope 2, the conveying apparatus 5, the first positioning apparatus 8, the second positioning apparatus 9, a load lock chamber unit 60, and a rotary conveying apparatus 66, and controls each operation from the first coordinate acquisition unit 21 to the image synthesis unit 47 of the control unit 11.

The sample stage 6 is conveyed by the conveying apparatus 5 between the first microscope 1 and the second microscope 2. The sample stage 6 holds a sample 7.

Figure 5A:
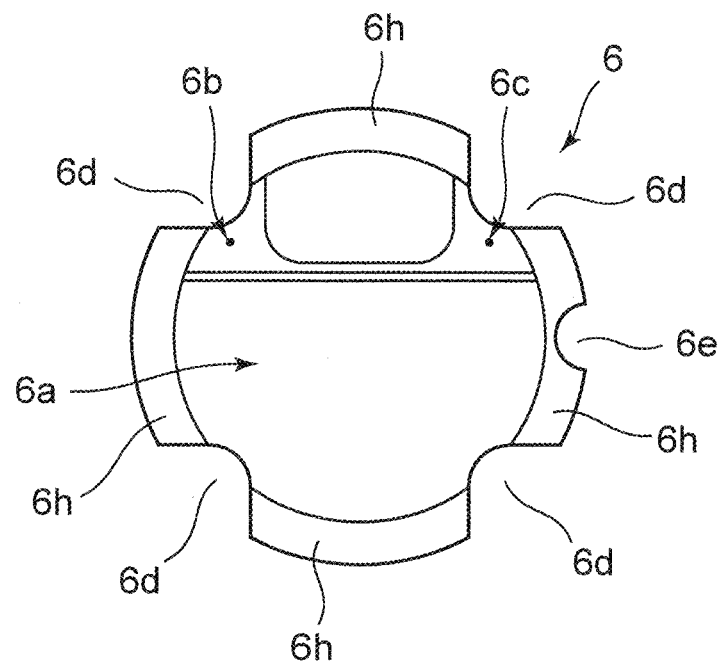
FIG. 5A is a plan view of a sample stage of the correlation microscope.
Figure 5B:
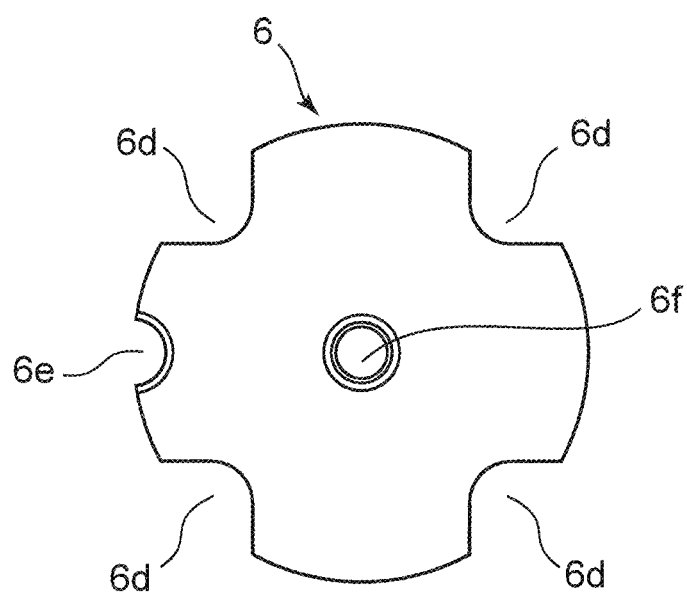
FIG. 5B is a bottom view of the sample stage of the correlation microscope.
Figure 5C:
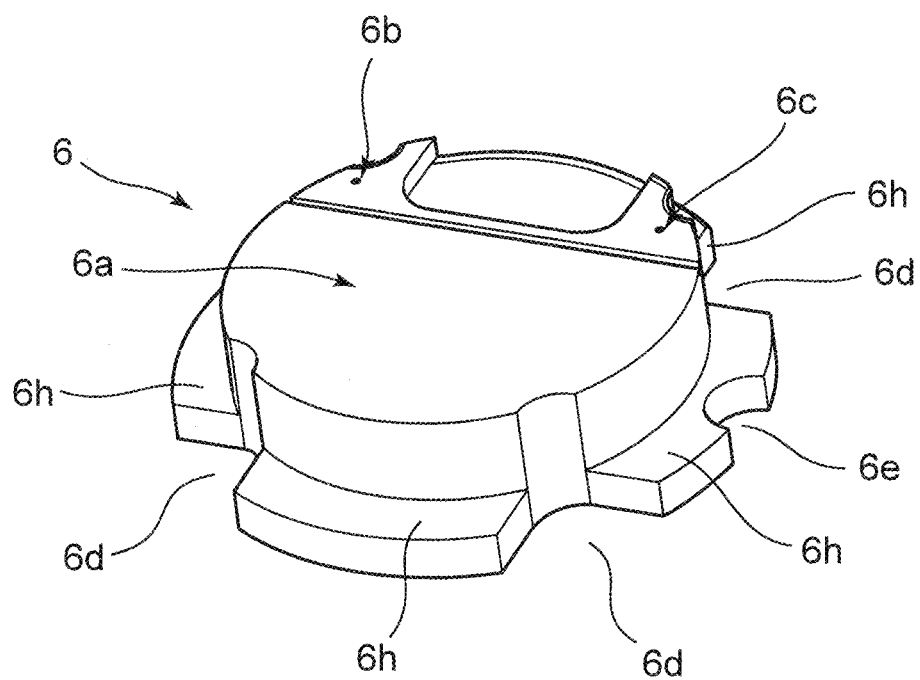
FIG. 5C is a perspective view of the sample stage of the correlation microscope.
Figure 6:
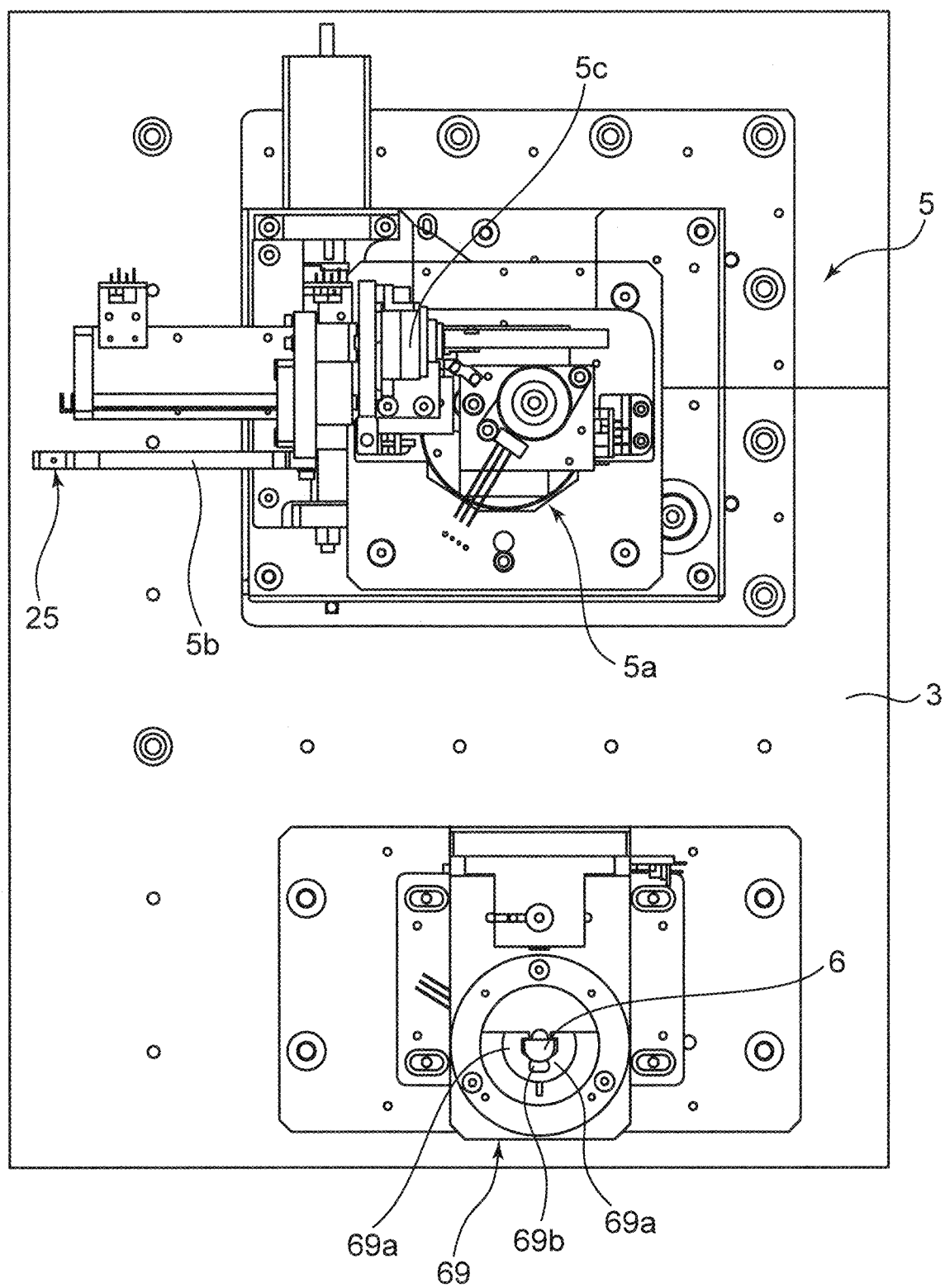
FIG. 6 is a partial plan view of a conveying apparatus of the correlation microscope.
Figure 7:
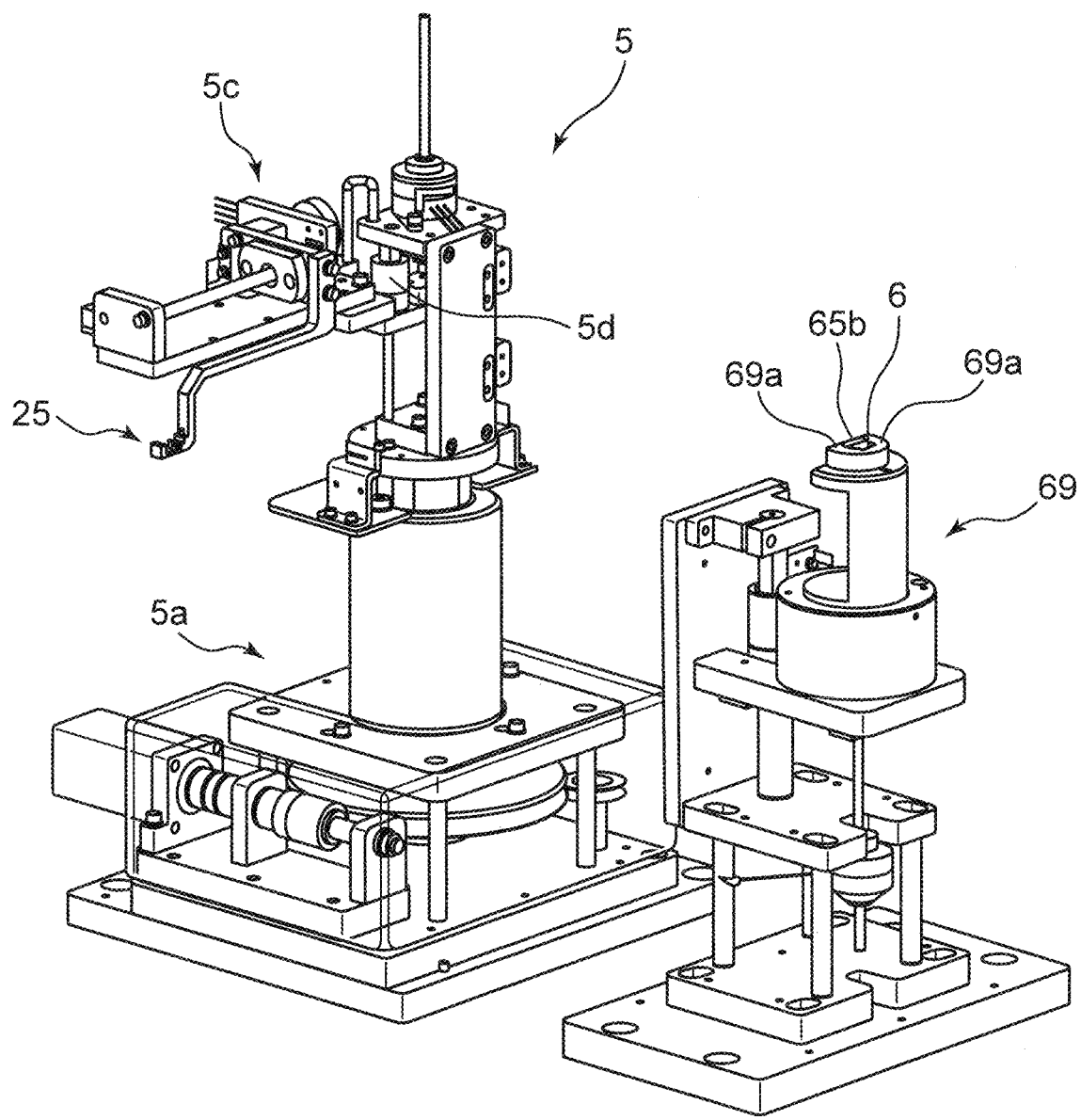
FIG. 7 is a partial perspective view of the conveying apparatus of the correlation microscope.

As shown in FIGS. 5A to 5C, the sample stage 6 is constituted of a disc-shaped member of non-magnetic material such as copper. On a surface of the sample stage 6, a sample placement region 6a is disposed, and two reference points 6b and 6c are arranged near and outside the sample placement region 6a. Each of the reference points 6b and 6c is formed as a small circular recess having a diameter of about 1 mm, for example. The sample stage 6 has on its side surface curved cutout portions 6d, . . . , 6d provided at every 90 degrees at the peripheral four corners and has a circular positioning cutout 6e in a middle of two adjacent cutout portions 6d and 6d. The sample stage 6 further has a circular positioning recess 6f at a center of a back surface of the sample stage 6. The sample stage 6 has a flange portion 6h for preventing upward inclination in a lower portion of the side surface of an entire periphery of the sample stage 6. In the sample placement region 6a, a biological sample 7 including an observation target tissue 35 is fixed with a double-sided adhesive tape or the like. Examples of the observation target tissue 35 include a cell, an organ and a portion of a cell or organ.

The conveying apparatus 5 has at least a sample stage positioning and holding unit 25 and conveys the sample stage 6 from the first microscope 1 to the second microscope 2 in a state where the sample stage 6 is positioned and held by the sample stage positioning and holding unit 25. Specifically, as shown in FIGS. 6 to 9, the conveying apparatus 5 includes a rotating apparatus 5a driven to rotate forward and backward by a motor or the like, a conveying arm 5b rotated forward and backward by the rotating apparatus 5a, the sample stage positioning and holding unit 25 attached to a distal end of the conveying arm 5b, a reciprocating apparatus 5c for advancing and retreating the sample stage positioning and holding unit 25 in an axial direction of the conveying arm 5b, and a lifting and lowering apparatus 5d for vertically moving the conveying arm 5b. Each of the reciprocating apparatus 5c and the lifting and lowering apparatus 5d is, for example, a known driving apparatus that performs reciprocal driving in one axial direction with a forward/reverse rotation motor or the like while performing guiding with a guiding mechanism. Thus, the sample stage positioning and holding unit 25 is rotated forward and backward around the rotation axis of the rotating apparatus 5a, the conveying arm 5b is moved vertically by the lifting and lowering apparatus 5d, and the sample stage positioning and holding unit 25 can be advanced and retreated in an axial direction of the conveying arm 5b by the reciprocating apparatus 5c, so that the sample stage 6 can be freely adjusted in position with respect to the first positioning apparatus 8 and the second positioning apparatus 9.

Figure 8:
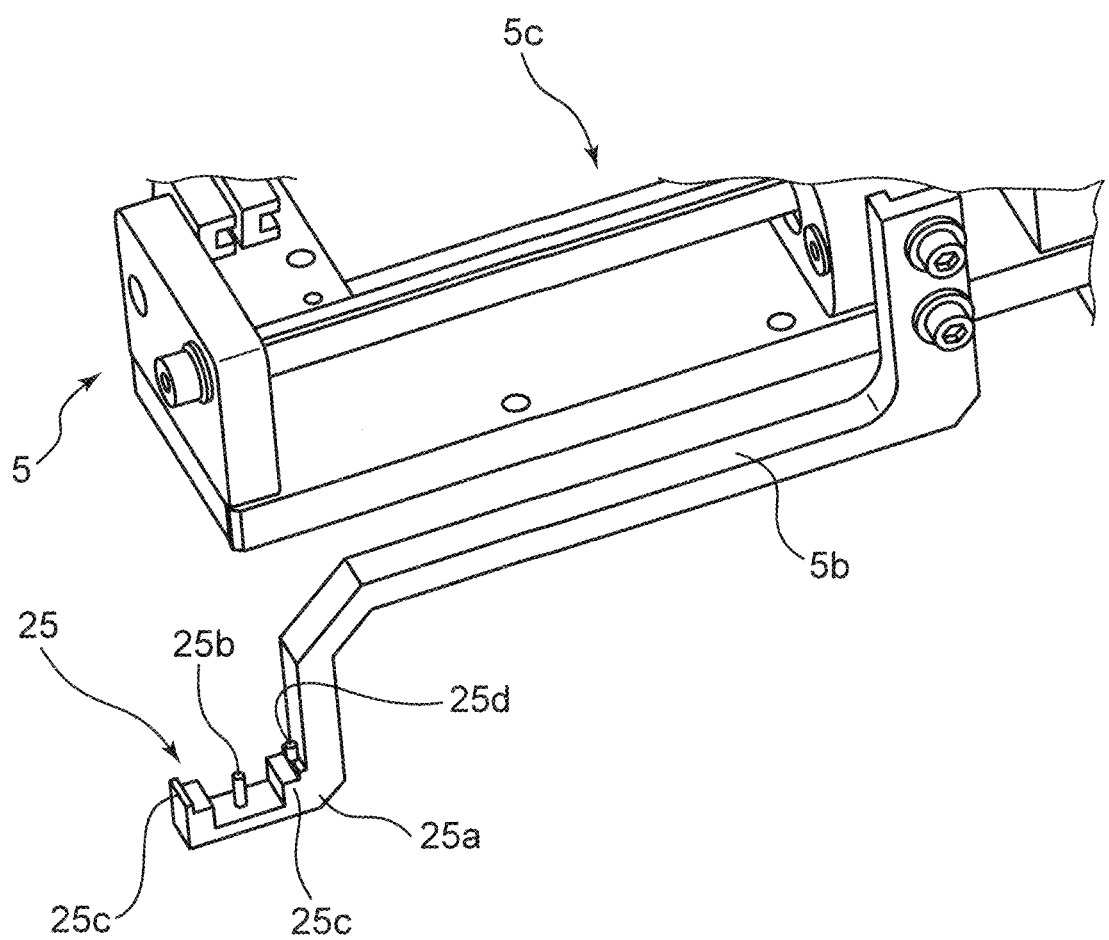
FIG. 8 is a perspective view in the vicinity of a sample stage positioning and holding unit of the conveying apparatus of the correlation microscope.
Figure 9:
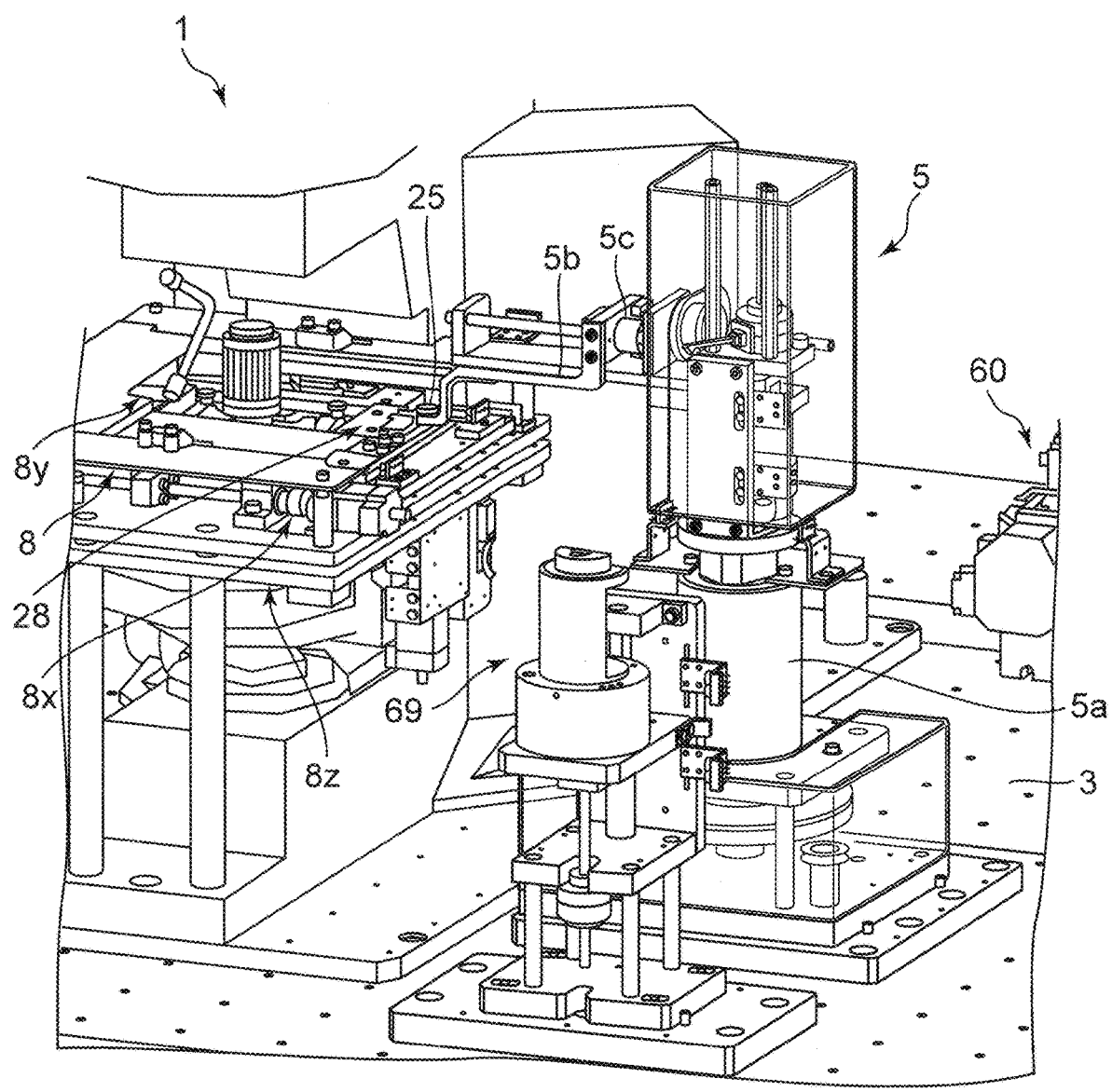
FIG. 9 is a perspective view in a periphery of the conveying apparatus of the correlation microscope.

As shown in FIG. 8, the sample stage positioning and holding unit 25 includes a L-shaped holding frame portion 25a fixed to the distal end of the conveying arm 5b, a first positioning pin 25b provided upright on a lower central portion of the holding frame portion 25a, a pair of support stage portions 25c protruding to both sides of the first positioning pin 25b and supporting the back surface of the sample stage 6, and a second positioning pin 25d provided upright from one of the pair of the support stage portions 25c on a base end side of the holding frame portion 25a. Thus, the first positioning pin 25b is fitted in the positioning recess 6f at the center of the back surface of the sample stage 6, and the second positioning pin 25d is fitted in the positioning cutout 6e of the sample stage 6, so that the back surface of the sample stage 6 can be supported and held by the pair of support stage portions 25c while the sample stage 6 is positioned with respect to the sample stage positioning and holding unit 25.

Figure 10:
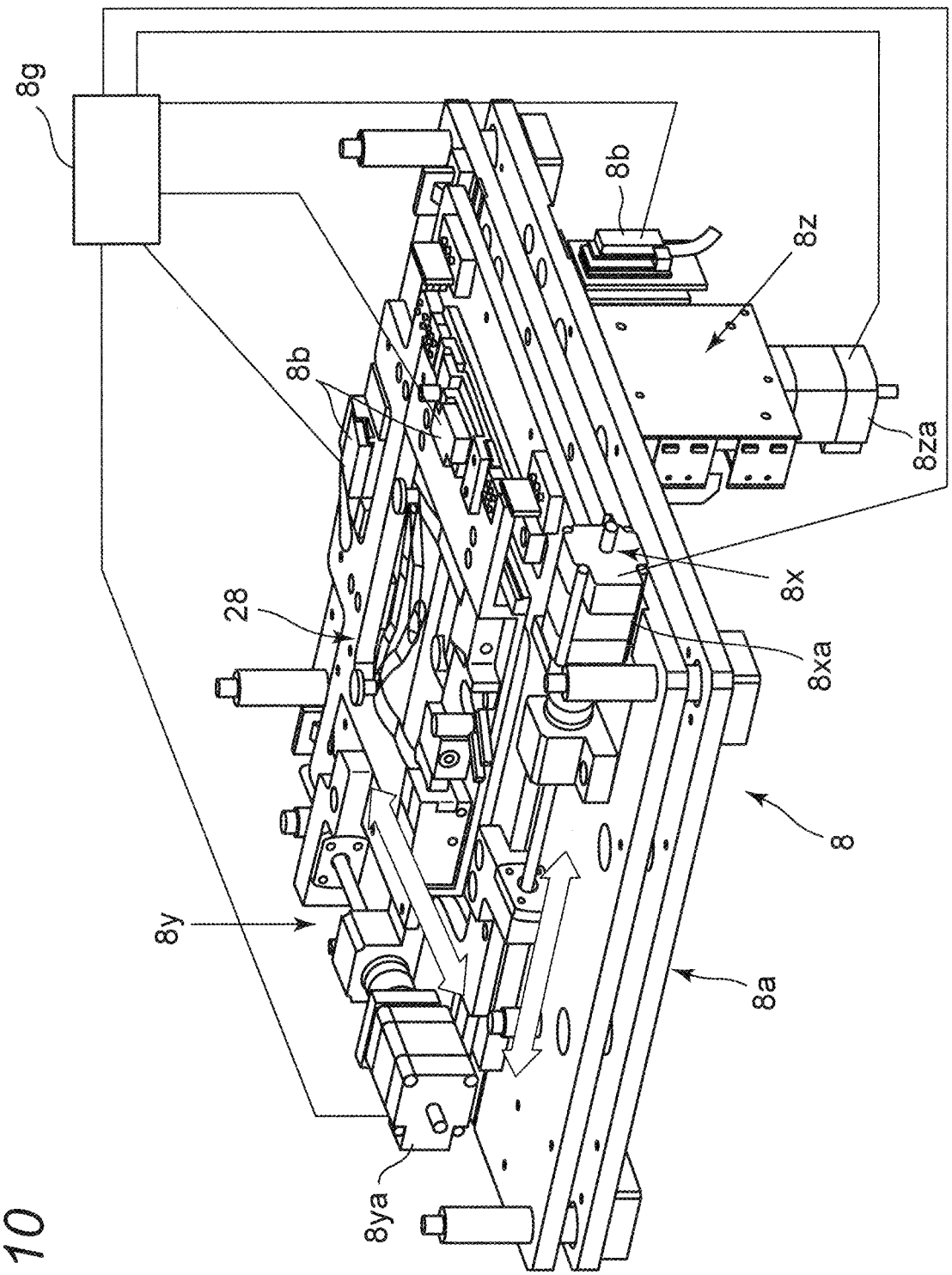
FIG. 10 is a perspective view of a first positioning apparatus of the correlation microscope.

The first positioning apparatus 8 is disposed under the first microscope 1. As shown in FIG. 10, the first positioning apparatus 8 is constituted of, for example, an XYZ stage 8a, a linear scale 8b, and a first positioning control unit 8g.

The XYZ stage 8a is constituted of an X axis stage 8x, a Y axis stage 8y, and a Z axis stage 8z. The XYZ stage 8a can be advanced and retreated in an X axis direction by the X axis stage 8x, can be advanced and retreated in a Y axis direction by the Y axis stage 8y, and can be advanced and retreated in a Z axis direction by the Z axis stage 8z.

The linear scale 8b is disposed at each axis of the X axis stage 8x, the Y axis stage 8y, and the Z axis stage 8z of the XYZ stage 8a, and is also referred to as a linear encoder. The linear scale 8b is a length measuring apparatus of nm order, and the XYZ stage 8a is positioned by PID control with the use of the length measuring apparatuses. In each of the linear scales 8b, laser is irradiated from a fixed side encoder head to a movable side glass scale, and a scale of the movable side glass scale is obtained with nm precision by the fixed side encoder head based on light reflected by the movable side glass scale to be received. That is, position coordinates of each axis can be obtained with nm precision by the fixed side encoder head. Accordingly, an XY coordinate 58 and an apparatus coordinate origin 58o to be described later are provided such that stage coordinate system resolution and positional accuracy of the XYZ stage 8a of the first microscope 1, that is, the apparatus coordinate (XY coordinate) 58 and the apparatus coordinate origin 58o of the XYZ stage 8a of the first microscope 1 repeatedly coincide with each other with nm precision.

The first positioning control unit 8g drives and controls driving apparatuses 8xa, 8ya, and 8za, such as a motor of each stage, based on information of the linear scale 8b. That is, the first positioning control unit 8g allows, based on the information of the linear scale 8b, the X axis stage 8x, the Y axis stage 8y, and the Z axis stage 8z to be moved on the X axis, the Y axis and the Z axis orthogonal to one another by servo control with nm precision, for example, 10 nm resolution.

The first positioning apparatus 8 has a first positioning unit 28 for positioning and holding the sample stage 6, and after the first positioning unit 28 is located at a delivery position I, the first positioning apparatus 8 delivers the sample stage 6 between the first positioning unit 28 and the sample stage positioning and holding unit 25 of the conveying apparatus 5. In addition to the delivery position I where the sample stage 6 is delivered, the first positioning unit 28 can move to a first reference mark imaging reference position where a coordinate position is obtained and one or a plurality of first observation positions where observation is performed, respectively. In the present embodiment, the delivery position I and the first reference mark imaging reference position are examples of a first non-observation position. The non-observation position is a position other than the observation position, and in the non-observation position, an operation to deliver the sample stage 6 or obtain apparatus coordinates and the like is performed. The first reference mark imaging reference position of the first positioning unit 28 is previously determined in the first positioning apparatus 8, and, for example, in order to simplify coordinate calculation, the first reference mark imaging reference position may be determined at such a position where the Y axis is located in a middle of the two reference points 6b and 6c and the X axis crosses the sample placement region 6a (see the coordinate on the left side of FIG. 13).

Figure 11:
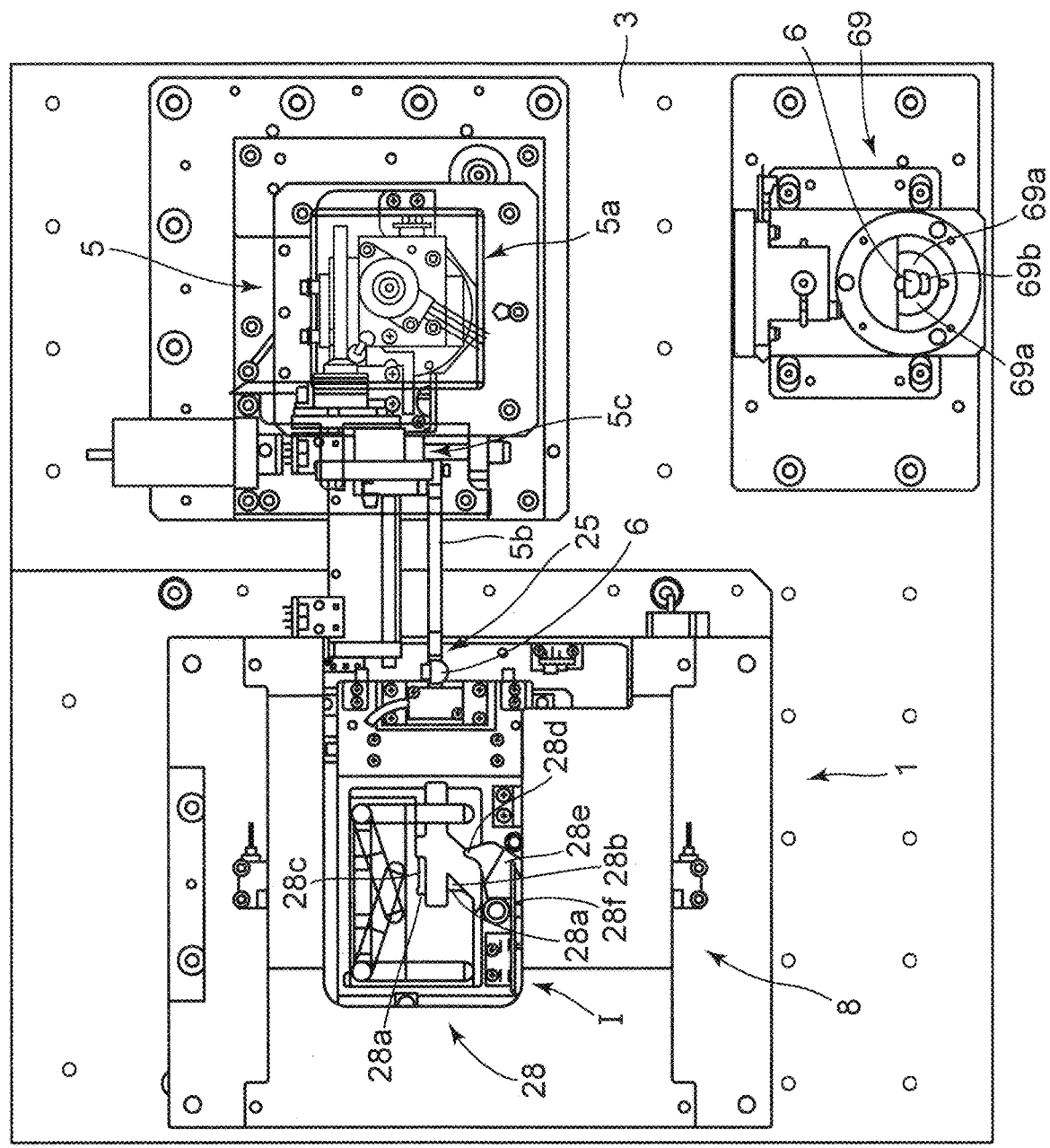
FIG. 11 is a plan view of a first microscope, a conveying apparatus, and a sample stage introduction apparatus of the correlation microscope.
Figure 12:
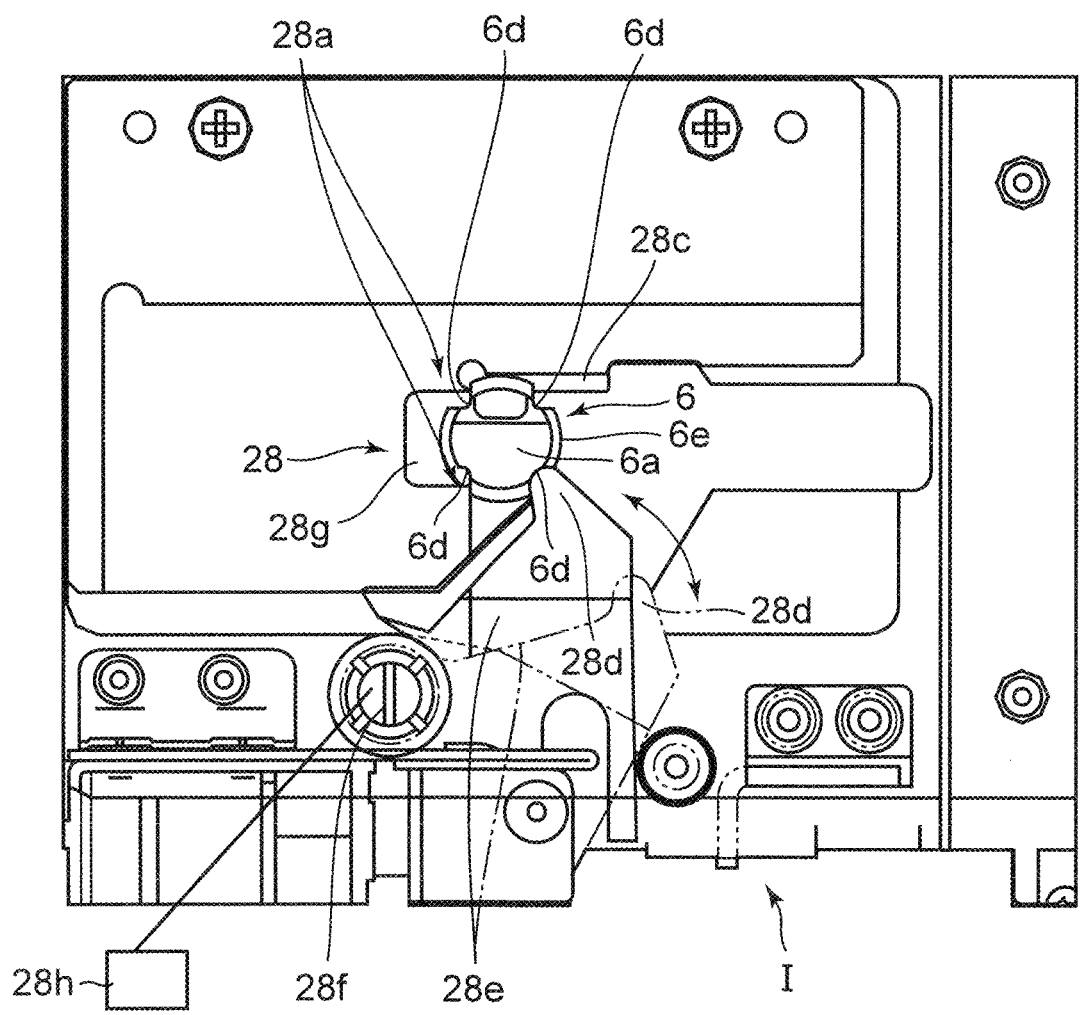
FIG. 12 is an enlarged plan view of a first positioning unit of the first positioning apparatus of the correlation microscope.

As shown in FIGS. 11 and 12, the first positioning unit 28 has a pair of positioning protrusions 28a engageable with respective pair of cutout portions 6d at a leading end in a carrying-in direction (left direction in FIG. 12) according to the conveying apparatus 5 with respect to the first positioning unit 28, a pair of supports 28b and 28c for supporting back surfaces of a pair of ends in a direction intersecting with a carrying-in direction of the sample stage 6, a lever 28e that is provided at a tip of a locking portion 28d engageable with the cutout portion 6d at the rear end in the carrying-in direction and is rotatable forward and backward around a support shaft 28f, a locking portion driving apparatus 28h such as a motor that drives the lever 28e in forward and backward rotation, and an opening 28g for carrying in and carrying out the sample stage according to the sample stage positioning and holding unit 25.

Thus, when the sample stage 6 is delivered from the sample stage positioning and holding unit 25 to the first positioning unit 28, the operation is as follows.

First, after the first positioning unit 28 is located at the delivery position I, the sample stage 6 in a state of being supported from below by the support stage portion 25c while being positioned by the first positioning pin 25b and the second positioning pin 25d of the sample stage positioning and holding unit 25 of the conveying apparatus 5 is moved together with the sample stage positioning and holding unit 25 to above the first positioning unit 28 in the carrying-in direction by the reciprocating apparatus 5c.

Then, the sample stage positioning and holding unit 25 is lowered together with the sample stage 6 by the lifting and lowering apparatus 5d, and the sample stage positioning and holding unit 25 enters the opening 28g. At that time, the back surfaces of the pair of ends in the direction intersecting with the carrying-in direction of the sample stage 6 are supported by the pair of supports 28b and 28c of the first positioning unit 28, and then the lowering of the sample stage positioning and holding unit 25 by the lifting and lowering apparatus 5d is stopped.

Then, the locking portion driving apparatus 28h rotates the lever 28e of the first positioning unit 28 in a counter-clockwise direction from a retreat position indicated by the one-dot chain line to engage the lever 28e with the cutout portion 6d at the rear end in the carrying-in direction, and engage the pair of positioning protrusions 28a of the first positioning unit 28 with the pair of cutout portions 6d at the leading end in the carrying-in direction of the sample stage 6. As a result, the sample stage 6 is positioned and held in the first positioning unit 28.

Then, the sample stage positioning and holding unit 25 of the conveying apparatus 5 is further lowered by the lifting and lowering apparatus 5d of the conveying apparatus 5 to release support of the sample stage 6 by the support stage portion 25c, and then the sample stage positioning and holding unit 25 retreats from the opening 28g of the first positioning unit 28 in the opposite direction of the carrying-in direction by the reciprocating apparatus 5c, so that the sample stage 6 can be delivered from the sample stage positioning and holding unit 25 to the first positioning unit 28.

Thereafter, the first positioning unit 28 is first positioned to the first reference mark imaging reference position by the driving of the first positioning apparatus 8, and an image of the sample stage 6 at the first reference mark imaging reference position is obtained by the first image acquisition unit 41. Then, the first positioning unit 28 is moved to the first observation position, and observation is performed by the first microscope 1.

Conversely, when the sample stage 6 is delivered from the first positioning unit 28 to the sample stage positioning and holding unit 25, the operation is as follows.

First, the first positioning unit 28 is moved to the sample stage delivery position I by the driving of the first positioning apparatus 8, and then the sample stage positioning and holding unit 25 is moved to below the first positioning unit 28 in the carrying-in direction by the reciprocating apparatus 5c.

Then, the sample stage positioning and holding unit 25 is lifted by the lifting and lowering apparatus 5d to be made enter the opening 28g, and the sample stage 6 is supported from below by the support stage portion 25c.

Then, the lever 28e of the first positioning unit 28 is rotated clockwise from the position where the lever 28e is engaged with the cutout portion 6d by the locking portion driving apparatus 28h to the retreat position indicated by the one-dot chain line to release the engagement.

Then, if the sample stage positioning and holding unit 25 is lifted together with the sample stage 6 by the lifting and lowering apparatus 5d, the sample stage 6 can be released from a positioning and holding state according to the first positioning unit 28.

Then, the sample stage positioning and holding unit 25 retreats together with the sample stage 6 from the opening 28g of the first positioning unit 28 in the opposite direction of the carrying-in direction by the reciprocating apparatus 5c, whereby the sample stage 6 can be delivered from the first positioning unit 28 to the sample stage positioning and holding unit 25.

The support stage portion 25c of the sample stage positioning and holding unit 25 supports front and rear ends in the carrying-in direction of the back surface of the sample stage 6, while the supports 28b and 28c support a pair of ends in a direction intersecting with the carrying-in direction; therefore, the support stage portion 25c and the supports 28b and 28c do not bring into contact with each other, and the sample stage 6 can be smoothly delivered between the first positioning unit 28 and the sample stage positioning and holding unit 25.

The first image acquisition unit 41 has a fluorescence selection filter (not shown) and an observation camera (for example, a CCD camera), and detects, with the CCD camera, a fluorescence image displayed with the target wavelength selected by the fluorescence selection filter, thus obtaining digital signals. When the first positioning unit 28 is positioned at the first reference mark imaging reference position, and when the first positioning unit 28 is positioned at one or a plurality of the first observation positions, the first image acquisition unit 41 obtains images of the sample stage 6 positioned by the first positioning unit 28 based on the obtained digital signals and obtains each of images of a first region extraction window 37 including the observation target tissue 35 of the sample 7 placed on the sample placement region 6a of the sample stage 6. The obtained images are stored in the storage unit 50. Here, a user can perform setting of the first region extraction window 37 through an input/output apparatus 48, such as a keyboard, a mouse, or voice input, such that the first region extraction window 37 is located within the sample placement region 6 and includes one or a plurality of the observation target tissues 35. An example of the first region extraction window 37 is a quadrangular virtual region extraction window that can be defined by designating coordinate positions of four vertexes. As an actual example, the control unit 11 may be provided with an extraction window setting unit 70 for urging the user to set the first region extraction window 37. When the first positioning unit 28 is positioned at the first reference mark imaging reference position, the image of the sample stage 6 for obtaining the apparatus coordinate 58 with respect to the apparatus coordinate origin 58o of the first positioning apparatus 8 and the image of the first region extraction window 37 at the first reference mark imaging reference position are obtained by the first image acquisition unit 41.

Figure 13:
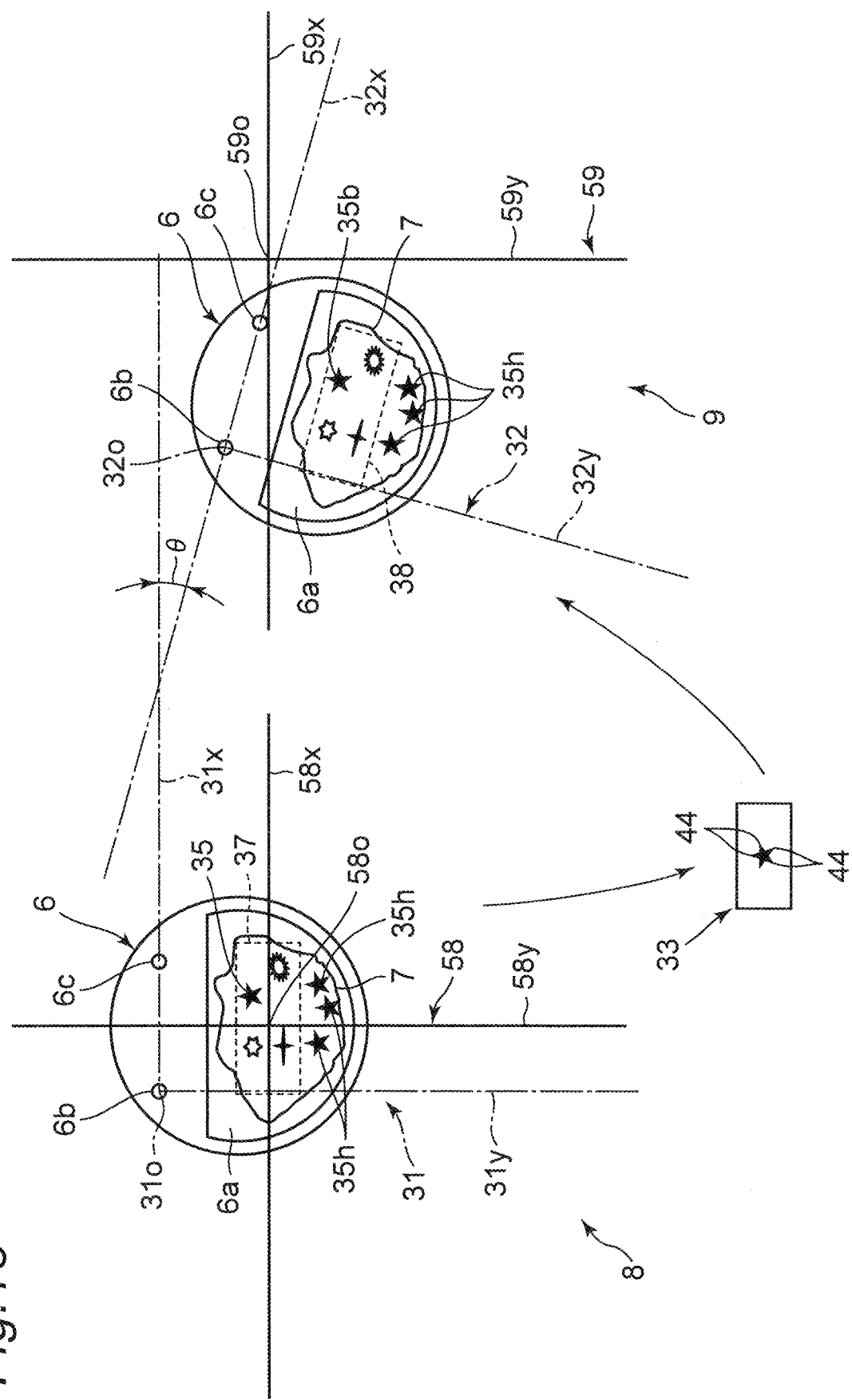
FIG. 13 is an explanatory view for explaining a relationship between a first sample stage coordinate by the first positioning apparatus and a second sample stage coordinate by a second positioning apparatus of the correlation microscope and template matching.

The first coordinate acquisition unit 21 obtains a coordinate position of a first sample stage coordinate 31 of the sample stage 6 from the image of the sample stage 6, obtained by the first image acquisition unit 41, at the first reference mark imaging reference position. Specifically, in the first coordinate acquisition unit 21, the positions of the two reference points 6b and 6c of the sample stage 6 are extracted from the image of the sample stage 6 at the first reference mark imaging reference position by pattern matching or the like, and the coordinate positions of the two reference points 6b and 6c extracted are obtained. The coordinate position here is the coordinate position of the apparatus coordinate 58 with respect to the apparatus coordinate origin 58o of the first positioning apparatus 8, as shown in FIG. 13. The apparatus coordinate 58 is constituted of an x axis 58x and a y axis 58y. Of the coordinate positions of the two reference points 6b and 6c, the coordinate position of the reference point (for example, a reference point on the leading end side in the carrying-in direction) 6b is set as an origin position 31o of the first sample stage coordinate 31, and a line 31x connecting the coordinate positions of the two reference points 6b and 6c is set as the x axis of the first sample stage coordinate 31. The axis passing through the origin position 31o of the first sample stage coordinate 31 and orthogonal to the x axis 31x of the first sample stage coordinate 31 becomes a y axis 31y of the first sample stage coordinate 31. In this manner, the first sample stage coordinate 31 can be defined by the origin position 31o, the x axis 31x, and the y axis 31y. The storage unit 50 stores information such as the obtained coordinate position of the first sample stage coordinate 31.

The first extraction window coordinate acquisition unit 23 obtains the coordinate positions of the four vertexes of the first region extraction window 37 of the sample 7 on the sample stage 6 in the first sample stage coordinate 31 of the sample stage 6 at the first reference mark imaging reference position, based on the image of the sample stage 6 at the first reference mark imaging reference position obtained by the first image acquisition unit 41 and, for example, the positions of the four vertexes of the first region extraction window 37 designated by a user. The storage unit 50 stores the obtained information and the set information.

Figure 14:
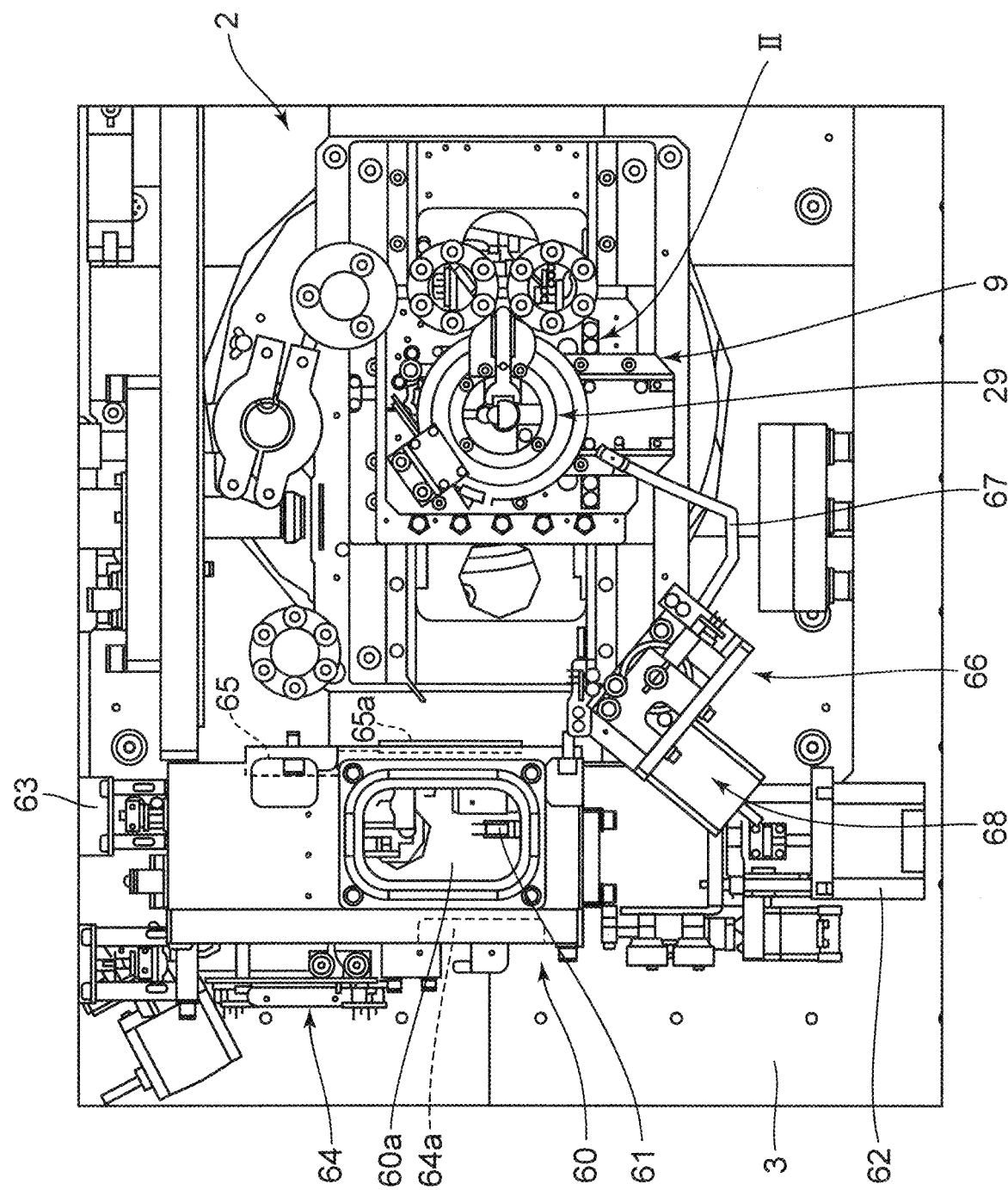
FIG. 14 is a plan view of a second microscope and a load lock chamber unit of the correlation microscope.

Although the confocal microscope can observe the sample 7 in the atmosphere, since the scanning electron microscope observes the sample 7 in vacuum, the load lock chamber unit 60 for adjusting the atmospheric pressure and the rotary conveying apparatus 66 are required. In this embodiment, since an example of the second microscope 2 is a scanning electron microscope, as shown in FIGS. 2, 3, and 14, the load lock chamber unit 60 and the rotary conveying apparatus 66 are arranged adjacent to the second microscope 2. As will be described in detail below, a conveying member 61 is provided in the load lock chamber unit 60, the sample stage 6 is delivered between the sample stage positioning and holding unit 25 of the conveying apparatus 5 and the conveying member 61, and the pressure in a load lock chamber 60a of the load lock chamber unit 60 is reduced from the atmospheric pressure to the vacuum pressure. Thereafter, the sample stage 6 is delivered between the conveying member 61 and the rotary conveying apparatus 66, and, the sample stage 6 is delivered between a rotary conveying arm 67 of the rotary conveying apparatus 66 in a vacuum chamber 2a of the second microscope 2 and the second positioning apparatus 9 of the second microscope 2.

Figure 15:
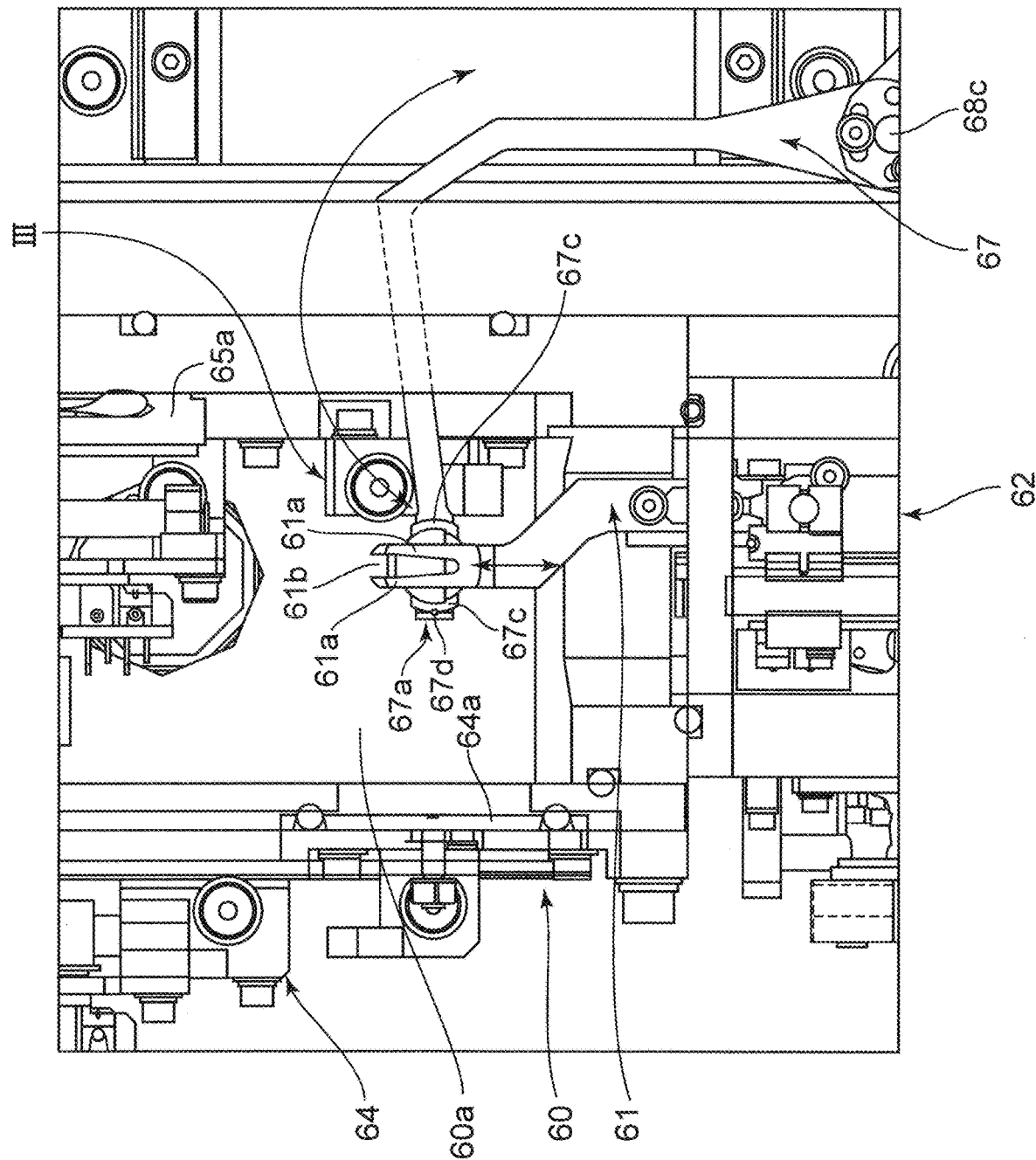
FIG. 15 is an enlarged plan view for explaining delivery in the load lock chamber of the correlation microscope.

As shown in FIGS. 14 and 15, the load lock chamber unit 60 is provided with the conveying member 61, a conveying member driving apparatus 62, a vacuum suction apparatus 63, a first opening and closing apparatus 64 on an atmosphere side, and a second opening and closing apparatus 65 on a vacuum side. The conveying member 61 allows the sample stage 6 to be delivered between the conveying member 61 and the sample stage positioning and holding unit 25 of the conveying apparatus 5 in the load lock chamber 60a and further allows the sample stage 6 to be delivered between the conveying member 61 and the rotary conveying arm 67 to be described later. The conveying member driving apparatus 62 is constituted of an air cylinder, a combination of a motor and a gear, or the like, which drives the conveying member 61 reciprocally along a longitudinal axis direction.

A distal end portion of the conveying member 61 is bifurcated into bifurcated portions 61a so that each of the first positioning pin 25b of the sample stage positioning and holding unit 25 and the first positioning pin 61b of the rotary conveying arm 67 can be inserted into a bifurcated gap 61b.

Thus, when the sample stage 6 is delivered from the sample stage positioning and holding unit 25 to the conveying member 61, the sample stage positioning and holding unit 25 enters the load lock chamber 60a and is located at a delivery position III to be described later. Then, the conveying member 61 moves from the retreat position to the delivery position III, the bifurcated portions 61a of the conveying member 61 enter a gap between the sample stage 6 of the sample stage positioning and holding unit 25 and the sample stage positioning and holding unit 25, and the first positioning pin 25b of the sample stage positioning and holding unit 25 is inserted into the bifurcated gap 61b of the conveying member 61. Thereafter, the sample stage positioning and holding unit 25 lowers. Then, the back surface of the sample stage 6 can be supported by the bifurcated portions 61a of the conveying member 61, and the sample stage 6 can be delivered from the sample stage positioning and holding unit 25 by a holding frame portion 67a of the rotary conveying arm 67. Thereafter, the conveying member 61 supporting the sample stage 6 moves to the retreat position, and then the sample stage positioning and holding unit 25 retreats from the load lock chamber 60a.

On the other hand, when the sample stage 6 is delivered from the conveying member 61 to the rotary conveying arm 67, the holding frame portion 67a of the rotary conveying arm 67 enters the load lock chamber 60a, and the first positioning pin 67b of the rotary conveying arm 67 is located below the conveying member 61 located at the delivery position III. Then, when the holding frame portion 67a of the rotary conveying arm 67 is lifted, the first positioning pin 67b of the rotary conveying arm 67 is inserted into the bifurcated gap 61b of the conveying member 61. Then, the back surface of the sample stage 6 supported by the bifurcated portions 61a can be supported by a pair of support stage portions 67c of the rotary conveying arm 67, and the sample stage 6 can be delivered from the conveying member 61 to the rotary conveying arm 67. Thereafter, the conveying member 61 moves to the retreat position, and then the sample stage positioning and holding unit 25 supporting the sample stage 6 retreats from the load lock chamber 60a.

Conversely, when the conveying member 61 receives the sample stage 6 from the rotary conveying arm 67, the holding frame portion 67a of the rotary conveying arm 67 supporting the sample stage 6 enters the load lock chamber 60a in a state where the conveying member 61 is located at the retreat position, and is located at the delivery position III. Then, the conveying member 61 moves from the retreat position to the delivery position III, and after the back surface of the sample stage 6 is supported by the bifurcated portions 61a of the conveying member 61, the holding frame portion 67a of the rotary conveying arm 67 lowers. Consequently, the sample stage 6 is supported only by the bifurcated portions 61a of the conveying member 61, and the holding frame portion 67a of the rotary conveying arm 67 retreats from the load lock chamber 60a.

When the sample stage 6 is delivered from the conveying member 61 to the sample stage positioning and holding unit 25, the sample stage positioning and holding unit 25 enters the load lock chamber 60a in a state where the conveying member 61 supporting the sample stage 6 is located at the retreat position, and is located at the delivery position III and below the conveying member 61. Then, the sample stage positioning and holding unit 25 is lifted to support the sample stage 6. Thereafter, when the conveying member 61 moves to the retreat position, the sample stage 6 is supported only by the sample stage positioning and holding unit 25. Thereafter, the sample stage positioning and holding unit 25 supporting the sample stage 6 retreats from the load lock chamber 60a.

The conveying member driving apparatus 62 drives the conveying member 61 reciprocally in the longitudinal direction so as to allow the conveying member 61 to move to the delivery position III with the sample stage positioning and holding unit 25, the delivery position III with the rotary conveying arm 67, and the retreat position of the sample stage 6 supported at the distal end portion of the conveying member 61. In this example, the delivery position III with the sample stage positioning and holding unit 25 and the delivery position III with the rotary conveying arm 67 are the same positions, but may be different positions. At the retreat position of the conveying member 61, the conveying member 61 is in a position where the conveying member 61 is not in contact with the sample stage positioning and holding unit 25 and the rotary conveying arm 67.

A first opening and closing door 64a on the conveying apparatus side, that is, the atmosphere side of the load lock chamber 60a can be opened and closed by a first opening and closing apparatus 64. On the other hand, a second opening and closing door 65a on the conveying arm side, that is, the vacuum side of the load lock chamber 60a can be opened and closed by a second opening and closing apparatus 65.

When the first opening and closing door 64a on the atmosphere side of the load lock chamber 60a is opened and closed, the pressure in the load lock chamber 60a is raised to the atmospheric pressure in a state where the conveying member 61 is located at the delivery position III or the retreat position, and then the first opening and closing door 64a on the atmosphere side is opened. Thereafter, in a state where the first opening and closing door 64a on the atmosphere side of the load lock chamber 60a is opened, the sample stage positioning and holding unit 25 of the conveying apparatus 5 enters the load lock chamber 60a to deliver the sample stage 6, and after the sample stage positioning and holding unit 25 is taken out from the load lock chamber 60a, the first opening and closing door 64a on the atmosphere side is closed. Thereafter, when the load lock chamber 60a is evacuated, the vacuum suction apparatus 63 is driven. After the vacuum is established, the second opening and closing door 65a on the vacuum side of the load lock chamber 60a is opened, the holding frame portion 67a of the rotary conveying arm 67 enters the load lock chamber 60a, and the sample stage 6 is delivered in a state where the conveying member 61 is located at the delivery position III. After the sample stage 6 is taken out from the load lock chamber 60a together with the holding frame portion 67a of the rotary conveying arm 67, the second opening and closing door 65a on the vacuum side is closed.

Conversely, when the state from vacuum to atmospheric pressure is set, the operation control unit 49 operates and controls an open valve (not shown) to open to the atmospheric pressure.

Figure 16:
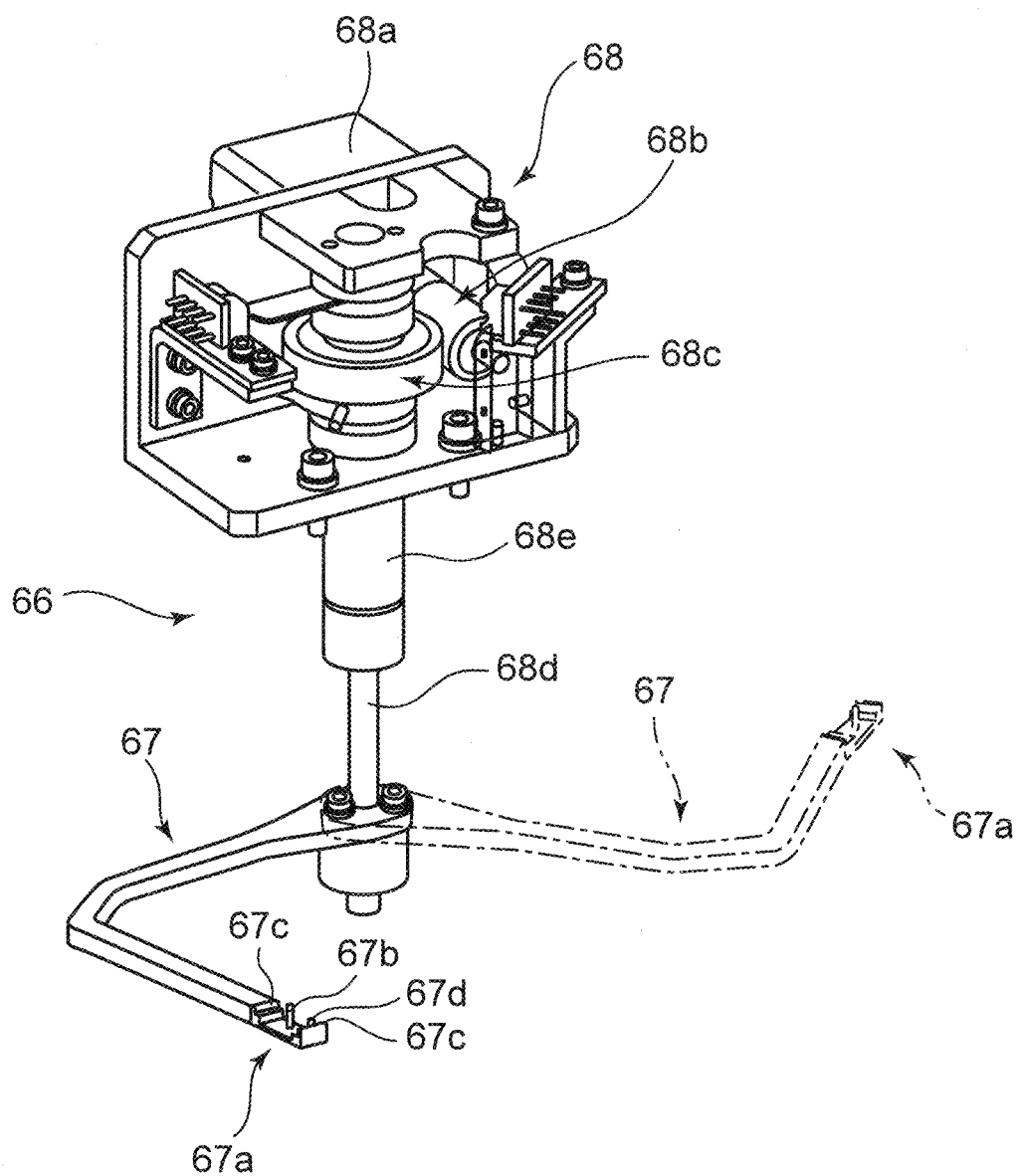
FIG. 16 is a perspective view of a rotary conveying apparatus of the correlation microscope.
Figure 17:
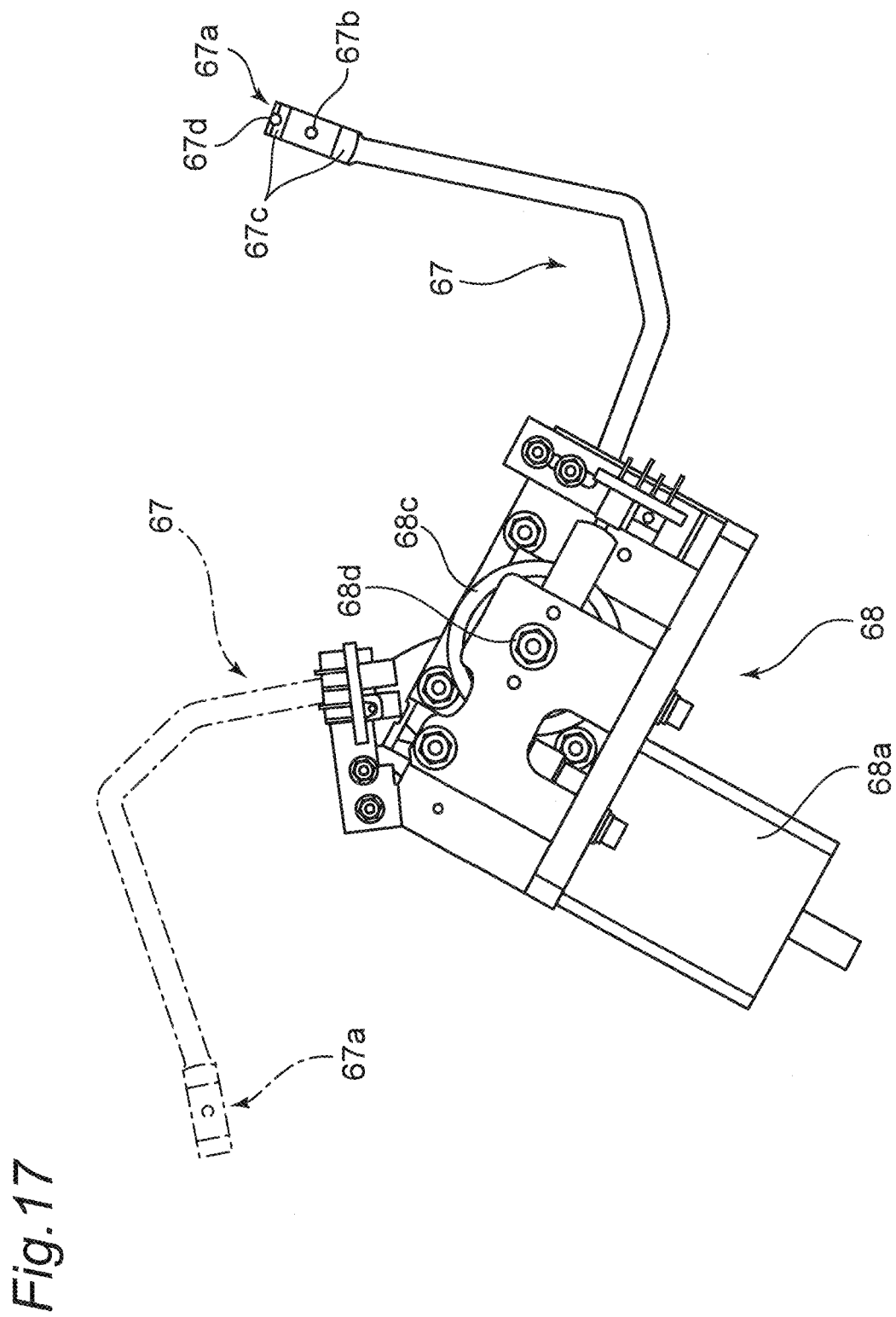
FIG. 17 is a plan view of the rotary conveying apparatus of the correlation microscope.

As shown in FIGS. 16 to 17, the rotary conveying apparatus 66 is constituted of the rotary conveying arm 67 bent in a C shape and a rotary conveying and driving apparatus 68 rotating the rotary conveying arm 67 in forward and backward directions. The rotary conveying and driving apparatus 68 is constituted of a motor 68a driving forward and backward rotation, a worm 68b, a gear 68c, a rotation shaft 68d, and a lifting and lowering apparatus 68e. When the motor 68a is driven to rotate in forward and backward directions, the worm 68b fixed to a rotation shaft of the motor 68a rotates forward and backward, and the rotation shaft 68d fixed to the gear 68c meshing with the worm 68b rotates forward and backward.

The rotary conveying arm 67 is provided with the C-shaped holding frame portion 67a, the first positioning pin 67b provided upright on a lower central portion of the holding frame portion 67a, and a pair of support stage portions 67c protruding to both sides of the first positioning pin 67b and supporting the back surface of the sample stage 6.

Thus, the first positioning pin 67b can support and hold the back surface of the sample stage 6 with the pair of support stage portions 67c in a state of being fitted in the positioning recess 6f at the center of the back surface of the sample stage 6.

The rotary conveying arm 67 is rotatable and movable between a position where the holding frame portion 67a of the rotary conveying arm 67 enters the load lock chamber 60a and delivers the sample stage 6 to and from the conveying member 61 and a position where the sample stage 6 is delivered to and from the second positioning apparatus 9 of the second microscope 2. The lifting and lowering apparatus 68e is constituted of an air cylinder or the like and can lift and lower the rotary conveying arm 67 along a rotation axis direction.

Figure 18:
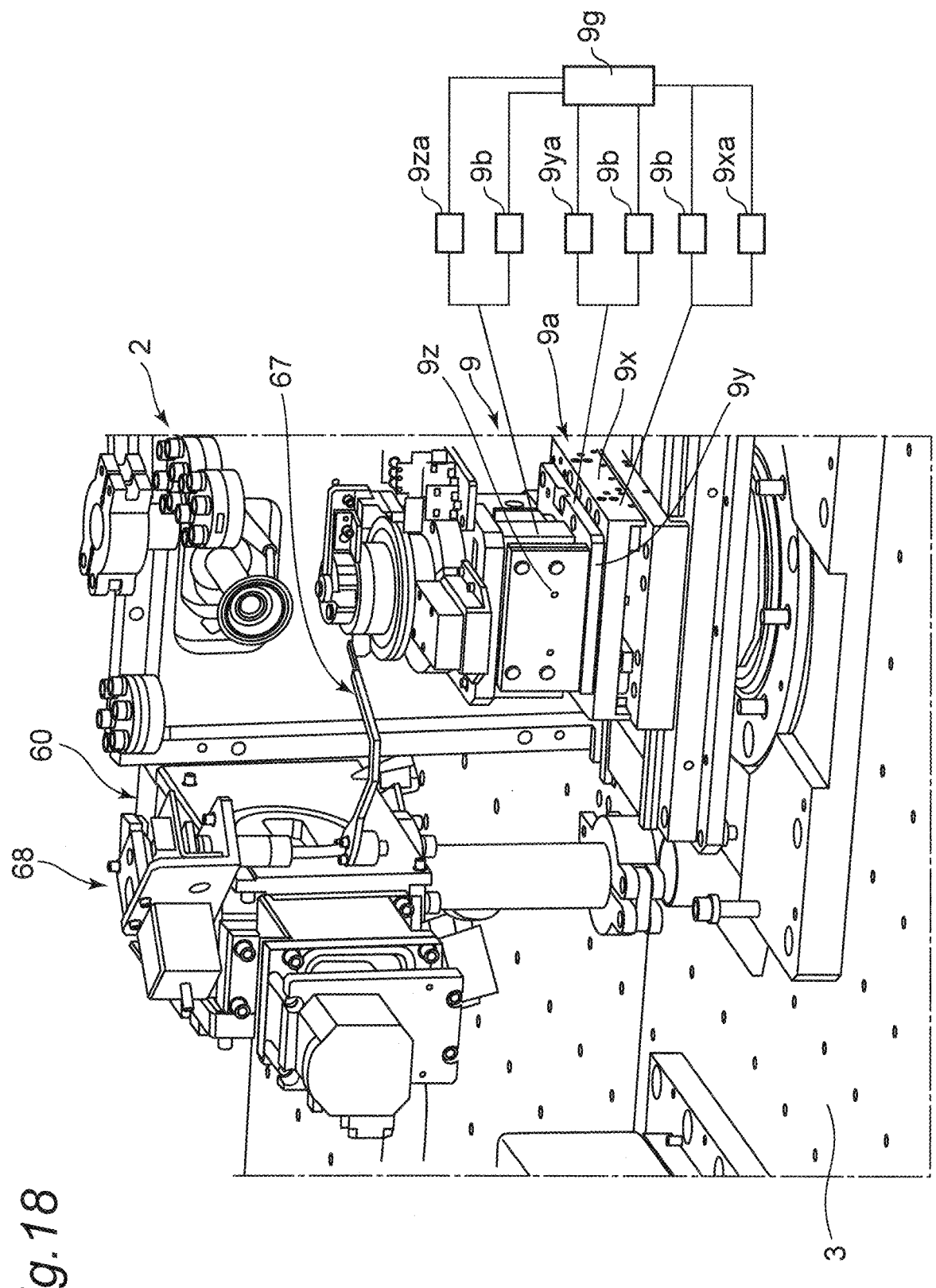
FIG. 18 is a perspective view of the load lock chamber unit of the correlation microscope and an inside of a vacuum chamber of the second microscope.

The second positioning apparatus 9 is disposed under the second microscope 2. As shown in FIG. 18, the second positioning apparatus 9 is constituted of, for example, an XYZ stage 9a, a linear scale 9b, and a second positioning control unit 9g.

The XYZ stage 9a is constituted of an X axis stage 9x, a Y axis stage 9y, and a Z axis stage 9z. The XYZ stage 9a can be advanced and retreated in an X axis direction by the X axis stage 9x, can be advanced and retreated in a Y axis direction by the Y axis stage 9y, and can be advanced and retreated in a Z axis direction by the Z axis stage 9z.

The linear scale 9b is disposed at each axis of the X axis stage 9x, the Y axis stage 9y, and the Z axis stage 9z of the XYZ stage 9a, and is also referred to as a linear encoder. The linear scale 9b is a length measuring apparatus of nm order, and the XYZ stage 9a is positioned by PID control with the use of the length measuring apparatuses. In each of the linear scales 9b, laser is irradiated from a fixed side encoder head to a movable side glass scale, and a scale of the movable side glass scale is obtained with nm precision by the fixed side encoder head based on light reflected by the movable side glass scale to be received. That is, position coordinates of each axis can be obtained with nm precision by the fixed side encoder head.

Accordingly, an XY coordinate 59 and an apparatus coordinate origin 59o to be described later are provided such that stage coordinate system resolution and positional accuracy of the XYZ stage 9a of the second microscope 2, that is, the apparatus coordinate (XY coordinate) 59 and the apparatus coordinate origin 59o of the XYZ stage 9a of the second microscope 2 repeatedly coincide with each other with nm precision.

Thus, when the coordinate positions of the two reference points 6b and 6c of the sample stage 6 with respect to the apparatus coordinate (XY coordinate) 58 and the apparatus coordinate origin 58o of the XYZ stage 8a of the first microscope 1 and the coordinate positions of the two reference points 6b and 6c of the sample stage 6 with respect to the apparatus coordinate (XY coordinate) 59 and the apparatus coordinate origin 59o of the XYZ stage 9a of the second microscope 2 are made to coincide with each other with nm precision, and, in addition, when position control is performed such that the coordinate position of the first region extraction window 37 to the apparatus coordinate (XY coordinate) 58 and the apparatus coordinate origin 58o and the coordinate position of the second region extraction window 38 to the apparatus coordinate (XY coordinate) 59 and the apparatus coordinate origin 59o are made to coincide with each other with nm precision, the same observation position can be observed.

The first positioning control unit 9g drives and controls driving apparatuses 9xa, 9ya, and 9za, such as a motor of each stage, based on information of the linear scale 9b. That is, the first positioning control unit 9g allows, based on the information of the linear scale 9b, the X axis stage 9x, the Y axis stage 9y, and the Z axis stage 9z to be moved on the X axis, the Y axis and the Z axis orthogonal to one another by servo control with nm precision, for example, 10 nm resolution.

The second positioning apparatus 9 has a second positioning unit 29 for positioning and holding the sample stage 6, and after the second positioning unit 29 is located at a delivery position II, the second positioning apparatus 9 delivers the sample stage 6 between the second positioning unit 29 and the sample stage positioning and holding unit 25 of the conveying apparatus 5. An example of the second positioning apparatus 9 is an XYZ stage similar to the first positioning apparatus 8. In addition to the delivery position II where the sample stage 6 is delivered, the second positioning unit 29 can move to a second reference mark imaging reference position where a coordinate position is obtained and one or a plurality of second observation positions where observation is performed. In the present embodiment, the delivery position II and the second reference mark imaging reference position are examples of a second non-observation position. The second reference mark imaging reference position of the second positioning unit 29 is previously determined in the second positioning apparatus 9, and, for example, in order to simplify coordinate calculation, similarly to the first reference mark imaging reference position, the second reference mark imaging reference position may be determined at such a position where the Y axis is located in a middle of the two reference points 6b and 6c and the X axis crosses the sample placement region 6a.

Figure 19:
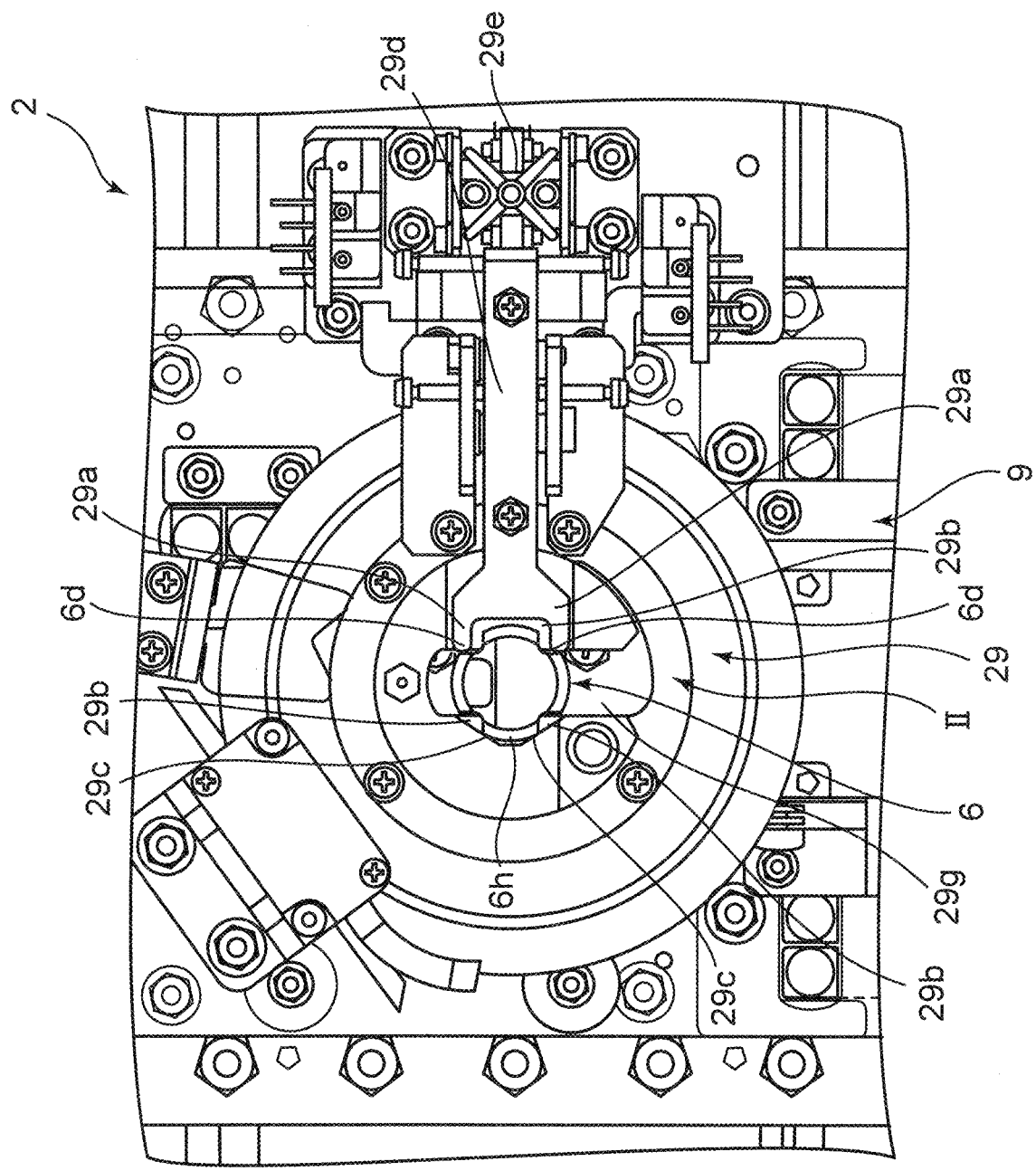
FIG. 19 is an enlarged plan view of a second positioning unit of the second positioning apparatus of the correlation microscope.

As shown in FIGS. 14 and 19, the second positioning unit 29 has a slide plate member 29d having a pair of positioning protrusions 29a at a C-shaped distal end, three bent locking surfaces 29c facing the distal end of the slide plate member 29d, a pair of supports 29b supporting back surfaces of a pair of ends of the sample stage 6, a slide plate driving apparatus 29e, and an opening 29g for carrying in and carrying out the sample stage according to the rotary conveying arm 67. The slide plate member 29d is reciprocally driven between a retreat position and an engagement position along a longitudinal axis direction by the slide plate driving apparatus 29e such as an ultrasonic motor or a shield type magnetic motor.

When the sample stage 6 is carried in by the lowering of the rotary conveying arm 67 holding the sample stage 6 with respect to the second positioning unit 29 at the delivery position II, the back surfaces of the pair of ends in a direction (left and right direction in FIG. 19) intersecting with a distal end axis direction of the rotary conveying arm 67 of the sample stage 6 are in a state of being supported by the pair of the supports 29b. In this state, when the slide plate member 29d moves from the retreat position to the engagement position in the direction (for example, the left direction in FIG. 19) intersecting with the distal end axis direction of the rotary conveying arm 67, the pair of positioning protrusions 29a are engaged with the pair of cutout portions 6d on one side of the sample stage 6 (the pair on the right side in FIG. 19), respectively, and the sample stage 6 can be pushed in the direction (the left direction in FIG. 19) intersecting with the distal end axis direction of the rotary conveying arm 67 by the slide plate member 29d. This pushing operation causes the flange portion 6h on the other side of the sample stage 6 to be pressed against the bent locking surface 29c to be locked. The three bent locking surfaces 29c are arranged line-symmetrically with respect to a center axis of the slide plate member 29d in a plan view, planarly arranged so as to constitute an upper base of an isosceles trapezoid and legs as a pair of oblique sides thereof, and constituted by an inclined surface inclined downward toward the direction (the left direction in FIG. 19) intersecting with the distal end axis direction of the rotary conveying arm 67 with respect to the vertical direction. Accordingly, when the sample stage 6 is pushed by the slide plate member 29d, the flange portion 6h of the sample stage 6 is pressed against the two locking surfaces 29c on both sides excluding the center among the bent locking surfaces 29c and thereby planarly centered by the two locking surfaces 29c, and the sample stage 6 is always positioned at a fixed position. Meanwhile, the flange portion 6h is pressed downward by the two locking surfaces 29c, so that at the time of pressing by the slide plate member 29d, it is possible to prevent the flange portion 6h from being bounced upward against the direction intersecting with the distal end axis direction of the rotary conveying arm 67.

Thus, when the sample stage 6 is delivered from the conveying arm 67 to the second positioning unit 29, the operation is as follows.

First, after the second positioning unit 29 is located at the delivery position II, the sample stage 6 in a state of being supported from below by the support stage portion 67c while being positioned by the first positioning pin 67b of the conveying arm 67 is rotated and moved together with the holding frame portion 67a to above the second positioning unit 29 by the rotary conveying and driving apparatus 68.

Then, the holding frame portion 67a of the rotary conveying arm 67 is lowered together with the sample stage 6 by the lifting and lowering apparatus 68e, and the holding frame portion 67a enters the opening 29g. The back surfaces of the pair of ends in the direction intersecting with the distal end axis direction of the rotary conveying arm 67 of the sample stage 6 are supported by the pair of supports 29b of the second positioning unit 29, and then the lowering by the lifting and lowering apparatus 68e is stopped.

Then, the slide plate member 29d of the second positioning unit 29 is moved from the retreat position to the engagement position by the slide plate driving apparatus 29e, so that the pair of positioning protrusions 29a are engaged with the pair of cutout portions 6d on one end side in the distal end axis direction of the rotary conveying arm 67, and the sample stage 6 is pushed by the slide plate member 29d. As a result, the flange portion 6h of the sample stage 6 on the other end side is pressed toward the locking surface 29c in the distal end axis direction of the rotary conveying arm 67 to be locked while being centered. In this state, the sample stage 6 is positioned and held between the locking surface 29c and the pair of positioning protrusions 29a.

Then, the conveying arm 67 is further lowered by the lifting and lowering apparatus 68e to release support of the sample stage 6 by the support stage portion 67c, and the holding frame portion 67a of the conveying arm 67 is rotated and moved in a direction where the holding frame portion 67a of the conveying arm 67 is away from the opening 29g of the second positioning unit 29, whereby the sample stage 6 can be delivered from the conveying arm 67 to the second positioning unit 29.

Thereafter, the second positioning unit 29 is first positioned to the second reference mark imaging reference position by the driving of the second positioning apparatus 9, and an image of the sample stage 6 at the second reference mark imaging reference position is obtained by the second image acquisition unit 42. Then, the second positioning unit 29 is moved to the second observation position, and observation is performed by the second microscope 2.

Conversely, when the sample stage 6 is delivered from the second positioning unit 29 to the conveying arm 67, the operation is as follows.

First, the second positioning unit 29 is moved to the sample stage delivery position II by the driving of the second positioning apparatus 9, and then the holding frame portion 67a of the conveying arm 67 is rotated and moved to below the second positioning unit 29.

Then, the holding frame portion 67a of the conveying arm 67 is lifted by the lifting and lowering apparatus 68e to be made enter the opening 29g, and the sample stage 6 is supported from below by the support stage portion 67c.

Then, the slide plate member 29d of the second positioning unit 29 is moved from the engagement position to the retreat position by the slide plate driving apparatus 29e to release engagement of the pair of positioning protrusions 29a from the pair of cutout portions 6d on one end side in the distal end axis direction of the rotary conveying arm 67.

Then, if the holding frame portion 67a is lifted together with the sample stage 6 by the lifting and lowering apparatus 68e, the sample stage 6 can be released from a positioning and holding state according to the second positioning unit 29.

Then, the sample stage 6 can be delivered from the second positioning unit 29 to the holding frame portion 67a by rotating and moving the conveying arm 67 such that the holding frame portion 67a of the conveying arm 67 retreats from the opening 29g of the second positioning unit 29 together with the sample stage 6 by the rotary conveying and driving apparatus 68.

The support stage portion 67c of the holding frame portion 67a of the conveying arm 67 supports front and rear ends in the direction intersecting with the distal end axis direction of the rotary conveying arm 67 of the back surface of the sample stage 6, while the support 29b of the second positioning unit 29 supports a pair of ends in the distal end axis direction of the rotary conveying arm 67; therefore, the support stage portion 67c and the support 29b do not bring into contact with each other, and the sample stage 6 can be smoothly delivered between the second positioning unit 29 and the holding frame portion 67a.

As an example, the second image acquisition unit 42 detects secondary electrons and the like, which are obtained by scanning and controlling an electron beam with respect to the sample stage 6 positioned by the second positioning unit 29, with a detection unit (not shown), converts the secondary electrons and the like into electric signals with an I-V amplifier (not shown), converts the electric signals by an A/D converter (not shown), and obtains an SEM image. When the second positioning unit 29 is positioned at the second reference mark imaging reference position, and when the second positioning unit 29 is positioned at one or a plurality of the second observation positions, the second image acquisition unit 42 further obtains images of the second region extraction window 38 corresponding to the first region extraction window 37 of the sample stage 6 based on the obtained image of the sample stage 6. The obtained images are stored in the storage unit 50. Here, the second region extraction window 38 has the same size as the first region extraction window 37 and is located at the same position as the first region extraction window 37 with respect to the sample stage 6. When the second positioning unit 29 is positioned at the second reference mark imaging reference position, the coordinate position of the second region extraction window 38 at the second reference mark imaging reference position is obtained by the second image acquisition unit 42.

The second coordinate acquisition unit 22 obtains a coordinate position of a second sample stage coordinate 32 of the sample stage 6 from the image of the sample stage 6, obtained by the second image acquisition unit 42, at the second reference mark imaging reference position. Specifically, in the second coordinate acquisition unit 22, similarly to the first coordinate acquisition unit 21, the positions of the two reference points 6b and 6c of the sample stage 6 are extracted from the image of the sample stage 6 at the second reference mark imaging reference position by pattern matching or the like, and the coordinate positions of the two reference points 6b and 6c extracted are obtained. The coordinate position here is the coordinate position of the apparatus coordinate 59 with respect to the apparatus coordinate origin 59o of the second positioning apparatus 9, as shown in FIG. 19. The apparatus coordinate 59 is constituted of an x axis 59x and a y axis 59y. Among the coordinate positions of the two reference points 6b and 6c, the coordinate position of the reference point (for example, a reference point on the leading end side in the carrying-in direction) 6b is set as an origin position 32o of the second sample stage coordinate 32, and a line 32x connecting the coordinate positions of the two reference points 6b and 6c is set as the x axis of the second sample stage coordinate 32. The axis passing through the origin position 32o of the second sample stage coordinate 32 and orthogonal to the x axis 32x of the second sample stage coordinate 32 becomes a y axis 32y of the second sample stage coordinate 32. In this manner, the second sample stage coordinate 32 can be defined by the origin position 32o, the x axis 32x, and the y axis 32y. The storage unit 50 stores information such as the obtained coordinate position of the second sample stage coordinate 32.

The second extraction window coordinate acquisition unit 24 obtains, from the storage unit 50, a difference between the coordinate position of the first sample stage coordinate 31, which is stored in the storage unit 50 and obtained by the first coordinate acquisition unit 21, and the coordinate position of the second sample stage coordinate 32 obtained by the second coordinate acquisition unit 22. At this time, a rotation angle θ formed by the x axis 31x of the first sample stage coordinate 31 and the x axis 32x of the second sample stage coordinate 32 is also obtained, and a rotation angle of the second sample stage coordinate 32 with respect to the first sample stage coordinate 31 constitutes a part of the difference. The coordinate position of the second sample stage coordinate 32 is corrected based on the obtained difference, and the corrected coordinate position of the second region extraction window 38 corresponding to the first region extraction window 37 is obtained. The obtained information is stored in the storage unit 50.

A feature portion storage unit 45 stores a plurality of feature portions 44 of the observation target tissue 35 in the image of the first region extraction window 37 obtained by the first image acquisition unit 41. Examples of the feature portion 44 include a partial outer shape, a whole shape, a concentration, and the like of the tissue 35 specified by a user. The extracted information is stored in the storage unit 50.

The image processing unit 46 creates a template 33 having the plurality of feature portions 44 stored in the feature portion storage unit 45, and based on this template 33, the image processing unit 46 performs pattern matching with the image of the second region extraction window 38 obtained by the second image acquisition unit 42. In the pattern matching, when it is decided that the template 33 coincides with a tissue 35b in the image of the second region extraction window 38, the result information is stored in the storage unit 50.

Based on the result of the pattern matching in the image processing unit 46, the image synthesis unit 47 superposes and synthesizes the image of the first region extraction window 37 and the image of the second region extraction window 38 with each other such that the observation target tissue 35 in the image of the first region extraction window 37 coincides with the tissue 35b in the image of the second region extraction window 38. The synthesized image information is stored in the storage unit 50.

If necessary, the operation control unit 49 displays the synthesized image on the monitor 4. In the displayed image, the shapes of portions become clear with fluorescent portions overlapped and synthesized. As a result, it is possible to clearly grasp the shape such as an outline of the tissue and at the same time to evaluate the functions of the tissues using the fluorescent portions.

As an example of the sample 7, the following sample 7 can be used.

Sample Preparation/Reference Example (Sample Preparation)
Immunostaining to the astrocyte which is a nervous tissue of rat was performed by the following procedure.
1) Immersion fixation was performed after reflux fixation by 0.1 M PB (Phosphate Buffer) containing 4% paraformaldehyde (3 hours).
2) Wash with 0.1 M PB containing 20% sucrose (4° C., overnight)
3) Nerve (spinal cord) tissue was divided into the small samples by the technique according to each use, such as a. cutting with razor, b. freeze fracture for SEM, c. vibratome section (with a thickness of 100 μm).
4) Wash with 0.1 M PB (5-minute×3 times)
5) Blocking by 0.1 M PBS (PBSTBF) containing 0.8% fish gelatin, 1% cow serum albumin and 0.2% Triton X-100 (room temperature, 1 hour).
6) The anti-glial fibrillary acidic protein (GFAP) mouse monoclonal antibody (1:20,000; Sigma) inPBSTBF (4° C., 14 hours).
As a control, only PBSTBF was incubated.
7) Wash with 0.1 M PB (5-minute×3 times)
8) Anti-mouse antibody labeled with biotin (1:400; Jackson Lab) in PBSTBF (room temperature, 90 minutes).
9) Wash with 0.1 M PB (5-minute×3 times)
10) Fluolid-labeled streptavidin in 10 mM HEPES, 0.15 M NaCl (pH 7.3), room temperature, 90 minutes AMCA (7-amino-4-methylcoumarine-3-acetic acid) labeled streptavidin (1:200; Jackson Lab) in PBSTBF, room temperature, 90 minutes.
However, dilution rate was changed depending on the production process of Fluolid.
11) Wash with 0.1 M PB (5-minute×3 times)

In this reference example and reference example below, Fluolid refers to the fluorescence dye described in International Publication WO 2008/013260.

Reference Example 3) c. Sample by Vibratome Section (Sample Preparation)
Immunostaining to the rat kidney (tubules) was performed by the following procedure.
1) After reflux fixation by 2.8% paraformaldehyde-0.2% picric acid-0.06% glutaraldehyde-0.1M PB, post fixation was performed with 4% paraformaldehyde in PB and stored at 4° C.
2) A sample was cut into 1 mm sections with a vibratome, and the sample was washed with PBS (0.01 M) (4° C., one day).
3) Biotinylated PeanutAgglutinin (PNA) (Vector) in PBS (1:100) (4° C., four days).
4) Wash with PBS (4° C., 20-minutes×3 times)
5) Adding fluorescence dye (4° C., one day) Streptavidin-Fluolid-W-Orange in PBS (1:10)
6) Wash with PBS (4° C., 20-minutes×3 times)
7) Dehydration with acetone (50-75-85-95-100% dehydration in ascending concentration order)
8) The labeled and dehydrated sample was embedded in hydrophilic plastic (Technovit 8100), and then a section having a thickness of about 2 μm was produced using a diamond knife for light microscopes and ultramicrotome.
9) The sample was placed on a plate made by dividing a Si substrate for wafer into approximately 3 mm square.
10) The substrate sample was subjected to ion etching, and a section sample was obtained. Ion etching (PIB-10, manufactured by Vacuum Device Co. Ltd.) was used, and a soft mode was performed for three minutes and a hard mode was performed for three minutes three times.
11) The sample was metallically coated by an osmium plasma coater (HCP1SW, manufactured by Vacuum Device Co. Ltd.) to 2.5 nm in thickness.

The sample stage introduction apparatus 69 has a pair of supports 69a with an opening 69b interposed therebetween and supports a pair of ends of the back surface of the sample stage 6. The sample stage positioning and holding unit 25 of the conveying arm 5b of the conveying apparatus 5 can be inserted in the opening 69b. A user sets the sample stage 6 to which the sample 7 is fixed on the sample stage introduction apparatus 69 such that the sample stage 6 is positioned and supported by the pair of supports 69a while the four cutout portions 6d of the sample stage 6 are used.

When the sample stage 6 is set in this way, the pair of supports 69a support the pair of ends of the back surface of the sample stage 6, and when the sample stage positioning and holding unit 25 moves to below the opening 69b and is lifted by the lifting and lowering apparatus 5d, while positioning is performed by the first positioning pin 25b and the second positioning pin 25d of the holding frame portion 25a of the sample stage positioning and holding unit 25, the end of the back surface of the sample stage 6 not supported by the pair of supports 69a is supported by the pair of support stage portions 25c. When the sample stage positioning and holding unit 25 is further lifted by the lifting and lowering apparatus 5d, the support by the pair of supports 69a is released, so that the sample stage 6 is held by the sample stage positioning and holding unit 25. Thereafter, conveyance is started for the first and second microscopes 1 and 2. Upon completion of the observation with the first and second microscopes 1 and 2, the sample stage 6 is returned to the sample stage introduction apparatus 69 by the conveying apparatus 5.

When the sample stage 6 is returned to the sample stage introduction apparatus 69, the sample stage 6 is located above the opening 69b together with the sample stage positioning and holding unit 25 and then lowers. Accordingly, the pair of ends of the back surface of the sample stage 6 are supported by the pair of supports 69a. When the sample stage 6 further lowers, the support by the pair of support stage portions 25c is released, and the sample stage 6 can be returned from the sample stage positioning and holding unit 25 to the sample stage introduction apparatus 69.

Hereinafter, the operation of the correlation microscope 10 according to the above configuration will be described. The following operations except for user's operation are all controlled by the operation control unit 49.

Figure 20:
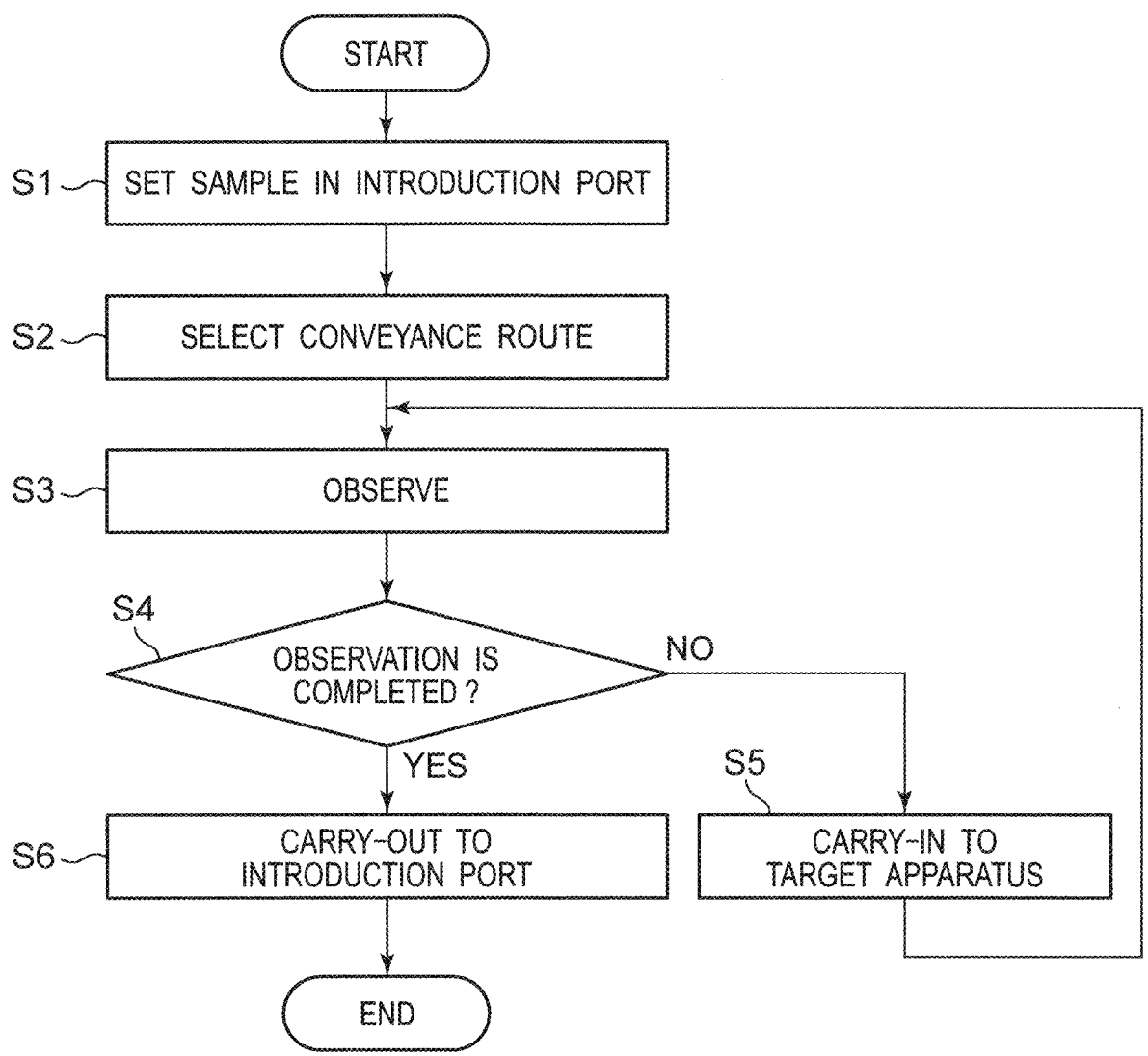
FIG. 20 is a flowchart of a conveying operation of the conveying apparatus of the correlation microscope.

First, a user sets the sample stage 6, on which the sample 7 is attached to the sample placement region 6a of the sample stage 6 with a double-sided tape or the like, on the sample stage introduction apparatus 69 (see step S1 in FIG. 20).

Then, the user selects a conveyance route based on the observation order of the first microscope 1 and the second microscope 2 and inputs the conveyance route to the operation control unit 49 with the input/output apparatus 48 (see step S2 in FIG. 20). In this case, as the conveyance route, either a first conveyance route from the first microscope 1 to the second microscope 2 or a second conveyance route from the second microscope 2 to the first microscope 1 is selected.

Then, the sample stage positioning and holding unit 25 of the conveying arm 5b of the conveying apparatus 5 takes out the sample stage 6 from the sample stage introduction apparatus 69, and the sample stage 6 moves toward the microscope based on the conveyance route. In this case, it is assumed that the sample stage 6 is first determined to be conveyed to the first microscope 1, and the sample stage 6 is conveyed toward the first microscope 1.

Then, the sample stage 6 held by the sample stage positioning and holding unit 25 of the conveying arm 5b of the conveying apparatus 5 is delivered to the first positioning unit 28 of the first positioning apparatus 8 of the first microscope 1. At this time, the first positioning unit 28 moves in advance to the delivery position I and is on standby. The sample stage positioning and holding unit 25 of the conveying apparatus 5 is located above the delivery position I of the first positioning unit 28 and then is lowered, and the sample stage 6 is delivered from the sample stage positioning and holding unit 25 of the conveying apparatus 5 to the first positioning unit 28 and then positioned and held by the first positioning unit 28. Thereafter, the sample stage positioning and holding unit 25 retreats from the first positioning apparatus 8.

Then, by the driving of the first positioning apparatus 8, the sample stage 6 positioned and held by the first positioning unit 28 is first positioned from the delivery position I to the first reference mark imaging reference position. Then, the image of the sample stage 6 positioned by the first positioning unit 28 is obtained by the first image acquisition unit 41, and the image of the first region extraction window 37 including the observation target tissue 35 of the sample 7 placed on the sample placement region 6a of the sample stage 6 is obtained. The obtained images are stored in the storage unit 50.

Thereafter, the first coordinate acquisition unit 21 obtains the coordinate position of the first sample stage coordinate 31 of the sample stage 6 from the image of the sample stage 6 obtained by the first image acquisition unit 41, and the obtained coordinate position of the first sample stage coordinate 31 of the sample stage 6 is stored in the storage unit 50.

Then, based on the positions of the four vertexes of the first region extraction window 37 designated by the user, the coordinate positions of the four vertexes of the first region extraction window 37 of the sample 7 on the sample stage 6 in the first sample stage coordinate 31 of the sample stage 6 at the first reference mark imaging reference position are obtained by the first extraction window coordinate acquisition unit 23 and stored in the storage unit 50.

After the operation of obtaining the coordinate position of the vertex of the first region extraction window 37 of the sample 7 or simultaneously with the operation of obtaining the coordinate position, the sample stage 6 positioned and held by the first positioning unit 28 is moved from the first reference mark imaging reference position to the first observation position desired by the user, by the driving of the first positioning apparatus 8, and then observation is performed by the first microscope 1 (see step S3 in FIG. 20). At the time of observation, the first image acquisition unit 41 obtains the image of the sample stage 6 positioned by the first positioning unit 28, and the image of the first region extraction window 37 including the observation target tissue 35 of the sample 7 placed on the sample placement region 6a of the sample stage 6 is obtained. The obtained images are stored in the storage unit 50. If necessary, a plurality of images is obtained. Observation and image acquisition are repeated for each different first observation position.

Then, after the observation by the first microscope 1 is completed, the sample stage 6 is conveyed toward the second microscope 2 (see steps S4 and S5 in FIG. 20). That is, first, the first positioning unit 28 moves to the delivery position I and stands by.

Then, the sample stage positioning and holding unit 25 is located below the delivery position I of the first positioning unit 28 by the driving of the conveying apparatus 5 and then lifted, and the sample stage 6 is delivered from the first positioning unit 28 to the sample stage positioning and holding unit 25 of the conveying apparatus 5 at the delivery position I of the first positioning unit 28, and then positioned and held by the sample stage positioning and holding unit 25.

Then, the sample stage positioning and holding unit 25 retreats from the first positioning apparatus 8 by the driving of the conveying apparatus 5.

Then, the sample stage positioning and holding unit 25 is moved to the load lock chamber 60a by the driving of the conveying apparatus 5, and after the first opening and closing door 64a on the atmosphere side of the load lock chamber 60a is opened by the first opening and closing apparatus 64, the sample stage positioning and holding unit 25 enters the load lock chamber 60a.

Then, in the load lock chamber 60a, the sample stage positioning and holding unit 25 supporting the sample stage 6 is positioned at the delivery position III, and then the conveying member 61 is moved from the retreat position to the delivery position III. Thereafter, the sample stage positioning and holding unit 25 is lowered, and the sample stage 6 is delivered from the sample stage positioning and holding unit 25 to the conveying member 61. Thereafter, the sample stage positioning and holding unit 25 is caused to retreat from the inside of the load lock chamber 60a.

Then, the first opening and closing door 64a on the atmosphere side of the load lock chamber 60a is closed by the first opening and closing apparatus 64, and then the vacuum suction apparatus 63 is driven to evacuate the inside of the load lock chamber 60*a*.

Then, the second opening and closing door 65*a* on the vacuum side of the load lock chamber 60*a* is opened, and after the holding frame portion 67*a* of the rotary conveying arm 67 enters the load lock chamber 60*a* from the inside of the vacuum chamber 2*a* of the second microscope 2 and is located at the delivery position III, the holding frame portion 67*a* of the rotary conveying arm 67 is lifted, and the sample stage 6 is delivered from the conveying member 61 at the delivery position III to the holding frame portion 67*a* of the rotary conveying arm 67.

Then, the conveying member 61 moves to the retreat position, and after the holding frame portion 67*a* of the rotary conveying arm 67 supporting the sample stage 6 is taken out from the load lock chamber 60*a*, the second opening and closing door 65*a* on the vacuum side is closed.

Then, the rotary conveying arm 67 supporting the sample stage 6 rotates in the vacuum chamber 2*a* of the second microscope 2, and the holding frame portion 67*a* of the rotary conveying arm 67 moves to the second positioning unit 29 of the second positioning apparatus 9.

Then, the sample stage 6 supported by the rotary conveying arm 67 is delivered to the second positioning unit 29 of the second positioning apparatus 9 of the second microscope 2. At this time, the second positioning unit 29 moves in advance to the delivery position II and is on standby. After the holding frame portion 67*a* of the rotary conveying arm 67 is located above the delivery position II of the second positioning unit 29, the holding frame portion 67*a* lowers and enters the opening 29*g*, and the sample stage 6 is delivered from the holding frame portion 67*a* to the second positioning unit 29 and then positioned and held by the second positioning unit 29. Thereafter, the holding frame portion 67*a* retreats from the second positioning apparatus 9.

Then, by the driving of the second positioning apparatus 9, the sample stage 6 positioned and held by the second positioning unit 29 is first positioned from the delivery position II to the second reference mark imaging reference position. Then, the image of the sample stage 6 positioned by the second positioning unit 29 is obtained by the second image acquisition unit 42, and the image of the second region extraction window 38 including the observation target tissue 35 of the sample 7 placed on the sample placement region 6*a* of the sample stage 6 is obtained. The obtained images are stored in the storage unit 50.

Thereafter, the second coordinate acquisition unit 22 obtains the coordinate position of the second sample stage coordinate 32 of the sample stage 6 from the image of the sample stage 6 at the second reference mark imaging reference position obtained by the second image acquisition unit 42, and the obtained coordinate position of the second sample stage coordinate 32 of the sample stage 6 is stored in the storage unit 50.

Then, it is assumed that the apparatus coordinate (XY coordinate) 58 and the apparatus coordinate origin 58*o* of the XYZ stage 8*a* of the first microscope 1 is the same as the apparatus coordinate (XY coordinate) 59 and the apparatus coordinate origin 59*o* of the XYZ stage 9*a* of the second microscope 2, the second extraction window coordinate acquisition unit 24 obtains, from the storage unit 50, a difference between the coordinate position of the first sample stage coordinate 31, which is stored in the storage unit 50 and obtained by the first coordinate acquisition unit 21, and the coordinate position of the second sample stage coordinate 32 obtained by the second coordinate acquisition unit 22. At this time, the rotation angle θ formed by the x axis 31*x* of the first sample stage coordinate 31 and the x axis 32*x* of the second sample stage coordinate 32 is also obtained. As a result, based on the difference between the coordinate position of the first sample stage coordinate 31 and the coordinate position of the second sample stage coordinate 32 as the obtained difference and the rotation angle of the second sample stage coordinate 32 with respect to the first sample stage coordinate 31, the coordinate position of the second sample stage coordinate 32 is corrected, and the coordinate of the second region extraction window 38 corresponding to the first region extraction window 37 is obtained by the second extraction window coordinate acquisition unit 24 and stored in the storage unit 50. Information on the difference is also stored in the storage unit 50.

Based on the information stored in the storage unit 50, the sample stage 6 positioned and held by the second positioning unit 29 is subjected to position control with nm precision by driving control of the second positioning control unit 9*g* of the second positioning apparatus 9, such that the second region extraction window 38 is located with respect to the apparatus coordinate 59 of the second positioning apparatus 9 at substantially the same position as the first region extraction window 37 with respect to the apparatus coordinate 58 of the first positioning apparatus 8 from the second reference mark imaging reference position. By the position control operation, the second region extraction window 38 automatically moves to a position very close to the first observation position observed by the first microscope 1. Accordingly, the user can easily perform observation using the second microscope 2 at the second observation position that is the same position as the first observation position observed by the first microscope 1 or a position very close to the first observation position observed by the first microscope 1 by nm order (see step S3 in FIG. 20). At the time of observation, the second image acquisition unit 42 obtains the image of the sample stage 6 positioned by the second positioning unit 29, and the image of the second region extraction window 38 including the observation target tissue 35 of the sample 7 placed on the sample placement region 6*a* of the sample stage 6 is obtained. The obtained images are stored in the storage unit 50. If necessary, a plurality of images is obtained. Observation and image acquisition are repeated for each different second observation position.

Then, after the observation by the second microscope 2 is completed, the sample stage 6 is conveyed toward the sample stage introduction apparatus 69 (see steps S4 and S6 in FIG. 20). That is, first, the second positioning unit 29 moves to the delivery position II and stands by.

Then, the holding frame portion 67*a* of the rotary conveying arm 67 enters the opening 29*g* and then is lifted, and the sample stage 6 is delivered from the second positioning unit 29 to the holding frame portion 67*a*. Thereafter, the rotary conveying arm 67 rotates, and the holding frame portion 67*a* of the rotary conveying arm 67 moves toward the load lock chamber 60*a*.

Then, after the second opening and closing door 65*a* on the vacuum side of the load lock chamber 60*a* is opened, the holding frame portion 67*a* is located at the delivery position III, and then the conveying member 61 is located from the retreat position to the delivery position III and supports the sample stage 6.

Then, after the holding frame portion 67*a* of the rotary conveying arm 67 is taken out from the load lock chamber 60*a*, the second opening and closing door 65*a* on the vacuum side is closed.

Then, the vacuum in the load lock chamber 60a is released to an atmospheric pressure, and then the first opening and closing door 64a on the atmosphere side of the load lock chamber 60a is opened by the first opening and closing apparatus 64.

Then, by the driving of the conveying apparatus 5, the sample stage positioning and holding unit 25 enters the load lock chamber 60a and is located at the delivery position III, and then the sample stage 6 is delivered from the conveying member 61 located at the delivery position III to the sample stage positioning and holding unit 25.

Then, by the driving of the conveying apparatus 5, the sample stage positioning and holding unit 25 supporting the sample stage 6 is taken out from the load lock chamber 60a, and then the first opening and closing door 64a is closed by the first opening and closing apparatus 64.

Then, by the driving of the conveying apparatus 5, the sample stage positioning and holding unit 25 supporting the sample stage 6 is moved to the sample stage introduction apparatus 69 and allows the sample stage introduction apparatus 69 to support the sample stage 6.

This completes the series of operations of the correlation microscope 10.

The images obtained as a result of the observation are subjected to processing as follows. This processing can be performed concurrently with the above operation.

First, the feature portion storage unit 45 stores a plurality of feature portions 44 of the observation target tissue 35 in the image of the first region extraction window 37 obtained by the first image acquisition unit 41 when the first positioning unit 28 is located at the first observation position. As an example, specifically, the user designates a plurality of features of the observation target tissue 35, such as a partial outer shape, a whole shape, or a concentration, using the input/output apparatus 48, whereby the plurality of feature portions 44 can be stored in the feature portion storage unit 45.

Then, the image processing unit 46 creates the template 33 having the plurality of feature portions 44 stored in the feature portion storage unit 45 (see FIG. 13). Based on the template 33, pattern matching is performed with the image of the second region extraction window 38 obtained by the second image acquisition unit 42 when the second positioning unit 29 is located at the second observation position, and the tissue 35b having the plurality of feature portions 44 is found. In the pattern matching, when it is decided that the template 33 coincides with a tissue 35b in the image of the second region extraction window 38, the result information is stored in the storage unit 50. If no coincidence is decided, the number of the feature portions 44 or the feature portions 44 themselves are reconsidered, and then, pattern matching is performed to obtain a decision that the template 33 coincides with the tissue 35b in the image of the second region extraction window 38.

Then, based on the coincidence decision result of the pattern matching in the image processing unit 46, the coordinate position of the first sample stage coordinate 31 obtained by the first coordinate acquisition unit 21, and the corrected coordinate position of the second region extraction window 38 obtained by the second extraction window coordinate acquisition unit 24, the image synthesis unit 47 superposes and synthesizes the image of the first region extraction window 37 and the image of the second region extraction window 38 with each other such that the observation target tissue 35 in the image of the first region extraction window 37 coincides with the tissue 35b in the image of the second region extraction window 38. The synthesized image information is stored in the storage unit 50.

Then, the synthesized image is displayed on the monitor 4.

Figure 21:
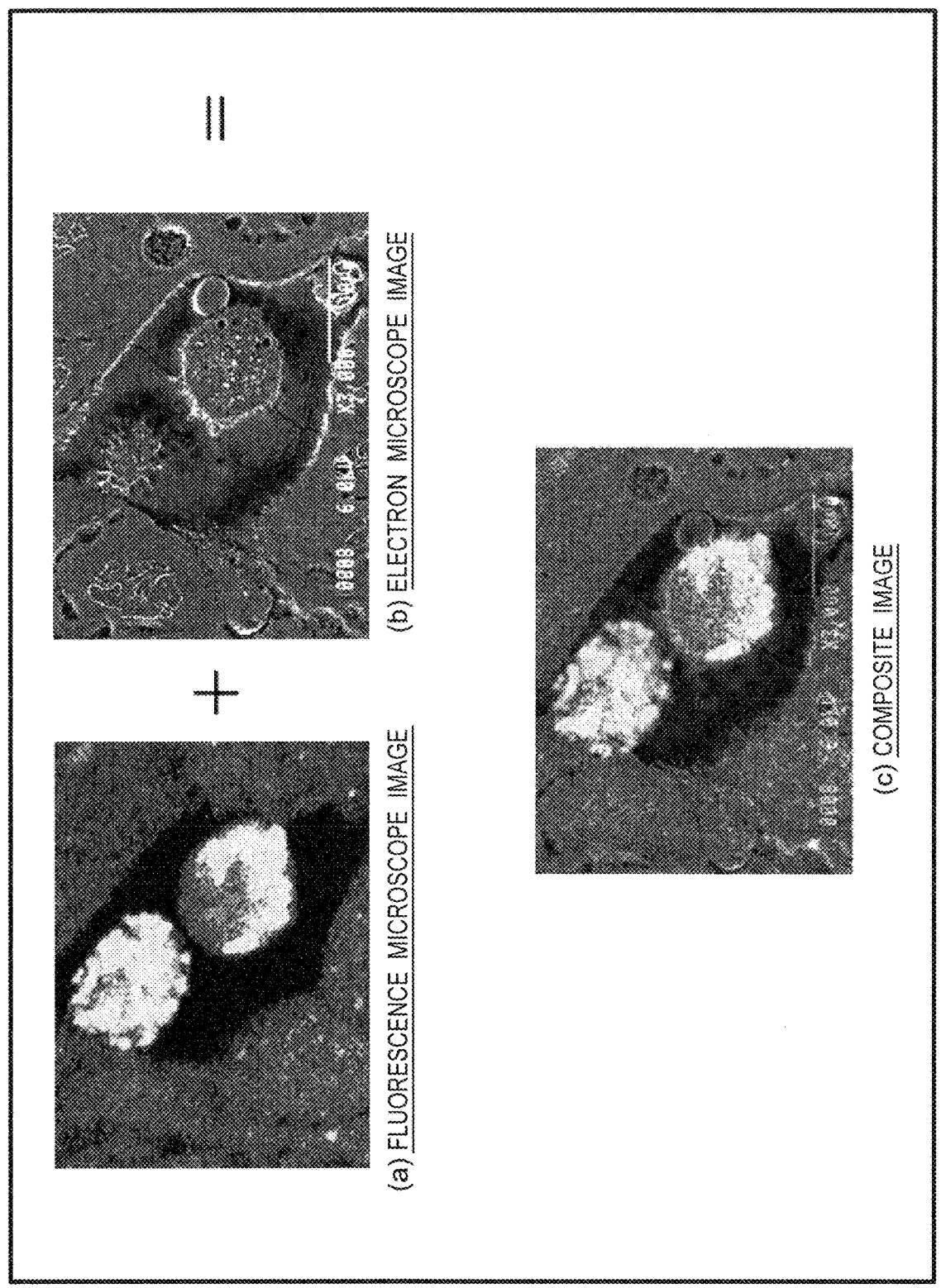
FIG. 21 is an explanatory view of images before and after synthesis according to a first example of a sample for the correlation microscope.

As a first example of the sample 7, FIG. 21 shows images before and after synthesis. In FIG. 21, (a) is an image of the first region extraction window 37 obtained by the first image acquisition unit 41 through a fluorescence microscope. (b) is an image of the second region extraction window 38 obtained by the second image acquisition unit 42 through an electron microscope. (c) is a synthetic image obtained by synthesizing the image of (a) and the image of (b). In the image of (a) obtained by the fluorescence microscope, a white portion is a portion of a biological tissue labeled with a fluorescent dye. In the image of (b) obtained by the electron microscope, the outline of the tissue can be clearly grasped. In the synthetic image of (c) obtained by synthesizing the images of (a) and (b), a fluorescent portion can be clearly grasped in the tissue whose outline can be clearly grasped.

Figure 22:
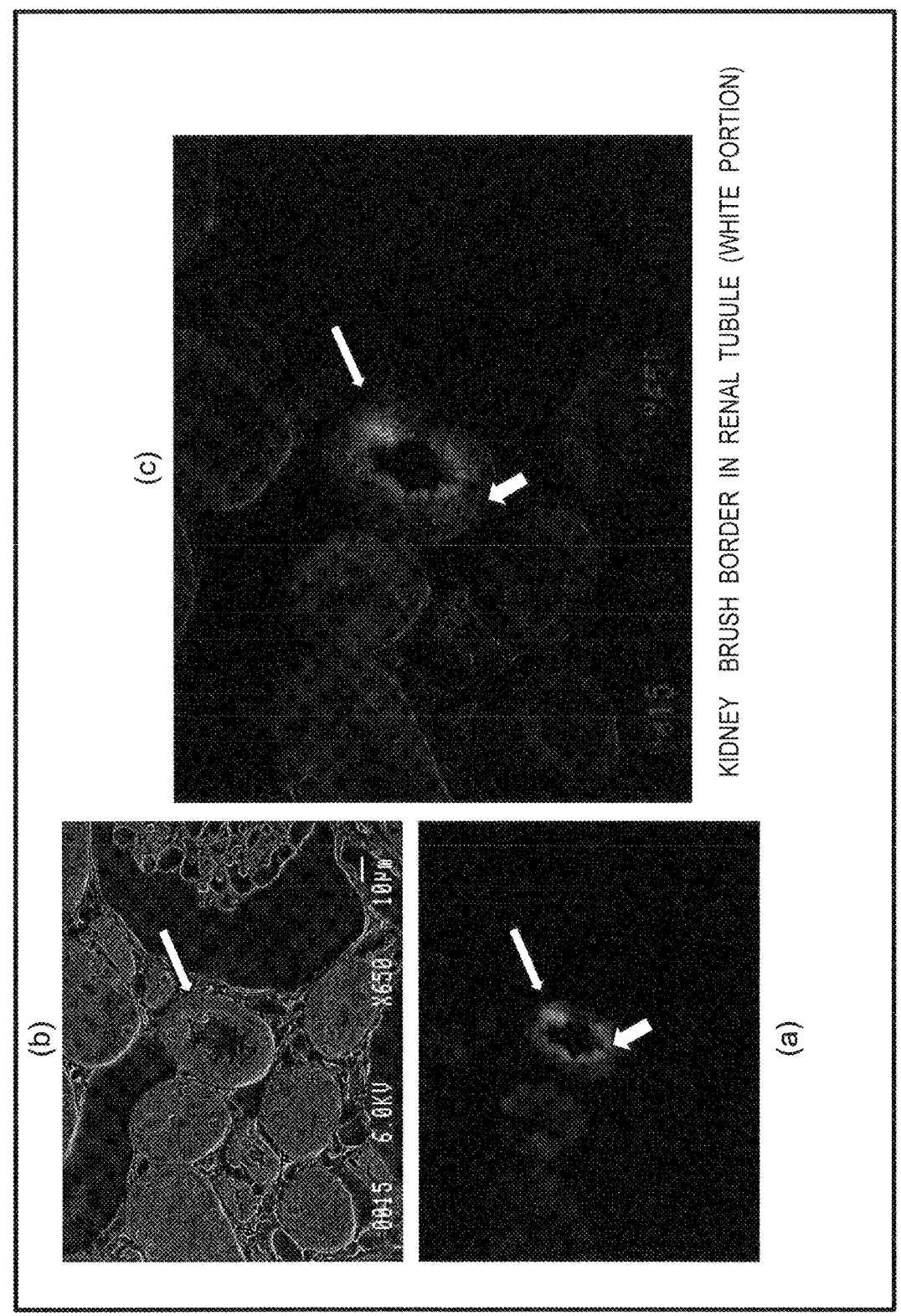
FIG. 22 is an explanatory view of images before and after synthesis according to a second example of a sample for the correlation microscope.

As a second example of the sample 7, FIG. 22 shows images of a tissue of the kidney renal tubule before and after synthesis. In FIG. 22, (a) is an image of the first region extraction window 37 obtained by the first image acquisition unit 41 through a fluorescence microscope. (b) is an image of the second region extraction window 38 obtained by the second image acquisition unit 42 through an electron microscope. (c) is a synthetic image obtained by synthesizing the image of (a) and the image of (b). In the image of (a) obtained by the fluorescence microscope, a white portion is a portion of a biological tissue labeled with a fluorescent dye. In particular, a portion indicated by the thick and short white arrow is a portion of a biological tissue labeled with a fluorescent dye (the brush border in the kidney renal tubule). The thin and long white arrow indicates the same tissue in each figure. In the image of (b) obtained by the electron microscope, the outline of the tissue can be clearly grasped. In the synthetic image of (c) obtained by synthesizing the images of (a) and (b), a fluorescent portion can be clearly grasped in the tissue whose outline can be clearly grasped.

Figure 23:
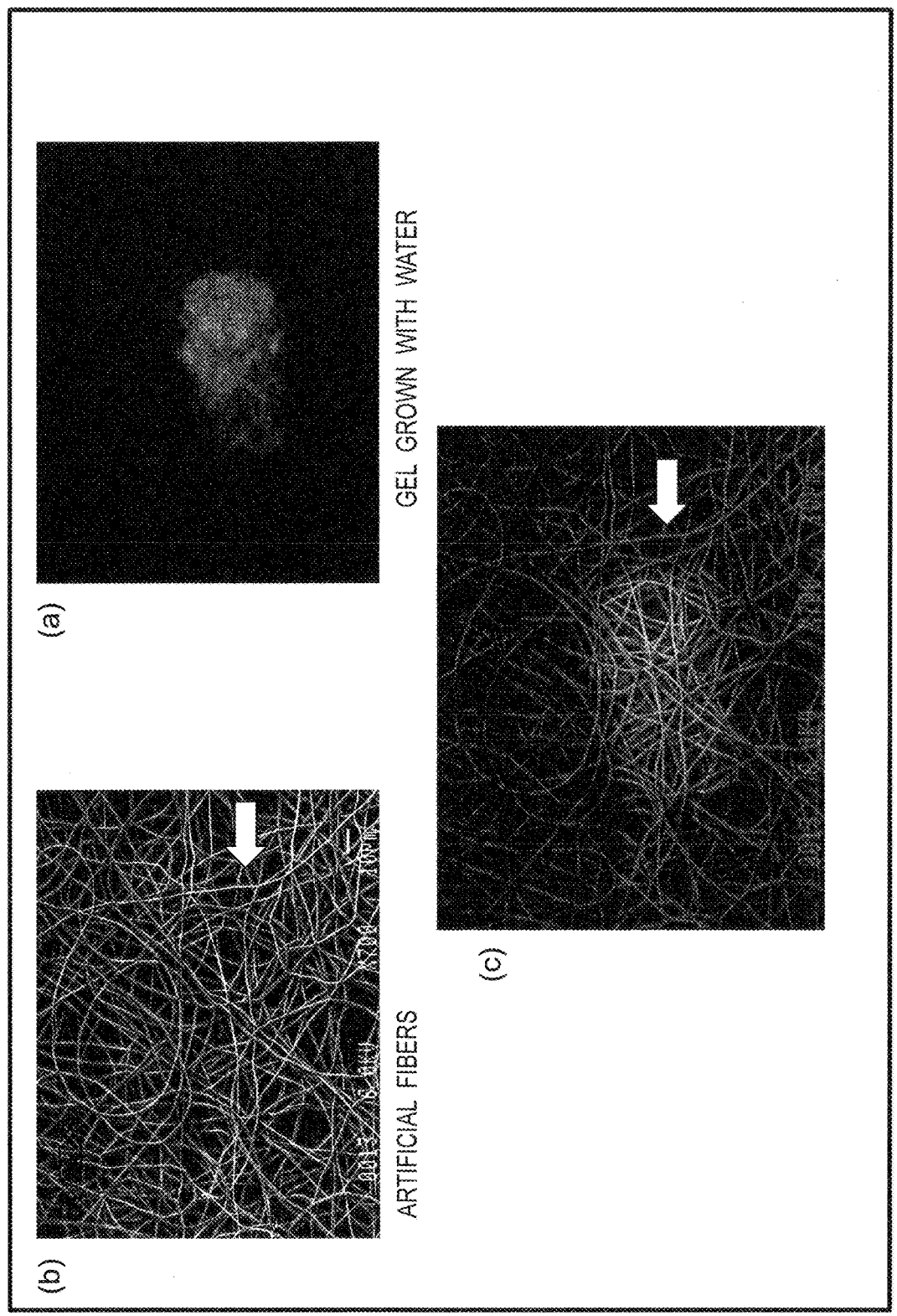
FIG. 23 is an explanatory view of images before and after synthesis according to a third example of a sample for the correlation microscope.

As a third example of the sample 7, FIG. 23 shows images of artificial fibers and gel before and after synthesis. In FIG. 23, (a) is an image of the first region extraction window 37 obtained by the first image acquisition unit 41 through a fluorescence microscope. (b) is an image of the second region extraction window 38 obtained by the second image acquisition unit 42 through an electron microscope. (c) is a synthetic image obtained by synthesizing the image of (a) and the image of (b). In the image of (a) obtained by the fluorescence microscope, a white portion shows a gel grown with water. However, the relationship with the artificial fibers is unclear since the artificial fibers are not shown. In the image of (b) obtained by the electron microscope, although the artificial fibers can be clearly grasped, the gel grown with water cannot be grasped at all. In the synthetic image of (c), both the artificial fibers and the gel grown with water can be clearly grasped, and it is understood which part of the artificial fibers the gel grown with water exists. In particular, a portion indicated by the white arrow is the gel grown with water. In (b), even if the same place is indicated by a white arrow, it is not understood at all.

Figure 24:
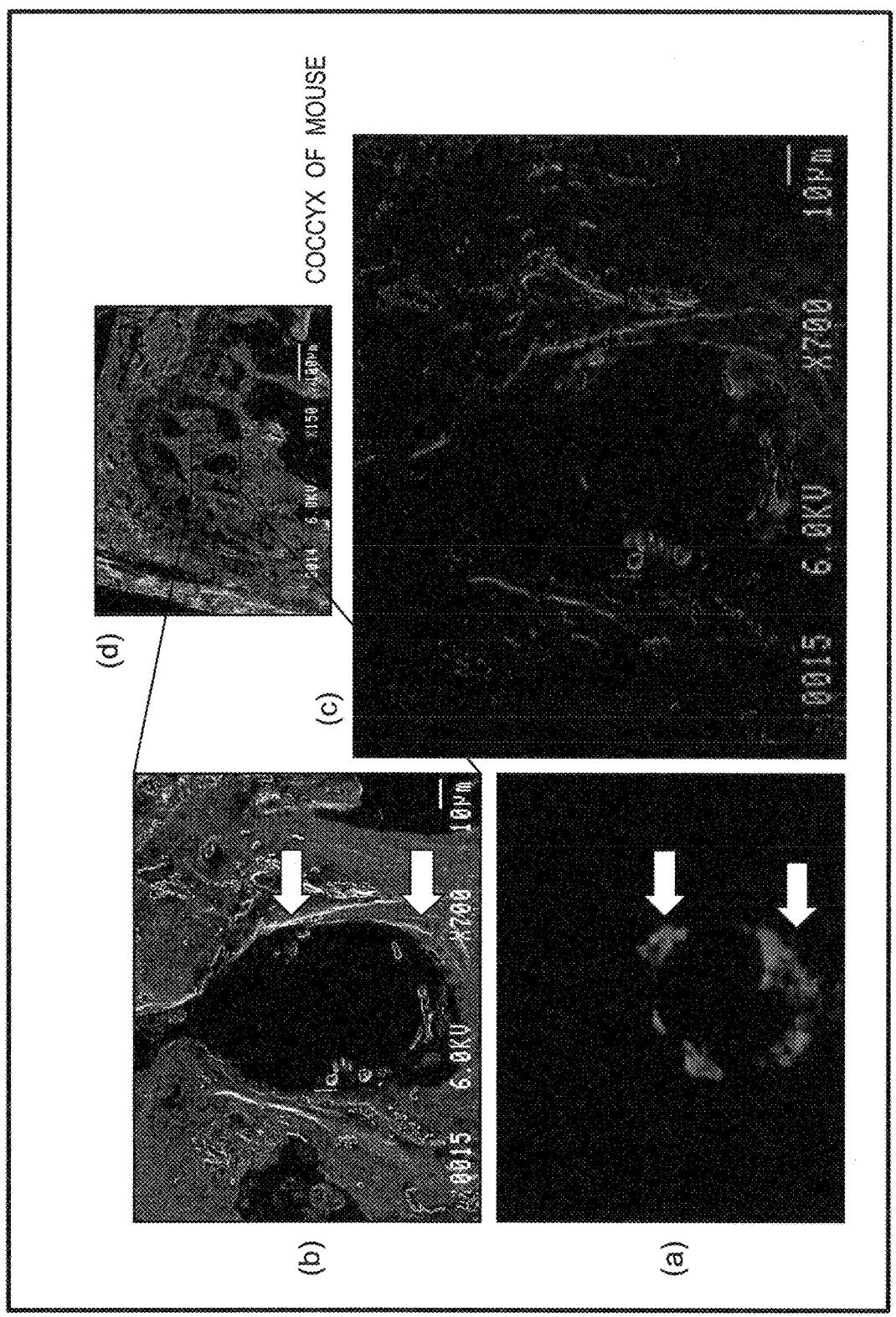
FIG. 24 is an explanatory view of images before and after synthesis according to a fourth example of a sample for the correlation microscope.

As a fourth example of the sample 7, FIG. 24 shows images of a coccygeal tissue of a mouse before and after synthesis. In FIG. 24, (a) is an image of the first region extraction window 37 obtained by the first image acquisition unit 41 through a fluorescence microscope. (b) is an image of the second region extraction window 38 obtained by the second image acquisition unit 42 through an electron microscope. (c) is a synthetic image obtained by synthesizing the image of (a) and the image of (b). In the image of (a) obtained by the fluorescence microscope, a white portion indicated by the white arrow is a portion of a biological tissue labeled with a fluorescent dye. In the image of (b) obtained by the electron microscope, although the outline of the tissue can be clearly grasped, the biological tissue labeled with the fluorescent dye is completely unknown. In the synthetic image of (c) obtained by synthesizing the images of (a) and (b), a fluorescent portion can be clearly grasped in the tissue whose outline can be clearly grasped. (d) is an image obtained by the electron microscope before enlargement.

According to the above embodiment, the first region extraction window 37 including the image of the same sample stage 6 and the observation target tissue 35 of the sample 7 at the time when the sample stage 6 is positioned by the two microscopes 1 and 2, the first sample stage coordinate 31, the second sample stage coordinate 32, and the second region extraction window 38 are obtained, respectively, the second sample stage coordinate 32 is corrected based on a difference between the first sample stage coordinate 31 and the second sample stage coordinate 32, and the corrected coordinate position of the second region extraction window 38 is obtained. The second positioning apparatus 9 moves the second positioning unit 29 from the second non-observation position to the second observation position where the second region extraction window 38 is located at the position corresponding to the coordinate position of the first region extraction window 37 based on the corrected coordinate position. As a result, observation at the same position can be performed with high accuracy.

Pattern matching is performed with respect to the second region extraction window image corresponding to the first region extraction window image, and it is possible to form a synthetic image in which the first region extraction window image and the second region extraction window image are superimposed on each other. As a result, a synthesis image at the same position can be obtained and observed with high accuracy.

That is, according to the above embodiment, the following excellent effects can be provided.

By observing the fluorescently labeled sample 7 with an optical microscope at an observation magnification of, for example, about several hundred times, functional information can be obtained, and when further observation with a high magnification is performed for a desired sample region using a scanning electron microscope, morphology information can be obtained. An accurately synthesized image including both of these pieces of information can be generated. As a result, it is possible to clearly specify the morphology and the function in completely identical tissues (such as a cell, an organ and a portion of a cell or organ). That is, it is possible to provide a correlation microscope capable of performing observation at the same position with high accuracy (that is, nm precision).

In general, there are many similar cells in the sample 7, and these cells often include the cells 35 each of which is one example of the observation target tissue and cells 35h (see FIG. 13) that are very similar due to deformation. For example, every time observation target cells are observed, the cells might be different from each other, and there are cases where several thousands of cells 35h similar to one cell 35 to be observed are included. Because of a biological tissue, cells may be deformed in the course of observation, and cells that are not to be observed may be deformed so as to be very similar to cells to be observed. Thus, in the entire image of the sample 7, mere pattern matching may result in extraction of incorrect several thousands of cells.

Figure 25:
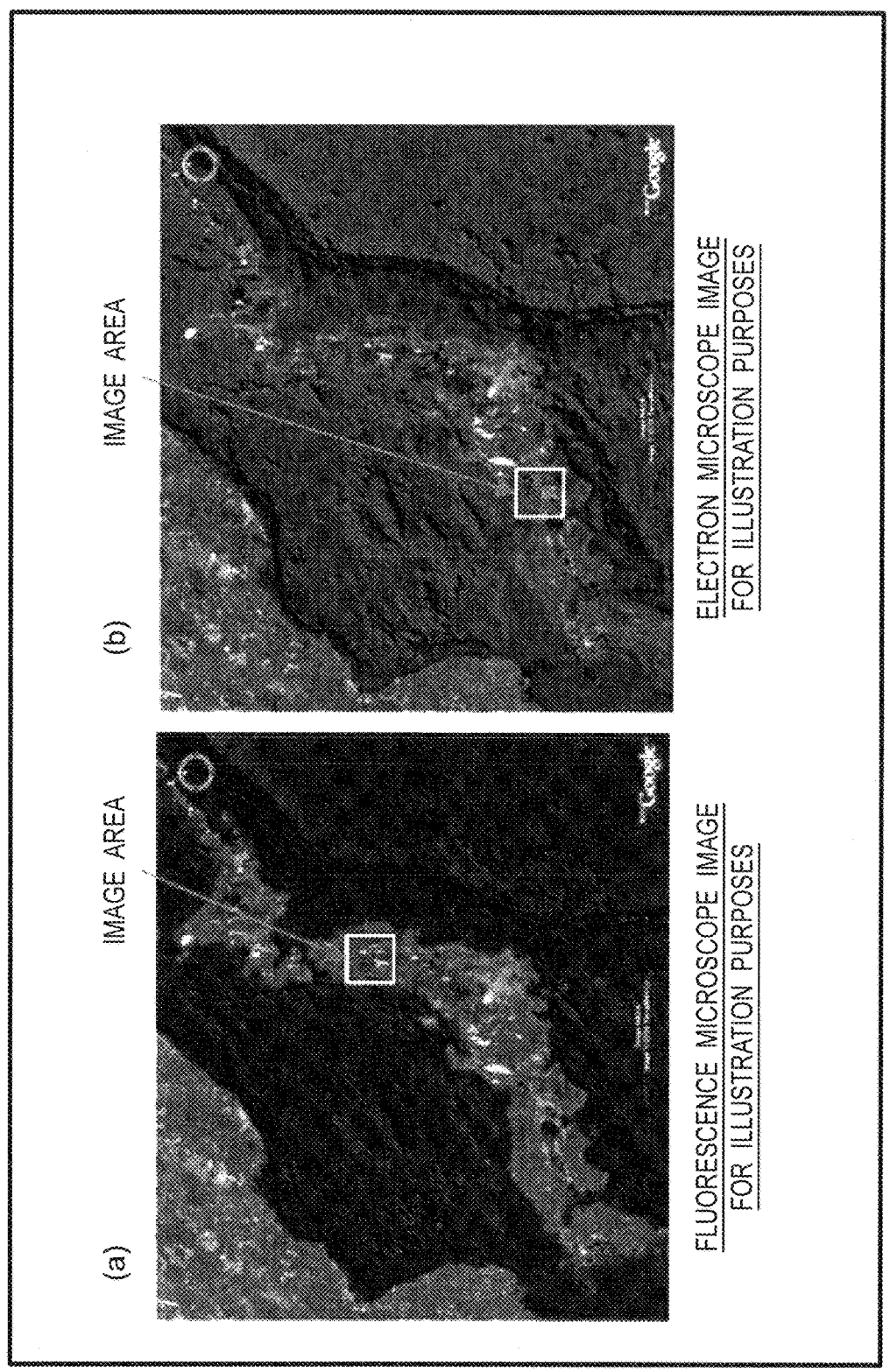
FIG. 25 is an explanatory view for explaining a state of alignment between two conventional microscopes.
Figure 26:
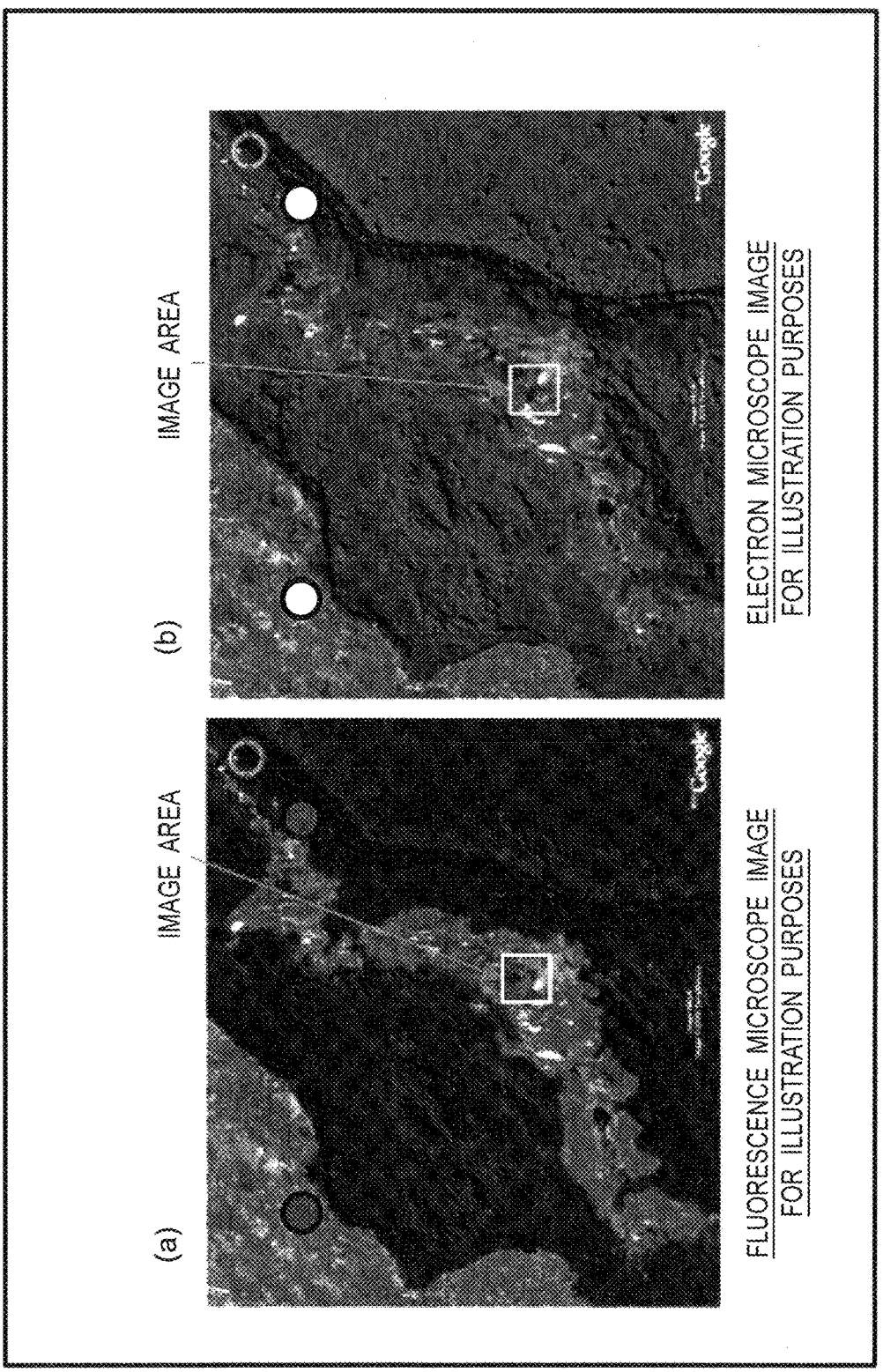
FIG. 26 is an explanatory view for explaining a state of alignment in the correlation microscope according to the embodiment.

As shown in FIG. 25, when the accuracy of the alignment of the coordinates between the two positioning apparatuses is poor, an image area when viewed with a fluorescence microscope in (a) and an image area when viewed with an electron microscope in (b) are located at completely different locations, and it is unclear which position of the sample 7 is being observed. On the other hand, in the present embodiment, when the accuracy of the alignment of the coordinates between the two positioning apparatuses 8 and 9 is very good, the image area when viewed with the fluorescence microscope in (a) and the image area when viewed with the electron microscope in (b) coincide with each other at a nano order level, and the same observation can be performed.

That is, in the above embodiment, the positional relationship between coordinates can be precisely aligned on the submicron order. In addition, not the entire image of the sample 7, but the observation target tissue 35 in the small extraction windows 37 and 38 set in advance in the sample 7 is designated, and the plurality of feature portions 44 are extracted from the designated tissue 35. Pattern matching is performed in the extraction windows 37 and 38 based on the extracted plurality of feature portions 44, whereby an issue that several thousands of cells are incorrectly extracted is solved.

In addition, by performing the extraction operation with high accuracy in this way, it is possible to obtain such a synthesis image that allows grasp of a fluorescence state inside or outside of one cell, that is, functional information and to clearly distinguish, for example, different effects of a reagent on the inside and outside of the cell (see FIG. 22).

On the other hand, conventionally, it was not possible to compare tissues or the like at the same position, samples for electron microscope and samples for optical microscope were separately prepared from cells similar to one another, and after each sample was observed, both observation results were compared and considered. In this case, it is troublesome to prepare each sample, and since these samples are not 100% identical cells or portions of cells, it has been pointed out that this lacks in certainty.

The present embodiment has an excellent effect that can solve all these issues.

The present invention is not limited to the above-described embodiment, and can be implemented in various other modes.

For example, as indicated by one-dot chain lines in FIGS. 1 and 2, the entire correlation microscope 10 may be disposed in a dark room 55 of a clean room. The whole of the correlation microscope 10 other than the monitor 4 may be disposed in the dark room 55 of the clean room, and an opening and closing door 55a for setting the sample stages 6 on the sample stage introduction apparatus 69 may be provided. With this configuration, it is possible to convey the sample stages without at all exposing the sample stages to a general environment through the dark room 55.

Although the sample stage 6 has the curved cutout portions 6d, . . . , 6d provided at every 90 degrees at the peripheral four corners, the present invention is not limited thereto. For example, the sample stage 6 may have the cutout portions 6d at three or five or more places.

In the present embodiment, the delivery position I and the first reference mark imaging reference position are examples of the first non-observation position of the first positioning unit 28, and the delivery position II and the second reference mark imaging reference position are examples of the second non-observation position of the second positioning unit 29; however, the present invention is not limited thereto. The delivery position I and the first reference mark imaging reference position may be one position, and the one position may be an example of the first non-observation position of the first positioning unit 28. Further, the delivery position II and the second reference mark imaging reference position may be one position, and the one position may be an example of the second non-observation position of the second positioning unit 29.

Figure 27A:
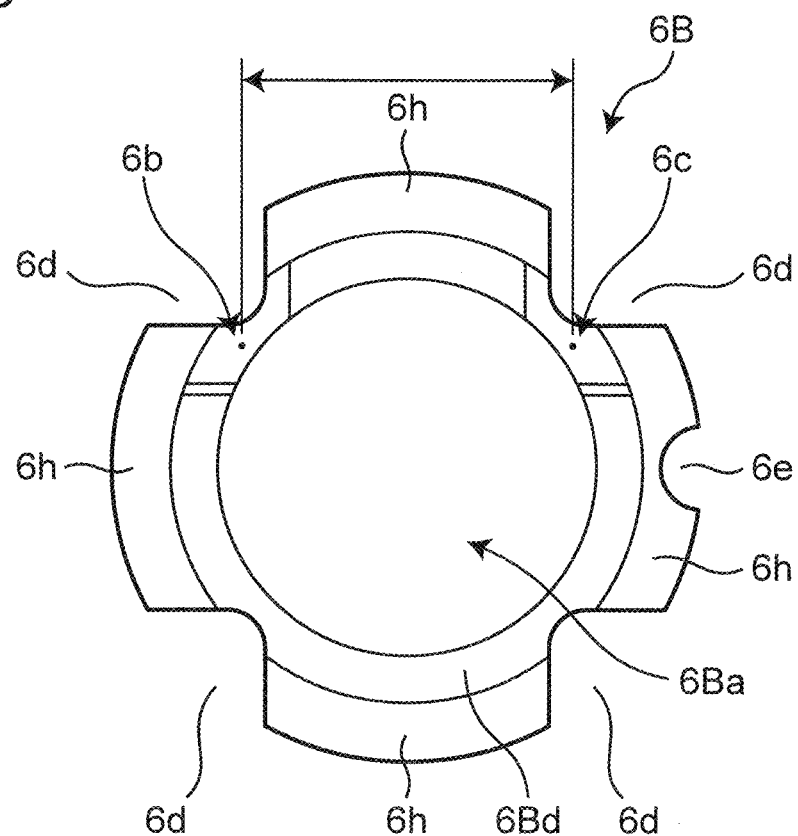
FIG. 27A is a plan view of a sample stage of a correlation microscope according to a modification of the embodiment.
Figure 27B:
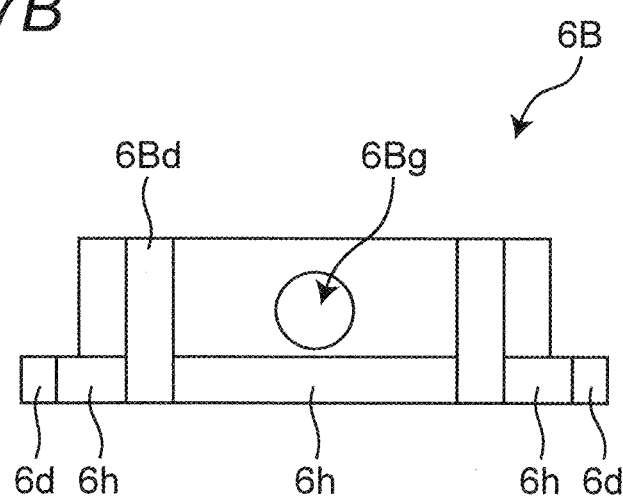
FIG. 27B is a front view of the sample stage of the correlation microscope according to the modification of the embodiment.
Figure 27C:
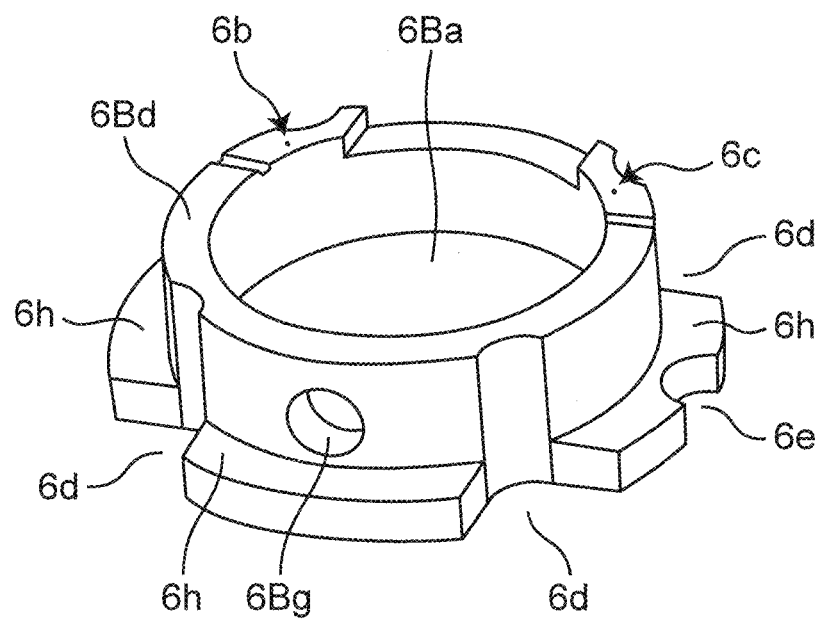
FIG. 27C is a perspective view of the sample stage of the correlation microscope according to the modification of the embodiment.
Figure 27D:
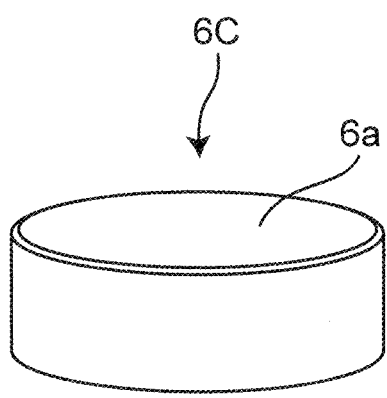
FIG. 27D is a perspective view of a standard sample stage insertable into the sample stage of the correlation microscope according to the modification of the embodiment.
Figure 27E:
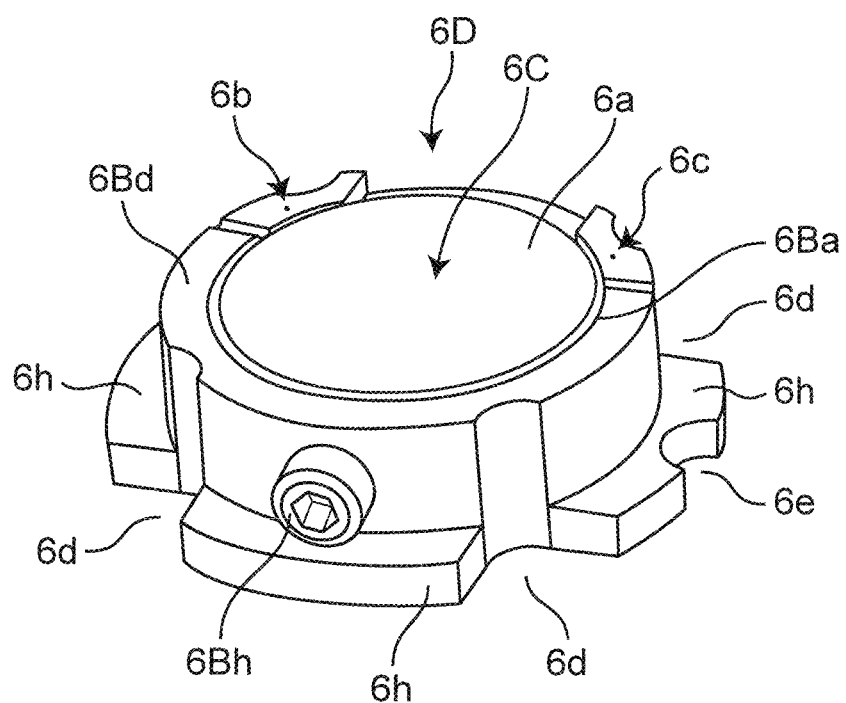
FIG. 27E is a perspective view in a state where the standard sample stage is inserted into the sample stage of the correlation microscope according to the modification of the embodiment.

The sample stage may not be constituted of a single member, and as a modification of the above embodiment, the sample stage may be constituted of a plurality of members as follows. That is, FIGS. 27A to 27C are respectively a plan view, a front view, and a perspective view of a sample stage 6D of a correlation microscope according to the modification of the embodiment. FIG. 27D is a perspective view of a sample placement stage 6C as an example of a standard sample stage that can be inserted in a sample stage frame body 6B of the sample stage 6D. FIG. 27E is a perspective view in a state where the sample placement stage 6C is inserted in the sample stage frame body 6B of the sample stage 6D. Since a bottom view of the sample stage frame body 6B is the same as the bottom view of the sample stage 6 of the correlation microscope in FIG. 5B, illustration is omitted.

The sample stage 6D is constituted of the sample stage frame body 6B and the sample placement stage 6C.

In the sample stage frame body 6B, although the outer shapes of the cutout portions 6d, the cutouts 6e, the flange portion 6h, and the like are similar to those of the sample stage 6 in FIG. 5A, the sample stage frame body 6B is different from the sample stage 6 in that a bottomed circular recess 6Ba surrounded by a substantially cylindrical side wall 6Bd is provided in a sample placement region.

The sample placement stage 6C is a cylindrical body detachably inserted into the circular recess 6Ba of the sample stage frame body 6B and has on its upper surface the circular sample placement region 6a on which a biological tissue is placed as the sample 7. In the sample placement region 6a, the biological sample 7 including the observation target tissue 35 can be fixed with a double-sided adhesive tape or the like. The height of the sample placement region 6a is the same as the height of the side wall 6Bd or slightly higher than the height of the side wall 6Bd.

The side wall 6Bd has at one point thereof a screw hole 6Bg penetrating therethrough, so that a screw 6Bh can be screwed into the screw hole 6Bg. Thus, after the sample placement stage 6C is inserted into the circular recess 6Ba, the screw 6Bh is screwed to lock the sample placement stage 6C, whereby the sample placement stage 6C is fixed in the circular recess 6Ba.

One or a plurality of cutouts extending downward from an upper end surface of the side wall 6Bd are formed in the side wall 6Bd to allow tweezers or the like to be inserted into the cutout, so that the sample placement stage 6C may be easily attached and detached to and from the circular recess 6Ba.

When the sample stage 6D is constituted of a plurality of members including the sample placement stage 6C as an example of a standard sample stage and the sample stage frame body 6B in this way, it is possible to use a standard sample stage which is widely used, and the sample stage can be made versatile. Thus, when a plurality of samples are observed, a plurality of the special sample stages 6 are not required to be prepared in advance, only the plurality of sample placement stages 6C as an example of a standard sample stage may be prepared, and only the sample placement stage 6C may be exchanged with respect to the sample stage frame body 6B, so that the sample stage 6D can be made more convenient.

As a result, a user can select any one of the dedicated sample stage 6 according to the previous embodiment and the sample stage 6D according to the modification in which a standard sample stage can be used, and the selected sample stage can be used for the correlation microscope.

It is to be noted that, by appropriately combining any embodiment and modification out of the above-described various embodiments or modifications, their respective effects can be exhibited. Additionally, combination between embodiments, combination between work examples, or combination between an embodiment(s) and a work example(s) is possible, and combination between characteristics in different embodiments or work examples is possible as well.

INDUSTRIAL APPLICABILITY

The correlation microscope according to the present invention can perform observation at the same position with high accuracy in both a confocal laser microscope and a scanning electron microscope and is useful as a correlation microscope or the like used in development of fluorescent reagents and the like.

REFERENCE SIGNS LIST

1. Laser microscope
2. Electron microscope
2a. Vacuum chamber
3. Anti-vibration base
4. Monitor
5. Conveying apparatus
5a. Rotating apparatus
5b. Conveying arm
5c. Reciprocating apparatus
5d. Lifting and lowering apparatus
6. Sample stage
6B. Sample stage frame body
6Ba. Circular recess
6Bd. Side wall
6Bg. Screw hole
6Bh. Screw
6C. Sample placement stage
6D. Sample stage
6a. Sample placement region
6b, 6c. Two reference points (circular recesses)
6d. Cutout portion
6e. Positioning cutout
6f. Positioning recess
6h. Flange portion (for preventing upward inclination)
7. Sample
8. First positioning apparatus
8a. XYZ stage
8b. Linear scale
8g. First positioning control unit
9. Second positioning apparatus
9a. XYZ stage
9b. Linear scale
9g. Second positioning control unit
10. Correlation microscope
11. Control unit 21. First coordinate acquisition unit
22. Second coordinate acquisition unit
23. First extraction window coordinate acquisition unit
24. Second extraction window coordinate acquisition unit
25. Sample stage positioning and holding unit
25a. Holding frame portion
25b. First positioning pin
25c. Support stage portion
25d. Second positioning pin
28. First positioning unit
28a. Positioning protrusion
28b, 28c. Support
28d. Locking portion
28e. Lever
28f. Support shaft
28g. Opening
28h. Locking portion driving apparatus
29. Second positioning unit
29a. Positioning protrusion
29b. Support
29c. Locking surface
29d. Slide plate member
29e. Slide plate driving apparatus
29g. Opening
31. First sample stage coordinate
31o. Origin position of first sample stage coordinate
31x. x axis of first sample stage coordinate
31y. y axis of first sample stage coordinate
32. Second sample stage coordinate
32o. Origin position of second sample stage coordinate
32x. x axis of second sample stage coordinate
32y. y axis of second sample stage coordinate
33. Template
35. Observation target tissue of sample
35a. Observation target tissue in second region extraction window
37. First region extraction window
38. Second region extraction window
41. First image acquisition unit
42. Second image acquisition unit
44. Feature portion
45. Feature portion storage unit
46. Image processing unit
47. Image synthesis unit
48. Input/output apparatus
49. Operation control unit
50. Storage unit
55. Dark room
55a. Opening and closing door
58. Apparatus coordinate of first positioning apparatus
58o. Apparatus coordinate origin
58x. x axis of apparatus coordinate
58y. y axis of apparatus coordinate
59. Apparatus coordinate of second positioning apparatus
59o. Apparatus coordinate origin
59x. x axis of apparatus coordinate
59y. y axis of apparatus coordinate
60. Load lock chamber unit
60a. Load lock chamber
61. Conveying member
61a. Bifurcated portion
61b. First positioning pin
62. Conveying member driving apparatus
63. Vacuum suction apparatus
64. First opening and closing apparatus
64a. First opening and closing door
65. Second opening and closing apparatus
65a. Second opening and closing door
66. Rotary conveying apparatus
67. Rotary conveying arm
67a. Holding frame portion
67b. First positioning pin
67c. Support stage portion
68. Rotary conveying and driving apparatus
68a. Motor
68b. Worm
68c. Gear
68d. Rotation shaft
68e. Lifting and lowering apparatus
69. Sample stage introduction apparatus
69a. Support
69b. Opening
70. Extraction window setting unit

The invention claimed is:

1. A correlation microscope comprising:
a first microscope;
a second microscope having an optical axis non coaxial with the first microscope;
a conveying apparatus that conveys a sample stage holding a sample from the first microscope to the second microscope in a state where the sample stage is positioned and held by a sample stage positioning and holding device;
a first positioning apparatus that is disposed in the first microscope, that has a first positioning device movable between at least a first observation position and a first non-observation position and positioning and holding the sample stage, and that delivers the sample stage between the first positioning device and the sample stage positioning and holding device of the conveying apparatus when the first positioning device is located at the first non-observation position;
a controller that
obtains an image of the sample stage positioned by the first positioning device when the first positioning device is located at each of the first observation position and the first non-observation position, and that obtains an image of a first region extraction window including an observation target tissue of the sample on the sample stage,
obtains a coordinate position of a first sample stage coordinate of the sample stage positioned by the first positioning device based on the image of the sample stage positioned by the first positioning device when the first positioning device is located at the first non-observation position,
obtains a coordinate position of the first region extraction window in the first sample stage coordinate based on the image of the first region extraction window when the first positioning device is located at the first non-observation position and the coordinate position of the first sample stage coordinate of the sample stage; and
a second positioning apparatus that is disposed in the second microscope, that has a second positioning device movable between at least a second observation position and a second non-observation position and positioning and holding the sample stage, and that delivers the sample stage between the second positioning device and the sample stage positioning and holding device of the conveying apparatus when the second positioning device is located at the second non-observation position,
wherein the controller further obtains an image of the sample stage positioned by the second positioning device when the second positioning device is located at each of the second observation position and the second non-observation position and that obtains an image of a second region extraction window corresponding to the first region extraction window of the sample stage, obtains a coordinate position of a second sample stage coordinate of the sample stage positioned by the second positioning device based on the image of the sample stage positioned by the second positioning device when the second positioning device is located at the second non-observation position, obtains a coordinate position of the second region extraction window in the second sample stage coordinate based on the obtained image of the second region extraction window and the obtained coordinate position of the second sample stage coordinate of the sample stage when the second positioning device is located at the second non-observation position, obtains a difference between the coordinate position of the first sample stage coordinate and the coordinate position of the second sample stage coordinate, corrects the coordinate position of the second sample stage coordinate based on the difference, and obtains a corrected coordinate position of the second region extraction window corresponding to the first region extraction window, wherein the second positioning apparatus moves the second positioning device from the second non-observation position to the second observation position where the second region extraction window is located at a position corresponding to the coordinate position of the first region extraction window based on the corrected coordinate position of the second region extraction window, wherein one of the first microscope and the second microscope is an optical microscope, and another microscope is an electron microscope, wherein the sample stage has a sample placement region on which a biological tissue is placed as the sample and two reference points arranged in a region other than the sample placement region, wherein the controller further obtains respective coordinate positions of the two reference points of the sample stage with respect to an apparatus coordinate origin of the first positioning apparatus as the coordinate position of the first sample stage coordinate of the sample stage when the first positioning device is located at the first non-observation position, obtains respective coordinate positions of the two reference points of the sample stage with respect to an apparatus coordinate origin of the second positioning apparatus as the coordinate position of the second sample stage coordinate of the sample stage when the second positioning device is located at the second non-observation position, and obtains, as a rotation angle of the second sample stage coordinate with respect to the first sample stage coordinate, an angle formed by a line connecting the respective coordinate positions of the two reference points and a line connecting the respective coordinate positions of the two reference points, and wherein based on a difference between the respective coordinate positions of the two reference points and the respective coordinate positions of the two reference points as the difference between the coordinate position of the first sample stage coordinate and the coordinate position of the second sample stage coordinate, and the rotation angle, the coordinate position of the second sample stage coordinate is corrected, and a corrected coordinate position of the second region extraction window corresponding to the first region extraction window is obtained.

2. The correlation microscope according to claim 1, wherein the sample stage comprises:
  a sample stage frame body having a recess in the sample placement region; and
  a sample placement stage detachably inserted into the recess of the sample stage frame body and having the sample placement region on its upper surface.

3. A correlation microscope comprising:
  a first microscope;
  a second microscope having an optical axis non coaxial with the first microscope;
  a conveying apparatus that conveys a sample stage holding a sample from the first microscope to the second microscope in a state where the sample stage is positioned and held by a sample stage positioning and holding device;
  a first positioning apparatus that is disposed in the first microscope, that has a first positioning device movable between at least a first observation position and a first non-observation position and positioning and holding the sample stage, and that delivers the sample stage between the first positioning device and the sample stage positioning and holding device of the conveying apparatus when the first positioning device is located at the first non-observation position;
  a controller that
    obtains an image of the sample stage positioned by the first positioning device when the first positioning device is located at each of the first observation position and the first non-observation position, and that obtains an image of a first region extraction window including an observation target tissue of the sample on the sample stage,
    obtains a coordinate position of a first sample stage coordinate of the sample stage positioned by the first positioning device based on the image of the sample stage positioned by the first positioning device when the first positioning device is located at the first non-observation position,
    obtains a coordinate position of the first region extraction window in the first sample stage coordinate based on the image of the first region extraction window when the first positioning device is located at the first non-observation position and the coordinate position of the first sample stage coordinate of the sample stage; and
  a second positioning apparatus that is disposed in the second microscope, that has a second positioning device movable between at least a second observation position and a second non-observation position and positioning and holding the sample stage, and that delivers the sample stage between the second positioning device and the sample stage positioning and holding device of the conveying apparatus when the second positioning device is located at the second non-observation position,
  wherein the controller further obtains an image of the sample stage positioned by the second positioning device when the second positioning device is located at each of the second observation position and the second non-observation position and that obtains an image of a second region extraction window corresponding to the first region extraction window of the sample stage, obtains a coordinate position of a second sample stage coordinate of the sample stage positioned by the second positioning device based on the image of the sample stage positioned by the second positioning device when the second positioning device is located at the second non-observation position, obtains a coordinate position of the second region extraction window in the second sample stage coordinate based on the obtained image of the second region extraction window and the obtained coordinate position of the second sample stage coordinate of the sample stage when the second positioning device is located at the second non-observation position, obtains a difference between the coordinate position of the first sample stage coordinate and the coordinate position of the second sample stage coordinate, corrects the coordinate position of the second sample stage coordinate based on the difference, and obtains a corrected coordinate position of the second region extraction window corresponding to the first region extraction window, wherein the second positioning apparatus moves the second positioning device from the second non-observation position to the second observation position where the second region extraction window is located at a position corresponding to the coordinate position of the first region extraction window based on the corrected coordinate position of the second region extraction window, wherein one of the first microscope and the second microscope is an optical microscope, and another microscope is an electron microscope, wherein the controller further performs pattern matching between the image of the first region extraction window when the first positioning device is located at the first observation position and the image of the second region extraction window when the second positioning device is located at the second observation position, based on a plurality of feature portions of the observation target tissue extracted from the image of the first region extraction window when the first positioning device is located at the first observation position, and superimposes the image of the first region extraction window and the image of the second region extraction window on each other, based on a result of the pattern matching, the coordinate position of the first sample stage coordinate, and the corrected coordinate position of the second region extraction window, wherein the sample stage has a sample placement region on which a biological tissue is placed as the sample and two reference points arranged in a region other than the sample placement region, wherein the controller further obtains respective coordinate positions of the two reference points of the sample stage with respect to an apparatus coordinate origin of the first positioning apparatus as the coordinate position of the first sample stage coordinate of the sample stage when the first positioning device is located at the first non-observation position, obtains respective coordinate positions of the two reference points of the sample stage with respect to an apparatus coordinate origin of the second positioning apparatus as the coordinate position of the second sample stage coordinate of the sample stage when the second positioning device is located at the second non-observation position, and obtains, as a rotation angle of the second sample stage coordinate with respect to the first sample stage coordinate, an angle formed by a line connecting the respective coordinate positions of the two reference points and a line connecting the respective coordinate positions of the two reference points, and wherein based on a difference between the respective coordinate positions of the two reference points and the respective coordinate positions of the two reference points as the difference between the coordinate position of the first sample stage coordinate and the coordinate position of the second sample stage coordinate, and the rotation angle, the coordinate position of the second sample stage coordinate is corrected, and a corrected coordinate position of the second region extraction window corresponding to the first region extraction window is obtained.

4. A correlation microscope comprising:

a first microscope;

a second microscope having an optical axis non coaxial with the first microscope;

a conveying apparatus that conveys a sample stage holding a sample from the first microscope to the second microscope in a state where the sample stage is positioned and held by a sample stage positioning and holding device;

a first positioning apparatus that is disposed in the first microscope, that has a first positioning device movable between at least a first observation position and a first non-observation position and positioning and holding the sample stage, and that delivers the sample stage between the first positioning device and the sample stage positioning and holding device of the conveying apparatus when the first positioning device is located at the first non-observation position;

a controller that obtains an image of the sample stage positioned by the first positioning device when the first positioning device is located at each of the first observation position and the first non-observation position, and that obtains an image of a first region extraction window including an observation target tissue of the sample on the sample stage, obtains a coordinate position of a first sample stage coordinate of the sample stage positioned by the first positioning device based on the image of the sample stage positioned by the first positioning device when the first positioning device is located at the first non-observation position, obtains a coordinate position of the first region extraction window in the first sample stage coordinate based on the image of the first region extraction window when the first positioning device is located at the first non-observation position and the coordinate position of the first sample stage coordinate of the sample stage; and a second positioning apparatus that is disposed in the second microscope, that has a second positioning device movable between at least a second observation position and a second non-observation position and positioning and holding the sample stage, and that delivers the sample stage between the second positioning device and the sample stage positioning and holding device of the conveying apparatus when the second positioning device is located at the second non-observation position, wherein the controller further obtains an image of the sample stage positioned by the second positioning device when the second positioning device is located at each of the second observation position and the second non-observation position and that obtains an image of a second region extraction window corresponding to the first region extraction window of the sample stage, obtains a coordinate position of a second sample stage coordinate of the sample stage positioned by the second positioning device based on the image of the sample stage positioned by the second positioning device when the second positioning device is located at the second non-observation position, obtains a coordinate position of the second region extraction window in the second sample stage coordinate based on the obtained image of the second region extraction window and the obtained coordinate position of the second sample stage coordinate of the sample stage when the second positioning device is located at the second non-observation position, obtains a difference between the coordinate position of the first sample stage coordinate and the coordinate position of the second sample stage coordinate, corrects the coordinate position of the second sample stage coordinate based on the difference, and obtains a corrected coordinate position of the second region extraction window corresponding to the first region extraction window, wherein the second positioning apparatus moves the second positioning device from the second non-observation position to the second observation position where the second region extraction window is located at a position corresponding to the coordinate position of the first region extraction window based on the corrected coordinate position of the second region extraction window, wherein one of the first microscope and the second microscope is an optical microscope, and another microscope is an electron microscope, wherein the first region extraction window is set to include the observation target tissue of the sample, wherein the sample stage has a sample placement region on which a biological tissue is placed as the sample and two reference points arranged in a region other than the sample placement region, wherein the controller further obtains respective coordinate positions of the two reference points of the sample stage with respect to an apparatus coordinate origin of the first positioning apparatus as the coordinate position of the first sample stage coordinate of the sample stage when the first positioning device is located at the first non-observation position, obtains respective coordinate positions of the two reference points of the sample stage with respect to an apparatus coordinate origin of the second positioning apparatus as the coordinate position of the second sample stage coordinate of the sample stage when the second positioning device is located at the second non-observation position and obtains, as a rotation angle of the second sample stage coordinate with respect to the first sample stage coordinate, an angle formed by a line connecting the respective coordinate positions of the two reference points and a line connecting the respective coordinate positions of the two reference points, and wherein based on a difference between the respective coordinate positions of the two reference points and the respective coordinate positions of the two reference points as the difference between the coordinate position of the first sample stage coordinate and the coordinate position of the second sample stage coordinate, and the rotation angle, the coordinate position of the second sample stage coordinate is corrected, and a corrected coordinate position of the second region extraction window corresponding to the first region extraction window is obtained.

5. A correlation microscope comprising:

a first microscope;

a second microscope having an optical axis non coaxial with the first microscope;

a conveying apparatus that conveys a sample stage holding a sample from the first microscope to the second microscope in a state where the sample stage is positioned and held by a sample stage positioning and holding device;

a first positioning apparatus that is disposed in the first microscope, that has a first positioning device movable between at least a first observation position and a first non-observation position and positioning and holding the sample stage, and that delivers the sample stage between the first positioning device and the sample stage positioning and holding device of the conveying apparatus when the first positioning device is located at the first non-observation position;

a controller that obtains an image of the sample stage positioned by the first positioning device when the first positioning device is located at each of the first observation position and the first non-observation position, and that obtains an image of a first region extraction window including an observation target tissue of the sample on the sample stage, obtains a coordinate position of a first sample stage coordinate of the sample stage positioned by the first positioning device based on the image of the sample stage positioned by the first positioning device when the first positioning device is located at the first non-observation position, obtains a coordinate position of the first region extraction window in the first sample stage coordinate based on the image of the first region extraction window when the first positioning device is located at the first non-observation position and the coordinate position of the first sample stage coordinate of the sample stage; and a second positioning apparatus that is disposed in the second microscope, that has a second positioning device movable between at least a second observation position and a second non-observation position and positioning and holding the sample stage, and that delivers the sample stage between the second positioning device and the sample stage positioning and holding device of the conveying apparatus when the second positioning device is located at the second non-observation position, wherein the controller further obtains an image of the sample stage positioned by the second positioning device when the second positioning device is located at each of the second observation position and the second non-observation position and that obtains an image of a second region extraction window corresponding to the first region extraction window of the sample stage, obtains a coordinate position of a second sample stage coordinate of the sample stage positioned by the second positioning device based on the image of the sample stage positioned by the second positioning device when the second positioning device is located at the second non-observation position, obtains a coordinate position of the second region extraction window in the second sample stage coordinate based on the obtained image of the second region extraction window and the obtained coordinate position of the second sample stage coordinate of the sample stage when the second positioning device is located at the second non-observation position, obtains a difference between the coordinate position of the first sample stage coordinate and the coordinate position of the second sample stage coordinate, corrects the coordinate position of the second sample stage coordinate based on the difference, and obtains a corrected coordinate position of the second region extraction window corresponding to the first region extraction window, wherein the second positioning apparatus moves the second positioning device from the second non-observation position to the second observation position where the second region extraction window is located at a position corresponding to the coordinate position of the first region extraction window based on the corrected coordinate position of the second region extraction window, wherein one of the first microscope and the second microscope is an optical microscope, and another microscope is an electron microscope, wherein the controller further performs pattern matching between the image of the first region extraction window when the first positioning device is located at the first observation position and the image of the second region extraction window when the second positioning device is located at the second observation position, based on a plurality of feature portions of the observation target tissue extracted from the image of the first region extraction window when the first positioning device is located at the first observation position, and superimposes the image of the first region extraction window and the image of the second region extraction window on each other, based on a result of the pattern matching, the coordinate position of the first sample stage coordinate, and the corrected coordinate position of the second region extraction window, wherein the first region extraction window is set to include the observation target tissue of the sample, wherein the sample stage has a sample placement region on which a biological tissue is placed as the sample and two reference points arranged in a region other than the sample placement region, wherein the controller further obtains respective coordinate positions of the two reference points of the sample stage with respect to an apparatus coordinate origin of the first positioning apparatus as the coordinate position of the first sample stage coordinate of the sample stage when the first positioning device is located at the first non-observation position, obtains respective coordinate positions of the two reference points of the sample stage with respect to an apparatus coordinate origin of the second positioning apparatus as the coordinate position of the second sample stage coordinate of the sample stage when the second positioning device is located at the second non-observation position, and obtains, as a rotation angle of the second sample stage coordinate with respect to the first sample stage coordinate, an angle formed by a line connecting the respective coordinate positions of the two reference points and a line connecting the respective coordinate positions of the two reference points, and wherein based on a difference between the respective coordinate positions of the two reference points and the respective coordinate positions of the two reference points as the difference between the coordinate position of the first sample stage coordinate and the coordinate position of the second sample stage coordinate, and the rotation angle, the coordinate position of the second sample stage coordinate is corrected, and a corrected coordinate position of the second region extraction window corresponding to the first region extraction window is obtained.

6. The correlation microscope according to claim 1, wherein each of the first positioning apparatus and the second positioning apparatus is an XYZ stage, in each XYZ stage, a linear scale whose position is detectable with nm precision is disposed at each axis of an X axis stage, a Y axis stage, and a Z axis stage, and when the second positioning device is located at the second observation position, the second positioning apparatus performs position control such that the second region extraction window is located at the corrected coordinate position of the second region extraction window.

7. The correlation microscope according to claim 3, wherein each of the first positioning apparatus and the second positioning apparatus is an XYZ stage, in each XYZ stage, a linear scale whose position is detectable with nm precision is disposed at each axis of an X axis stage, a Y axis stage, and a Z axis stage, and when the second positioning device is located at the second observation position, the second positioning apparatus performs position control such that the second region extraction window is located at the corrected coordinate position of the second region extraction window.

8. The correlation microscope according to claim 3, wherein the sample stage comprises:

a sample stage frame body having a recess in the sample placement region; and a sample placement stage detachably inserted into the recess of the sample stage frame body and having the sample placement region on its upper surface.

9. The correlation microscope according to claim 4, wherein
the sample stage comprises:
a sample stage frame body having a recess in the sample placement region; and
a sample placement stage detachably inserted into the recess of the sample stage frame body and having the sample placement region on its upper surface.

10. The correlation microscope according to claim 5, wherein
the sample stage comprises:
a sample stage frame body having a recess in the sample placement region; and
a sample placement stage detachably inserted into the recess of the sample stage frame body and having the sample placement region on its upper surface.

* * * * *